US012787586B2

(12) United States Patent
Park et al.

(10) Patent No.: US 12,787,586 B2
(45) Date of Patent: Nov. 3, 2026

(54) DISPLAY APPARATUS

(71) Applicant: Samsung Display Co., Ltd., Yongin-si (KR)

(72) Inventors: Junhyeong Park, Yongin-si (KR); Gyehwan Lim, Yongin-si (KR); Myunghee Han, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 378 days.

(21) Appl. No.: 18/393,390

(22) Filed: Dec. 21, 2023

(65) Prior Publication Data

US 2024/0224686 A1 Jul. 4, 2024

(30) Foreign Application Priority Data

Dec. 30, 2022 (KR) ........................ 10-2022-0191042

(51) Int. Cl.
*H10K 59/35* (2023.01)

(52) U.S. Cl.
CPC ......... *H10K 59/353* (2023.02); *H10K 59/352* (2023.02)

(58) Field of Classification Search
CPC .. H10K 59/352; H10K 59/353; H10K 59/131; H10K 77/111
See application file for complete search history.

(56) References Cited

U.S. PATENT DOCUMENTS

| | | | | |
|---|---|---|---|---|
| 9,536,860 | B2 | 1/2017 | Yoon et al. | |
| 9,799,708 | B2 | 10/2017 | Hong et al. | |
| 10,038,163 | B2 | 7/2018 | Kim et al. | |
| 10,461,142 | B2 | 10/2019 | Hong et al. | |
| 10,504,936 | B2 | 12/2019 | Park et al. | |
| 10,608,071 | B2 | 3/2020 | Hong et al. | |
| 10,902,755 | B2 * | 1/2021 | Dai | H10K 59/122 |
| 11,342,407 | B2 | 5/2022 | Sun et al. | |
| 11,349,089 | B2 | 5/2022 | Park et al. | |
| 2018/0114825 | A1 * | 4/2018 | Hong | H10K 59/38 |
| 2018/0331315 | A1 * | 11/2018 | Maeda | H10K 59/131 |
| 2020/0410906 | A1 | 12/2020 | Chen | |

(Continued)

FOREIGN PATENT DOCUMENTS

| | | |
|---|---|---|
| KR | 10-2017-0113934 A | 10/2017 |
| KR | 10-2018-0045968 A | 5/2018 |

(Continued)

*Primary Examiner* — Xuemei Zheng

(74) *Attorney, Agent, or Firm* — Womble Bond Dickinson (US) LLP

(57) ABSTRACT

A display apparatus includes a first pixel set including first, second, third, and fourth pixels, wherein, in each of pixel areas, a length in a first direction is the same as a length in a second direction crossing the first direction, wherein the first pixel and the second pixel are apart from each other in the first direction, wherein the first pixel includes a (1-1)-th sub-pixel of the first color light, a (1-2)-th sub-pixel of the second color light, and a (1-3)-th sub-pixel of the third color light, wherein the second pixel includes a (2-1)-th sub-pixel of the second color light, a (2-2)-th sub-pixel of the first color light, and a (2-3)-th sub-pixel of the third color light, and wherein the area of the (1-1)-th sub-pixel is the same as the area of the (1-2)-th sub-pixel and is different from an area of the (1-3)-th sub-pixel.

21 Claims, 16 Drawing Sheets

(56) References Cited

U.S. PATENT DOCUMENTS

| | | | | |
|---|---|---|---|---|
| 2021/0151698 | A1* | 5/2021 | Kim | H10K 59/879 |
| 2021/0408161 | A1* | 12/2021 | Sui | H10K 59/352 |
| 2024/0215359 | A1* | 6/2024 | Kimura | H10K 59/131 |

FOREIGN PATENT DOCUMENTS

| | | | |
|---|---|---|---|
| KR | 10-2019-0052201 | A | 5/2019 |
| KR | 10-2019-0112880 | A | 10/2019 |
| KR | 10-2020-0145952 | A | 12/2020 |
| KR | 10-2022-0026561 | A | 3/2022 |

* cited by examiner

DISPLAY APPARATUS

CROSS-REFERENCE TO RELATED APPLICATION

This application claims priority to, and the benefit of, Korean Patent Application No. 10-2022-0191042, filed on Dec. 30, 2022, in the Korean Intellectual Property Office, the disclosure of which is incorporated by reference herein in its entirety.

BACKGROUND

1. Field

One or more embodiments relate to a display apparatus in which space utilization is relatively high, and in which the aperture ratios of sub-pixels capable of emitting light of the same color are substantially the same.

2. Description of the Related Art

Mobile electronic apparatuses such as mobile phones, tablet personal computers (PCs), etc. are widely used, and these mobile electronic apparatuses include display apparatuses so as to provide visual information, such as images or videos, to a user. Research and development for flexible display apparatuses that can be bent, folded, or rolled in a roll shape has been conducted. Furthermore, research and development for stretchable display apparatuses that can be changed in various shapes, has been briskly carried out.

SUMMARY

However, in display apparatuses according to the related art, the aperture ratio of a specific sub-pixel may be greatly lowered, or an imbalance between the aperture ratios of sub-pixels capable of emitting light of the same color occurs.

One or more embodiments provide a display apparatus in which space utilization is relatively high, and in which the aperture ratios of sub-pixels capable of emitting light of the same color are substantially the same. However, these objectives are illustrative, and the scope of the present disclosure is not limited thereby.

Additional aspects will be set forth in part in the description that follows and, in part, will be apparent from the description, or may be learned by practice of the presented embodiments of the disclosure.

According to an aspect of the present disclosure, a display apparatus includes a substrate including pixel areas spaced apart from each other, connection areas connecting the pixel areas, and a separation area between the pixel areas, and a first pixel set arranged in the pixel areas and including a first pixel, a second pixel, a third pixel, and a fourth pixel, wherein a length of one of the pixel areas in a first direction is same as a length of the one of the pixel areas in a second direction crossing the first direction, wherein the first pixel and the second pixel are spaced apart from each other in the first direction, wherein the first pixel includes a (1-1)-th sub-pixel configured to emit first color light, a (1-2)-th sub-pixel spaced apart from the (1-1)-th sub-pixel in the first direction and configured to emit second color light, and a (1-3)-th sub-pixel spaced apart from the (1-1)-th sub-pixel in the second direction and configured to emit third color light, wherein the second pixel includes a (2-1)-th sub-pixel configured to emit the second color light, a (2-2)-th sub-pixel spaced apart from the (2-1)-th sub-pixel in the second direction and configured to emit the first color light, and a (2-3)-th sub-pixel spaced apart from the (2-1)-th sub-pixel in the first direction and configured to emit the third color light, wherein an area of the (1-1)-th sub-pixel is same as an area of the (1-2)-th sub-pixel, and is different from an area of the (1-3)-th sub-pixel, and wherein an area of the (2-1)-th sub-pixel is same as an area of the (2-2)-th sub-pixel, and is different from an area of the (2-3)-th sub-pixel.

A sum of a length in the first direction of the (1-1)-th sub-pixel and a length in the first direction of the (1-2)-th sub-pixel may be substantially equal to a sum of a length in the second direction of the (1-1)-th sub-pixel and a length in the second direction of the (1-3)-th sub-pixel.

A distance between the (1-1)-th sub-pixel and the (1-2)-th sub-pixel may be substantially equal to a distance between the (1-1)-th sub-pixel and the (1-3)-th sub-pixel.

A sum of a length in the second direction of the (2-1)-th sub-pixel and a length in the second direction of the (2-2)-th sub-pixel may be substantially equal to a sum of a length in the first direction of the (2-1)-th sub-pixel and a length in the first direction of the (2-3)-th sub-pixel.

A distance between the (2-1)-th sub-pixel and the (2-2)-th sub-pixel may be substantially equal to a distance between the (2-1)-th sub-pixel and the (2-3)-th sub-pixel.

An area of the (1-3)-th sub-pixel may be greater than an area of the (1-1)-th sub-pixel, wherein an area of the (2-3)-th sub-pixel is greater than an area of the (2-1)-th sub-pixel.

The third pixel may be spaced apart from the first pixel in the second direction, wherein the fourth pixel is spaced apart from the second pixel in the second direction, wherein the third pixel includes a (3-1)-th sub-pixel configured to emit the second color light, a (3-2)-th sub-pixel spaced apart from the (3-1)-th sub-pixel in the second direction and configured to emit the first color light, and a (3-3)-th sub-pixel spaced apart from the (3-1)-th sub-pixel in the first direction and configured to emit the third color light, wherein the fourth pixel includes a (4-1)-th sub-pixel configured to emit the first color light, a (4-2)-th sub-pixel spaced apart from the (4-1)-th sub-pixel in the first direction and configured to emit the second color light, and a (4-3)-th sub-pixel spaced apart from the (4-1)-th sub-pixel in the second direction and configured to emit the third color light, wherein an area of the (3-1)-th sub-pixel is substantially equal to an area of the (3-2)-th sub-pixel, and is different from an area of the (3-3)-th sub-pixel, and wherein an area of the (4-1)-th sub-pixel is substantially equal to an area of the (4-2)-th sub-pixel, and is different from an area of the (4-3)-th sub-pixel.

A sum of a length in the second direction of the (3-1)-th sub-pixel and a length in the second direction of the (3-2)-th sub-pixel may be substantially equal to a sum of a length in the first direction of the (3-1)-th sub-pixel and a length in the first direction of the (3-3)-th sub-pixel.

A distance between the (3-1)-th sub-pixel and the (3-2)-th sub-pixel may be substantially equal to a distance between the (3-1)-th sub-pixel and the (3-3)-th sub-pixel.

A sum of a length in the first direction of the (4-1)-th sub-pixel and a length in the first direction of the (4-2)-th sub-pixel may be substantially equal to a sum of a length in the second direction of the (4-1)-th sub-pixel and a length in the second direction of the (4-3)-th sub-pixel.

A distance between the (4-1)-th sub-pixel and the (4-2)-th sub-pixel may be substantially equal to a distance between the (4-1)-th sub-pixel and the (4-3)-th sub-pixel.

Virtual lines connecting one side of the (1-2)-th sub-pixel and one side of the (1-1)-th sub-pixel, and connecting another side of the (1-1)-th sub-pixel and one side of the (1-3)-th sub-pixel, may have an L-shape rotated at 90 degrees counterclockwise, wherein virtual lines connecting one side of the (2-2)-th sub-pixel and one side of the (2-1)-th sub-pixel, and connecting another side of the (2-1)-th sub-pixel and one side of the (2-3)-th sub-pixel, have an L-shape.

The display apparatus may further include a second pixel set arranged in the pixel areas, and including a fifth pixel, a sixth pixel, a seventh pixel, and an eighth pixel, wherein the fifth pixel and the sixth pixel are spaced apart from each other in the first direction, wherein the seventh pixel is spaced apart from the fifth pixel in the second direction, and wherein the eighth pixel is spaced apart from the sixth pixel in the second direction.

The fifth pixel may include a (5-1)-th sub-pixel configured to emit the second color light, a (5-2)-th sub-pixel spaced apart from the (5-1)-th sub-pixel in the first direction and configured to emit the first color light, and a (5-3)-th sub-pixel spaced apart from the (5-1)-th sub-pixel in the second direction and configured to emit the third color light, wherein the sixth pixel includes a (6-1)-th sub-pixel configured to emit the first color light, a (6-2)-th sub-pixel spaced apart from the (6-1)-th sub-pixel in the second direction and configured to emit the second color light, and a (6-3)-th sub-pixel spaced apart from the (6-1)-th sub-pixel in the first direction and configured to emit the third color light, wherein the seventh pixel includes a (7-1)-th sub-pixel configured to emit the first color light, a (7-2)-th sub-pixel spaced apart from the (7-1)-th sub-pixel in the second direction and configured to emit the second color light, and a (7-3)-th sub-pixel spaced apart from the (7-1)-th sub-pixel in the first direction and configured to emit the third color light, and wherein the eighth pixel includes a (8-1)-th sub-pixel configured to emit the second color light, a (8-2)-th sub-pixel spaced apart from the (8-1)-th sub-pixel in the first direction and configured to emit the first color light, and a (8-3)-th sub-pixel spaced apart from the (8-1)-th sub-pixel in the second direction and configured to emit the third color light.

An area of the (5-1)-th sub-pixel may be substantially equal to an area of the (5-2)-th sub-pixel, and is different from an area of the (5-3)-th sub-pixel, wherein an area of the (6-1)-th sub-pixel is substantially equal to an area of the (6-2)-th sub-pixel, and is different from an area of the (6-3)-th sub-pixel, wherein an area of the (7-1)-th sub-pixel is substantially equal to an area of the (7-2)-th sub-pixel, and is different from an area of the (7-3)-th sub-pixel, and wherein an area of the (8-1)-th sub-pixel is substantially equal to an area of the (8-2)-th sub-pixel, and is different from an area of the (8-3)-th sub-pixel.

A sum of a length in the first direction of the (5-1)-th sub-pixel and a length in the first direction of the (5-2)-th sub-pixel may be substantially equal to a sum of a length in the second direction of the (5-1)-th sub-pixel and a length in the second direction of the (5-3)-th sub-pixel, wherein a sum of a length in the second direction of the (6-1)-th sub-pixel and a length in the second direction of the (6-2)-th sub-pixel is substantially equal to a sum of a length in the first direction of the (6-1)-th sub-pixel and a length in the first direction of the (6-3)-th sub-pixel, wherein a sum of a length in the second direction of the (7-1)-th sub-pixel and a length in the second direction of the (7-2)-th sub-pixel is substantially equal to a sum of a length in the first direction of the (7-1)-th sub-pixel and a length in the first direction of the (7-3)-th sub-pixel, and wherein a sum of a length in the first direction of the (8-1)-th sub-pixel and a length in the first direction of the (8-2)-th sub-pixel is substantially equal to a sum of a length in the second direction of the (8-1)-th sub-pixel and a length in the second direction of the (8-3)-th sub-pixel.

A distance between the (5-1)-th sub-pixel and the (5-2)-th sub-pixel may be substantially equal to a distance between the (5-1)-th sub-pixel and the (5-3)-th sub-pixel, wherein a distance between the (6-1)-th sub-pixel and the (6-2)-th sub-pixel is substantially equal to a distance between the (6-1)-th sub-pixel and the (6-3)-th sub-pixel, wherein a distance between the (7-1)-th sub-pixel and the (7-2)-th sub-pixel is substantially equal to a distance between the (7-1)-th sub-pixel and the (7-3)-th sub-pixel, and wherein a distance between the (8-1)-th sub-pixel and the (8-2)-th sub-pixel is substantially equal to a distance between the (8-1)-th sub-pixel and the (8-3)-th sub-pixel.

The display apparatus may further include multiple first pixel sets and multiple second pixel sets alternately arranged in a first direction.

The display apparatus may further include multiple first pixel sets and multiple second pixel sets alternately arranged in a second direction.

A distance between the first pixel set and the second pixel set may be substantially equal to a distance between the first pixel and the second pixel.

The first color light may be green light, the second color light may be red light, and the third color light may be blue light.

Aspects other than those described above will become apparent from the following drawings, claims, and detailed description of the invention.

BRIEF DESCRIPTION OF THE DRAWINGS

The above and other aspects of embodiments of the disclosure will be more apparent from the following description taken in conjunction with the accompanying drawings, in which.

DETAILED DESCRIPTION

Figure 1A:
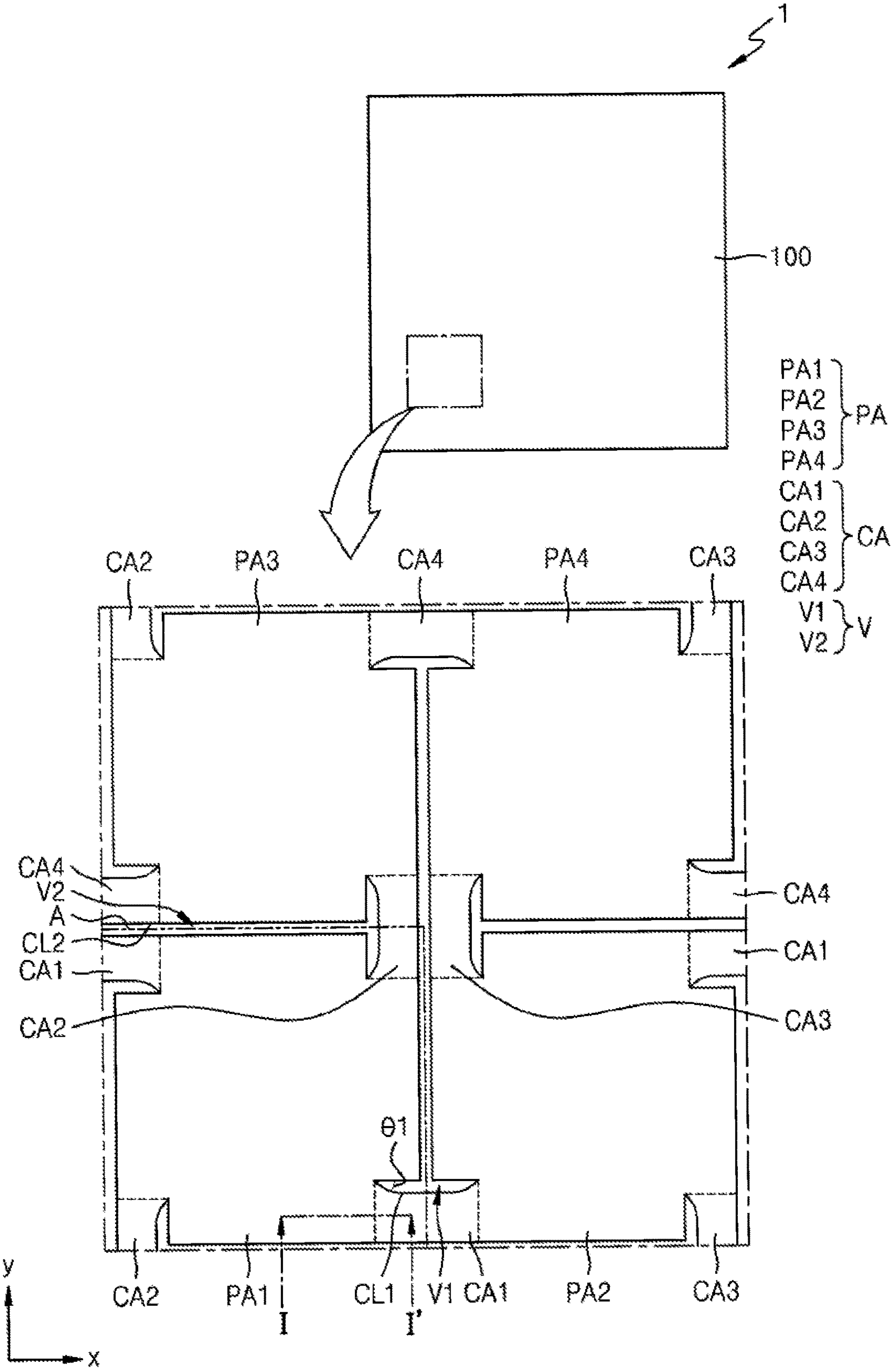
FIG. 1A is a plan view schematically illustrating a display apparatus according to one or more embodiments.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in different forms, and should not be construed as being limited to only the illustrated embodiments herein. Further, each of the features of the various embodiments of the present disclosure may be combined or combined with each other, in part or in whole, and technically various interlocking and driving are possible. Each embodiment may be implemented independently of each other or may be implemented together in an association. The described embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form to avoid unnecessarily obscuring various embodiments.

Spatially relative terms, such as "beneath," "below," "lower," "lower side," "under," "above," "upper," "upper side," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below," "beneath," "or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

When there is no special mention in the present specification, "a distance between A and B" means the shortest distance between one side of A closest to B and one side of B closest to A on a plane, and this plane means a plane parallel to the substrate 100.

As used herein, "on a plane," it means when a target portion is viewed from above. That is, in the present specification, "on a plane," it may mean "when viewed from a direction perpendicular to a substrate 100." Further, the phrase "in a plan view" means when an object portion is viewed from above, and the phrase "in a schematic cross-sectional view" means when a schematic cross-section taken by vertically cutting an object portion is viewed from the side.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include meaning, such as "apart from" or "set aside from" or "offset from" and any other suitable equivalents as would be appreciated and understood by those of ordinary skill in the art. The terms “face” and “facing” may mean that a first object may directly or indirectly oppose a second object. In a case in which a third object intervenes between a first and second object, the first and second objects may be understood as being indirectly opposed to one another, although still facing each other.

It will be understood that when an element, layer, region, or component is referred to as being “formed on,” “on,” “connected to,” or “(operatively or communicatively) coupled to” another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being “electrically connected” or “electrically coupled” to another layer, region, or component, it can be directly electrically connected or coupled to the other layer, region, and/or component or intervening layers, regions, or components may be present. However, “directly connected/directly coupled,” or “directly on,” refers to one component directly connecting or coupling another component, or being on another component, without an intermediate component. In addition, in the present specification, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed “under” another portion, this includes not only a case where the portion is “directly beneath” another portion but also a case where there is further another portion between the portion and another portion. Meanwhile, other expressions describing relationships between components such as “between,” “immediately between” or “adjacent to” and “directly adjacent to” may be construed similarly. In addition, it will also be understood that when an element or layer is referred to as being “between” two elements or layers, it can be the only element or layer between the two elements or layers, or one or more intervening elements or layers may also be present.

For the purposes of this disclosure, expressions such as “at least one of,” or “any one of,” when preceding a list of elements, modify the entire list of elements and do not modify the individual elements of the list. For example, “at least one of X, Y, and Z,” “at least one of X, Y, or Z,” “at least one selected from the group consisting of X, Y, and Z,” and “at least one selected from the group consisting of X, Y, or Z” may be construed as X only, Y only, Z only, any combination of two or more of X, Y, and Z, such as, for instance, XYZ, XYY, YZ, and ZZ, or any variation thereof. Similarly, the expression such as “at least one of A and B” and “at least one of A or B” may include A, B, or A and B. As used herein, “or” generally means “and/or,” and the term “and/or” includes any and all combinations of one or more of the associated listed items. For example, the expression such as “A and/or B” may include A, B, or A and B. Similarly, expressions such as “at least one of,” “a plurality of,” “one of,” and other prepositional phrases, when preceding a list of elements, modify the entire list of elements and do not modify the individual elements of the list.

It will be understood that, although the terms “first,” “second,” “third,” etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a “first” element may not require or imply the presence of a second element or other elements. The terms “first,” “second,” etc. may also be used herein to differentiate different categories or sets of elements. For conciseness, the terms “first,” “second,” etc. may represent “first-category (or first-set),” “second-category (or second-set),” etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms “a” and “an” are intended to include the plural forms as well, while the plural forms are also intended to include the singular forms, unless the context clearly indicates otherwise. It will be further understood that the terms “comprises,” “comprising,” “have,” “having,” “includes,” and “including,” when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term “substantially,” “about,” “approximately,” and similar terms are used as terms of approximation and not as terms of degree, and are intended to account for the inherent deviations in measured or calculated values that would be recognized by those of ordinary skill in the art. “About” or “approximately,” as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, “about” may mean within one or more standard deviations, or within ±30%, 20%, 10%, 5% of the stated value. Further, the use of “may” when describing embodiments of the present disclosure refers to “one or more embodiments of the present disclosure.”

Also, any numerical range disclosed and/or recited herein is intended to include all sub-ranges of the same numerical precision subsumed within the recited range. For example, a range of “1.0 to 10.0” is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In the present specification, "green light" refers to light belonging to a wavelength band of about 495 nm to about 580 nm, and "red light" refers to light belonging to a wavelength band of about 580 nm to about 780 nm, and "blue light" refers to light belonging to a wavelength band of about 400 nm to about 495 nm.

FIG. 1A is a plan view schematically illustrating a display apparatus 1 according to one or more embodiments. The display apparatus 1 may be an apparatus for displaying an image and may be a portable mobile device, such as a game machine, a multimedia device, or a micro personal computer (PC). The display apparatus 1 to be described below may include a liquid crystal display (LCD), an electrophoretic display (ED), an organic light-emitting display (OLED), an inorganic electroluminescent (EL) display, a field emission display, a surface-conduction electron-emitter display, a quantum dot display, a plasma display, a cathode ray display, or the like. Hereinafter, an organic light-emitting display apparatus will be described as an example of the display apparatus 1 according to one or more embodiments, but various types of display apparatuses described above may be used in embodiments.

As shown in FIG. 1A, the display apparatus 1 may include a pixel area PA and a connection area CA. The pixel area PA may include a first pixel area PA1, a second pixel area PA2, a third pixel area PA3, and a fourth pixel area PA4. The connection area CA may include a first connection area CA1, a second connection area CA2, a third connection area CA3, and a fourth connection area CA4.

The pixel area PA may be an area in which pixels are arranged. For example, a plurality of pixels may be arranged in the first pixel area PA1, the second pixel area PA2, the third pixel area PA3, and the fourth pixel area PA4, respectively. Each of the pixels arranged in the pixel area PA may include a plurality of sub-pixels capable of emitting green light, red light, or blue light. The display apparatus 1 may provide an image using light emitted from these sub-pixels.

The connection area CA may connect between the first pixel area PA1, the second pixel area PA2, the third pixel area PA3, and the fourth pixel area PA4. For example, the first connection area CA1 may connect the first pixel area PA1 to the second pixel area PA2, the second connection area CA2 may connect the first pixel area PA1 to the third pixel area PA3, the third connection area CA3 may connect the second pixel area PA2 to the fourth pixel area PA4, and the fourth connection area CA4 may connect the third pixel area PA3 to the fourth pixel area PA4. Meanwhile, a separation area V may be defined in the display apparatus 1. The separation area V may pass through the display apparatus 1. The separation area V may be an area in which components of the display apparatus 1 are not arranged. The display apparatus 1 may be elongated and/or contracted by the separation area V.

As shown in FIG. 1A, the display apparatus 1 may include a substrate 100. Because the display apparatus 1 includes the substrate 100, the substrate 100 may have the pixel area PA and the connection area CA described above and the separation area V may be defined in the substrate 100. Hereinafter, for convenience, it will be described that the substrate 100 has the pixel area PA and the connection area CA and the separation area V is defined in the substrate 100.

The substrate 100 may include various materials, such as glass, metal or an organic material. In one or more embodiments, the substrate 100 may include a flexible material. For example, the substrate 100 may include micro flexible glass (e.g., having the thickness of several tens to several hundreds of um) or a polymer resin. When the substrate 100 includes a polymer resin, the substrate 100 may include polyethersulfone, polyarylate, polyetherimide, polyethylene naphthalate, polyethylene terephthalate, polyphenylene sulfide, polyimide, polycarbonate, cellulose acetate propionate, or the like.

As described above, the substrate 100 may include the pixel area PA and the connection area CA. The pixel area PA may include a first pixel area PA1, a second pixel area PA2, a third pixel area PA3, and a fourth pixel area PA4. The connection area CA may include a first connection area CA1, a second connection area CA2, a third connection area CA3, and a fourth connection area CA4.

The first pixel area PA1, the second pixel area PA2, the third pixel area PA3, and the fourth pixel area PA4 may be separated from one another in a first direction and/or a second direction. Here, the first direction and the second direction may be directions that cross each other. For example, an angle formed between the first direction and the second direction may be an acute angle. Alternatively, an angle formed between the first direction and the second direction may be an obtuse angle or a right angle. Hereinafter, for convenience, the case where the first direction and the second direction are perpendicular to each other, will be described. For example, the first direction may be an +x direction or an −x direction, and the second direction may be a +y direction or a −y direction.

For example, the first pixel area PA1 and the second pixel area PA2 may be separated from each other in the first direction (e.g., an +x direction or an −x direction). The first pixel area PA1 and the third pixel area PA3 may be separated from each other in the second direction (e.g., a +y direction or a −y direction). The first pixel area PA1 and the fourth pixel area PA4 may be separated from each other in the first direction (e.g., an +x direction or an −x direction) and in the second direction (e.g., a +y direction or a −y direction). In other words, the fourth pixel area PA4 may be separated from the third pixel area PA3 in the first direction (e.g., an +x direction or an −x direction), and the fourth pixel area PA4 may be separated from the second pixel area PA2 in the second direction (e.g., a +y direction or a −y direction).

Each of the first pixel area PA1, the second pixel area PA2, the third pixel area PA3, and the fourth pixel area PA4 may have a polygonal shape (e.g., approximately a cross shape, or a shape with 12 sides). In other words, rectangular corners may have a rectangular shape indented toward the center of a rectangle.

Figure 1B:
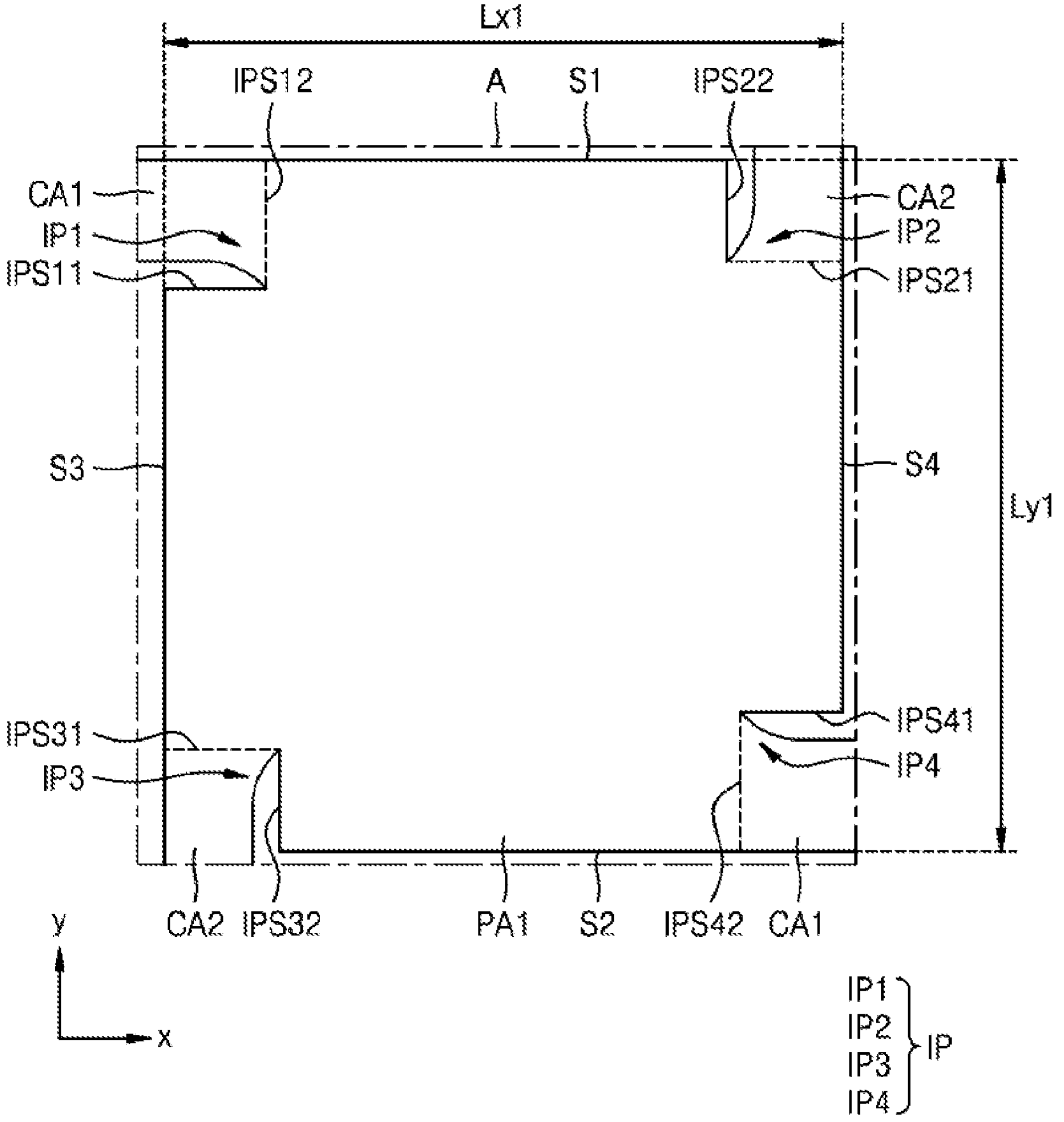
FIG. 1B is an enlarged view schematically illustrating a portion A of the display apparatus shown in FIG. 1A.

As shown in FIG. 1B, which is an enlarged view schematically illustrating a portion A of the display apparatus 1 of FIG. 1A, the first pixel area PA1 may have both sides extending in the first direction (e.g., an +x direction or an −x direction) and both sides extending in the second direction (e.g., a +y direction or a −y direction), and may further include indented portions IP. In the present specification, the "indented portion" refers to a portion indented toward the center of one pixel area from the edge of one pixel area.

For example, the first pixel area PA1 may include a first side S1 and a second side S2 that face each other, and a third side S3 and a fourth side S4 that face each other and that are positioned between the first side S1 and the second side S2. The first side S1 and the second side S2 may extend in the first direction (e.g., an +x direction or an −x direction), and the third side S3 and the fourth side S4 may extend in the second direction (e.g., a +y direction or a −y direction). A distance between the first side S1 and the second side S2 in the second direction (e.g., a +y direction or a −y direction) and a distance between the third side S3 and the fourth side S4 in the first direction (e.g., an +x direction or an −x direction) may be substantially the same.

Each of the indented portions IP may connect one side extending in the first direction (e.g., an +x direction or an −x direction) and one side extending in the second direction (e.g., a +y direction or a −y direction). For example, a plurality of indented portions IP may be provided, and the plurality of indented portions IP may include a first indented portion IP1, a second indented portion IP2, a third indented portion IP3, and a fourth indented portion IP4. The first indented portion IP1 may connect the first side S1 to the third side S3, the second indented portion IP2 may connect the first side S1 to the fourth side S4, the third indented portion IP3 may connect the second side S2 to the third side S3, and the fourth indented portion IP4 may connect the second side S2 to the fourth side S4.

The indented portion IP of the first pixel area PA1 may be defined by a part of the circumference of the first pixel area PA1. As described above, the first pixel area PA1 may have both sides extending in the first direction (e.g., an +x direction or an −x direction) and both sides extending in the second direction (e.g., a +y direction or a −y direction). The indented portion IP of the first pixel area PA1 may be defined by the other side of the first pixel area PA1 extending in the first direction (e.g., an +x direction or an −x direction) other than the aforementioned sides and another side of the first pixel area PA1 extending in the second direction (e.g., a +y direction or a −y direction).

For example, the first pixel area PA1 may further include a (1-1)-th indented side IPS11, a (1-2)-th indented side IPS12, a (2-1)-th indented side IPS21, a (2-2)-th indented side IPS22, a (3-1)-th indented side IPS31, a (3-2)-th indented side IPS32, a (4-1)-th indented side IPS41, and a (4-2)-th indented side IPS42. The first indented portion IP1 may be defined by the (1-1)-th indented side IPS11 extending in the first direction (e.g., an +x direction or an −x direction) and the (1-2)-th indented side IPS12 extending in the second direction (e.g., a +y direction or a −y direction). The (1-1)-th indented side IPS11 may be in contact with the third side S3, and the (1-2)-th indented side IPS12 may be in contact with the first side S1.

Likewise, the second indented portion IP2 may be defined by the (2-1)-th indented side IPS21 extending in the first direction (e.g., an +x direction or an −x direction) and the (2-2)-th indented side IPS22 extending in the second direction (e.g., a +y direction or a −y direction). The (2-1)-th indented side IPS21 may be in contact with the fourth side S4, and the (2-2)-th indented side IPS22 may be in contact with the first side S1.

Likewise, the third indented portion IP3 may be defined by the (3-1)-th indented side IPS31 extending in the first direction (e.g., an +x direction or an −x direction) and the (3-2)-th indented side IPS32 extending in the second direction (e.g., a +y direction or a −y direction). The (3-1)-th indented side IPS31 may be in contact with the third side S3, and the (3-2)-th indented side IPS32 may be in contact with the second side S2.

Likewise, the fourth indented portion IP4 may be defined by the (4-1)-th indented side IPS41 extending in the first direction (e.g., an +x direction or an −x direction) and the (4-2)-th indented side IPS42 extending in the second direction (e.g., a +y direction or a −y direction). The (4-1)-th indented side IPS41 may be in contact with the fourth side S4, and the (4-2)-th indented side IPS42 may be in contact with the second side S2. However, embodiments are not limited to the above.

Meanwhile, as described above, because the distance between the first side S1 and the second side S2 in the second direction (e.g., a +y direction or a −y direction) and the distance between the third side S3 and the fourth side S4 in the first direction (e.g., an +x direction or an −x-direction) are substantially the same, a length Lx1 of the first pixel area PA1 in the first direction (e.g., an +x direction or an −x direction) and a length Ly1 of the first pixel area PA1 in the second direction (e.g., a +y direction or a −y direction) may be substantially the same.

Because the contents described above with respect to the shape of the first pixel area PA1 may be applied to the shape of the second pixel area PA2, the shape of the third pixel area PA3, and the shape of the fourth pixel area PA4, redundant contents thereof are omitted. Thus, each of the first pixel area PA1, the second pixel area PA2, the third pixel area PA3, and the fourth pixel area PA4 may have a rectangular shape in which rectangular corners are indented toward the center of a rectangle.

Meanwhile, adjacent regions of the first pixel area PA1, the second pixel area PA2, the third pixel area PA3, and the fourth pixel area PA4 may be symmetric with respect to each other. For example, the first pixel area PA1 and the second pixel area PA2 adjacent to each other in a left/right direction in FIG. 1A may be bilaterally symmetric with respect to a symmetry axis parallel to the second direction (e.g., a +y direction or a −y direction) between the first pixel area PA1 and the second pixel area PA2. Further, the third pixel area PA3 and the fourth pixel area PA4 adjacent to each other in a left/right direction in FIG. 1A may be bilaterally symmetric with respect to a symmetry axis parallel to the second direction (e.g., a +y direction or a −y direction) between the third pixel area PA3 and the fourth pixel area PA4.

Likewise, the first pixel area PA1 and the third pixel area PA3 adjacent to each other in a vertical direction in FIG. 1A may be vertically symmetric with respect to a symmetry axis parallel to the first direction (e.g., an +x direction or an −x direction) between the first pixel area PA1 and the third pixel area PA3. Further, the second pixel area PA2 and the fourth pixel area PA4 adjacent to each other in the vertical direction in FIG. 1A may be vertically symmetric with respect to a symmetry axis parallel to the first direction (e.g., an +x direction or an −x direction) between the second pixel area PA2 and the fourth pixel area PA4.

Meanwhile, as described above, a length Lx1 of the first pixel area PA1 in the first direction (e.g., an +x direction or an −x direction) and a length Ly1 of the first pixel area PA1 in the second direction (e.g., a +y direction or a −y direction) may be substantially the same. A length in the first direction (e.g., an +x direction or an −x direction) of the second pixel area PA2 and a length in the second direction (e.g., a +y direction or a −y direction) of the second pixel area PA2 may be substantially the same. A length in the first direction (e.g., an +x direction or an −x direction) of the third pixel area PA3 and a length in the second direction (e.g., a +y direction or a −y direction) of the third pixel area PA3 may be substantially the same. A length in the first direction (e.g., an +x direction or an −x direction) of the fourth pixel area PA4 and a length in the second direction (e.g., a +y direction or a −y direction) of the fourth pixel area PA4 may be substantially the same. In this case, the area of the pixel area PA is small, and thus, space utilization may be efficient. That is, more pixels may be arranged in a given area.

A plurality of pixels may be arranged in the first pixel area PA1, the second pixel area PA2, the third pixel area PA3, and the fourth pixel area PA4, respectively. Each of the pixels may include a plurality of sub-pixels that may emit green light, red light, or blue light. That is, each of the plurality of sub-pixels may include an organic light-emitting diode that may emit green light, an organic light-emitting diode that may emit red light, or an organic light-emitting diode that may emit blue light.

The first pixel area PA1, the second pixel area PA2, the third pixel area PA3, and the fourth pixel area PA4 may be connected to each other by the first connection area CA1, the second connection area CA2, the third connection area CA3, or the fourth connection area CA4. For example, the first connection area CA1 may be configured to connect the first pixel area PA1 to the second pixel area PA2, and the second connection area CA2 may be configured to connect the first pixel area PA1 to the third pixel area PA3. The third connection area CA3 may be configured to connect the second pixel area PA2 to the fourth pixel area PA4, and the fourth connection area CA4 may be configured to connect the third pixel area PA3 to the fourth pixel area PA4.

The first connection area CA1 may extend from the first pixel area PA1 to the second pixel area PA2. The first pixel area PA1 and the second pixel area PA2 may be connected to each other by the first connection area CA1. The second connection area CA2 may extend from the first pixel area PA1 to the third pixel area PA3. The first pixel area PA1 and the third pixel area PA3 may be connected to each other by the second connection area CA2. The third connection area CA3 may extend from the second pixel area PA2 to the fourth pixel area PA4. The second pixel area PA2 and the fourth pixel area PA4 may be connected to each other by the third connection area CA3. The fourth connection area CA4 may extend from the third pixel area PA3 to the fourth pixel area PA4. The third pixel area PA3 and the fourth pixel area PA4 may be connected to each other by the fourth connection area CA4.

For example, the first connection area CA1 connected to the first pixel area PA1 may extend in the first direction (e.g., an +x direction or an −x direction), and may be connected to the second pixel area PA2 to be adjacent to the first pixel area PA1. Likewise, the second connection area CA2 connected to the first pixel area PA1 may extend in the second direction (e.g., a +y direction or a −y direction) and may be connected to the third pixel area PA3 to be adjacent to the first pixel area PA1. Likewise, the third connection area CA3 connected to the second pixel area PA2 may extend in the second direction (e.g., a +y direction or a −y direction) and may be connected to the fourth pixel area PA4 to be adjacent to the second pixel area PA2. Likewise, the fourth connection area CA4 connected to the third pixel area PA3 may extend in the first direction (e.g., an +x direction or an −x direction) and may be connected to the fourth pixel area PA4 to be adjacent to the third pixel area PA3.

The first pixel area PA1, the second pixel area PA2, the third pixel area PA3, the fourth pixel area PA4, the first connection area CA1, the second connection area CA2, the third connection area CA3, and the fourth connection area CA4 may be continuously constituted of the same material. The first pixel area PA1, the second pixel area PA2, the third pixel area PA3, the fourth pixel area PA4, the first connection area CA1, the second connection area CA2, the third connection area CA3, and the fourth connection area CA4 may be integrally provided. In other words, the first pixel area PA1, the second pixel area PA2, the third pixel area PA3, the fourth pixel area PA4, the first connection area CA1, the second connection area CA2, the third connection area CA3, and the fourth connection area CA4 may be integrally formed.

The first pixel area PA1, the second pixel area PA2, the third pixel area PA3, the fourth pixel area PA4, the first connection area CA1, the second connection area CA2, the third connection area CA3, and the fourth connection area CA4 may be repeatedly arranged in the first direction (e.g., an +x direction or an −x direction) and the second direction (e.g., a +y direction or a −y direction). Thus, it may be understood that the display apparatus 1 may be provided by connecting the first pixel area PA1, the second pixel area PA2, the third pixel area PA3, the fourth pixel area PA4, the first connection area CA1, the second connection area CA2, the third connection area CA3, and the fourth connection area CA4 to one another. That is, the first connection area CA1 connected to the indented portion IP at the left top of the first pixel area PA1 of FIG. 1A may be configured to connect the first pixel area PA1 to another second pixel area PA2 in the −x direction of the first pixel area PA1. The second connection area CA2 connected to the indented portion IP at the left bottom of the first pixel area PA1 of FIG. 1A may be configured to connect the first pixel area PA1 to another third pixel area PA3 in the −y direction of the first pixel area PA1.

Likewise, the first connection area CA1 connected to the indented portion IP at the right top of the second pixel area PA2 of FIG. 1A may be configured to connect the second pixel area PA2 to another first pixel area PA1 in the +x direction of the second pixel area PA2. The third connection area CA3 connected to the indented portion IP at the right bottom of the second pixel area PA2 of FIG. 1A may be configured to connect the second pixel area PA2 to another fourth pixel area PA4 in the −y direction of the second pixel area PA2. Likewise, the second connection area CA2 connected to the indented portion IP at the left top of the third pixel area PA3 of FIG. 1A may be configured to connect the third pixel area PA3 to another first pixel area PA1 in the +y direction of the third pixel area PA3. The fourth connection area CA4 connected to the indented portion IP at the left bottom of the third pixel area PA3 of FIG. 1A may be configured to connect the third pixel area PA3 to another fourth pixel area PA4 in the −x direction of the third pixel area PA3. Likewise, the third connection area CA3 connected to the indented portion IP at the right top of the fourth pixel area PA4 of FIG. 1A may be configured to connect the fourth pixel area PA4 to another second pixel area PA2 in the +y direction of the fourth pixel area PA4. The fourth connection area CA4 connected to the indented portion IP at the right bottom of the fourth pixel area PA4 of FIG. 1A may be configured to connect the fourth pixel area PA4 to another third pixel area PA3 in the +x direction of the fourth pixel area PA4.

Thus, one first pixel area PA1 may be connected to a pair of first connection areas CA1 located opposite to each other with respect to a first pixel area PA1, and extending in a direction parallel to the first direction (e.g., an +x direction or an −x direction), and may be connected to a pair of second connection areas CA2 located opposite to each other with respect to the first pixel area PA1, and extending in a direction parallel to the second direction (e.g., a +y direction or a −y direction).

Likewise, one second pixel area PA2 may be connected to a pair of first connection areas CA1 located opposite to each other with respect to a second pixel area PA2, and extending in a direction parallel to the first direction (e.g., an +x direction or an −x direction), and may be connected to a pair of third connection areas CA3 located opposite to each other with respect to the second pixel area PA2, and extending in a direction parallel to the second direction (e.g., a +y direction or a −y direction).

Likewise, one third pixel area PA3 may be connected to a pair of fourth connection areas CA4 located opposite to each other with respect to a third pixel area PA3, and extending in a direction parallel to the first direction (e.g., an +x direction or an −x direction), and may be connected to a pair of second connection areas CA2 located opposite to each other with respect to the third pixel area PA3, and extending in a direction parallel to the second direction (e.g., a +y direction or a −y direction).

Likewise, one fourth pixel area PA4 may be connected to a pair of fourth connection areas CA4 located opposite to each other with respect to a fourth pixel area PA4, and extending in a direction parallel to the first direction (e.g., an +x direction or an −x direction), and may be connected to a pair of third connection areas CA3 located opposite to each other with respect to the fourth pixel area PA4, and extending in a direction parallel to the second direction (e.g., a +y direction or a −y direction).

The separation area V may be defined by perimeters (e.g., circumferences) of the first pixel area PA1, the second pixel area PA2, the third pixel area PA3, and the fourth pixel area PA4, and perimeters of the first connection area CA1, the second connection area CA2, the third connection area CA3, and the fourth connection area CA4. The separation area V may include a first separation area V1 and a second separation area V2. For example, closed curves may be formed by the perimeters of the first pixel area PA1, the second pixel area PA2, the third pixel area PA3, and the fourth pixel area PA4, and the perimeters of the first connection area CA1, the second connection area CA2, the third connection area CA3, and the fourth connection area CA4. These closed curves may be configured to define the separation area V.

For example, a first closed curve CL1 including a portion of the circumference of the first pixel area PA1, a portion of the circumference of the first connection area CA1, a portion of the circumference of the second pixel area PA2, a portion of the circumference of the third connection area CA3, a portion of the circumference of the fourth pixel area PA4, a portion of the circumference of the fourth connection area CA4, a portion of the circumference of the third pixel area PA3, and a portion of the circumference of the second connection area CA2 may be formed. The first closed curve CL1 may be configured to define the first separation area V1 that is an empty space.

Likewise, a second closed curve CL2 including a portion of the circumference of the first pixel area PA1, a portion of the circumference of the first connection area CA1, a portion of the circumference of the third connection area CA3, a portion of the circumference of the third pixel area PA3, a portion of the circumference of the fourth connection area CA4, a portion of the circumference of the fourth pixel area PA4, a portion of the circumference of the second connection area CA2, and a portion of the circumference of the second pixel area PA2 may be formed. The second closed curve CL2 may be configured to define the second separation area V2 that is an empty space.

The first separation area V1 may have an H shape that is rotated clockwise at 90 degrees (e.g., an I shape), and the second separation area V2 may have an H shape (e.g., an I shape that is rotated 90 degrees). However, embodiments are not limited thereto.

In one or more embodiments, an angle between a portion of the circumference of the first pixel area PA1 and a portion of the circumference of the first connection area CA1 may be a first angle 81, and the first angle 81 may be an acute angle. An angle between a portion of the circumference of the first pixel area PA1 and a portion of the circumference of the second connection area CA2, an angle between a portion of the circumference of the second pixel area PA2 and a portion of the circumference of the first connection area CA1, an angle between a portion of the circumference of the second pixel area PA2 and a portion of the circumference of the third connection area CA3, an angle between a portion of the circumference of the third pixel area PA3 and a portion of the circumference of the second connection area CA2, an angle between a portion of the circumference of the third pixel area PA3 and a portion of the circumference of the fourth connection area CA4, an angle between a portion of the circumference of the fourth pixel area PA4 and a portion of the circumference of the third connection area CA3, and an angle between a portion of the circumference of the fourth pixel area PA4 and a portion of the circumference of the fourth connection area CA4, may be substantially the same as or similar to the first angle 81.

The separation area V may pass through the substrate 100. For example, the separation area V may pass through upper and lower surfaces of the substrate 100. The separation area V may provide a separation area between the first pixel area PA1, the second pixel area PA2, the third pixel area PA3, and the fourth pixel area PA4. For example, the first separation area V1 may provide a separation area between the first pixel area PA1 and the second pixel area PA2, and a separation area between the third pixel area PA3 and the fourth pixel area PA4. The second separation area V2 may provide a separation area between the first pixel area PA1 and the third pixel area PA3, and a separation area between the second pixel area PA2 and the fourth pixel area PA4. Thus, the separation area V may reduce the weight of the substrate 100, and may enhance the flexibility of the substrate 100.

Also, when warpage, bending, or rolling of the substrate 100 occurs, the shape of the separation area V may be changed. Thus, the occurrence of stress when the substrate 100 is deformed, may be easily reduced. Thus, abnormal deformation of the substrate 100 may be reduced or prevented, and durability may be enhanced. Thus, user's convenience may be enhanced when the display apparatus 1 is used, and the display apparatus 1 may be easily applied to a wearable apparatus.

The separation area V may be formed by removing one region of the substrate 100 using a method, such as etching, and in another example, the separation area V may be provided when the substrate 100 is manufactured. There may be various examples of a process of forming the separation area V in the substrate 100, and there may be no limitation in the manufacturing method thereof.

Figure 2:
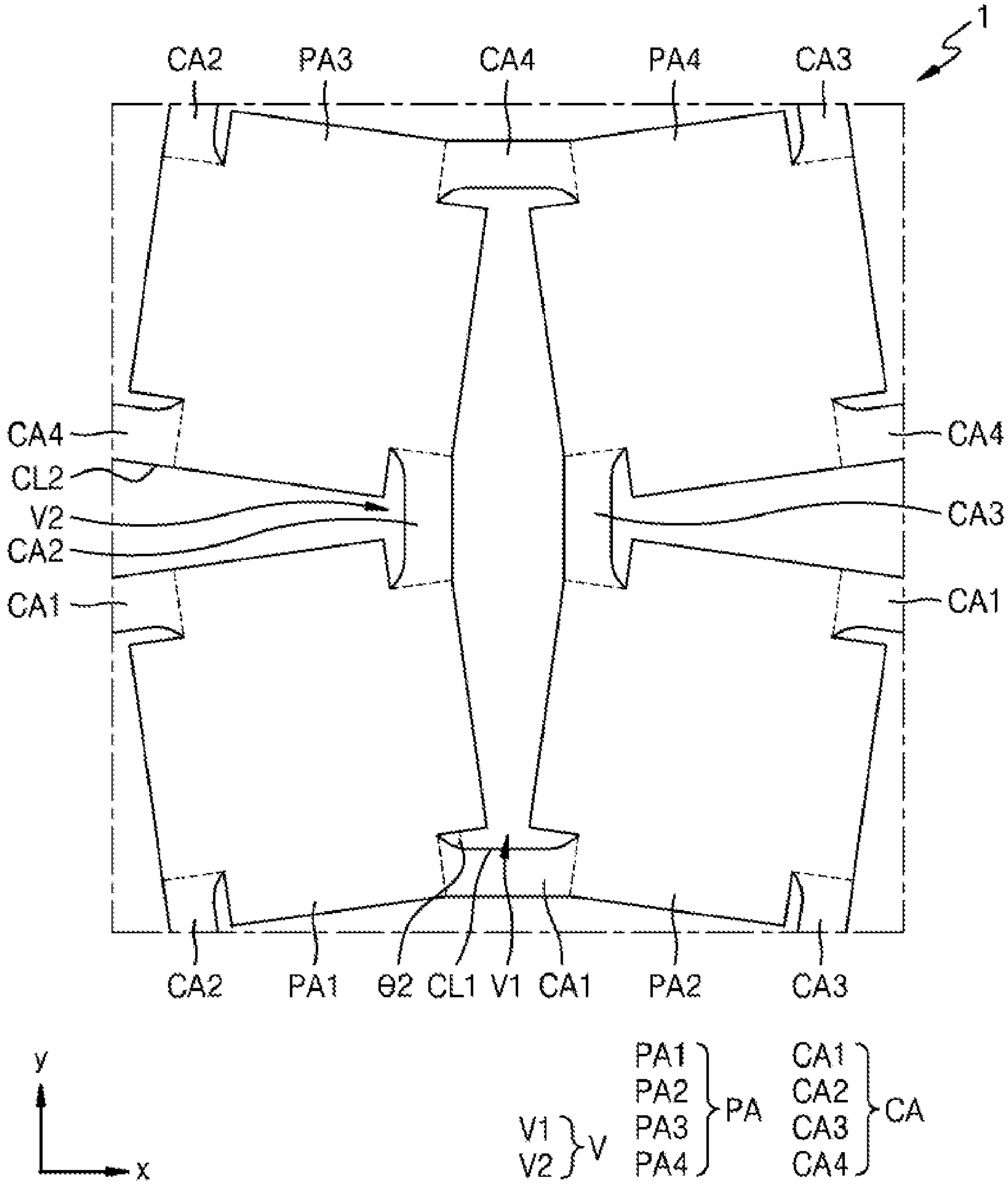
FIG. 2 is a plan view schematically illustrating a display apparatus after external force is applied to the display apparatus according to one or more embodiments.
Figure 3:
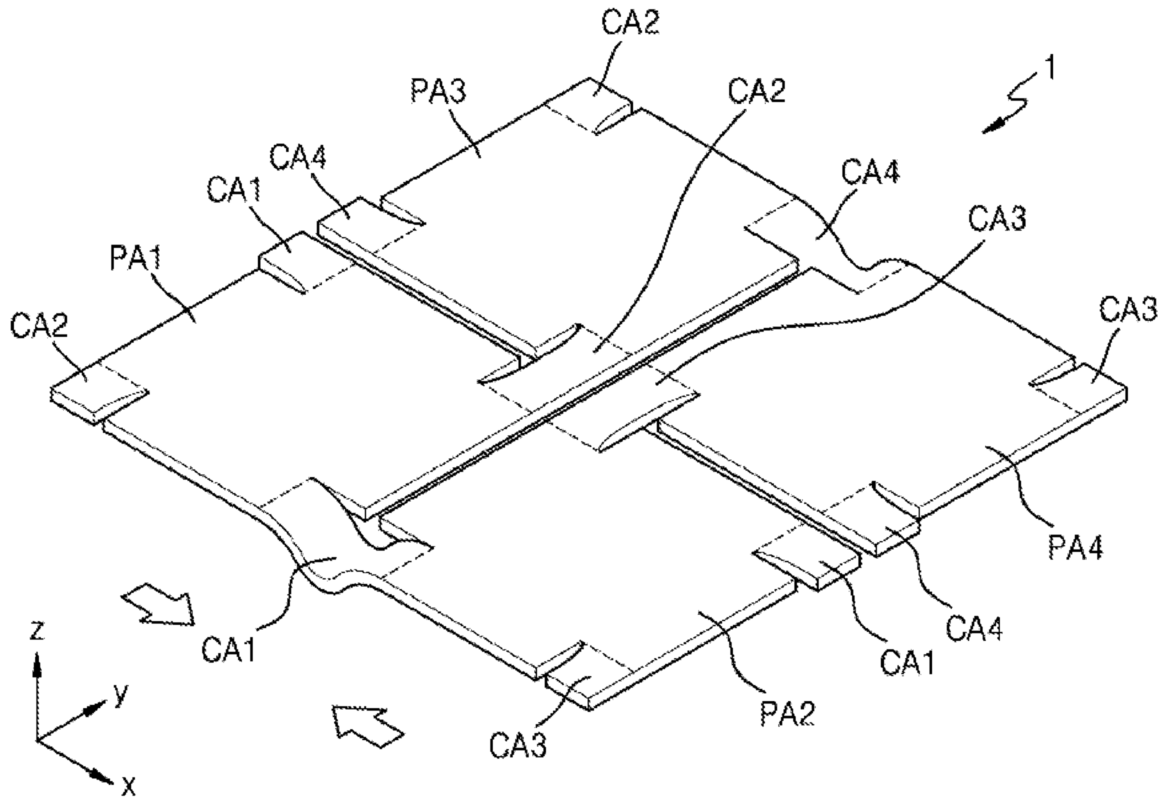
FIG. 3 is a perspective view schematically illustrating a display apparatus after external force is applied to the display apparatus according to one or more embodiments.

When an external force is applied to the display apparatus 1, the position and/or shape of components provided in the substrate 100 may be changed. FIG. 2 is a plan view schematically illustrating the display apparatus 1 after an external force is applied to the display apparatus 1 according to one or more embodiments, and FIG. 3 is a perspective view schematically illustrating the display apparatus 1 after an external force is applied to the display apparatus 1 according to one or more embodiments. For example, FIG. 2 illustrates a shape when the substrate 100 extends in the first direction (e.g., a +x direction or an −x direction) and the second direction (e.g., a +y direction or a −y direction).

Referring to FIG. 2, when an external force, such as a tensile force, is applied to the substrate 100, an angle between a portion of the circumference of the first pixel area PA1 and a portion of the circumference of the first connection area CA1 may be a second angle 82. The second angle 82 may be greater than the first angle 81. That is, when an external force, such as a tensile force, is applied to the substrate 100, an angle between a portion of the circumference of the first pixel area PA1 and a portion of the circumference of the first connection area CA1 may be increased.

Likewise, an angle between a portion of the circumference of the first pixel area PA1 and a portion of the circumference of the second connection area CA2, an angle between a portion of the circumference of the second pixel area PA2 and a portion of the circumference of the first connection area CA1, an angle between a portion of the circumference of the second pixel area PA2 and a portion of the circumference of the third connection area CA3, an angle between a portion of the circumference of the third pixel area PA3 and a portion of the circumference of the second connection area CA2, an angle between a portion of the circumference of the third pixel area PA3 and a portion of the circumference of the fourth connection area CA4, an angle between a portion of the circumference of the fourth pixel area PA4 and a portion of the circumference of the third connection area CA3, and an angle between a portion of the circumference of the fourth pixel area PA4 and a portion of the circumference of the fourth connection area CA4, may also be increased.

Thus, the area of the separation area V may be increased. Thus, a distance between the first pixel area PA1 and the third pixel area PA3, a distance between the second pixel area PA2 and the fourth pixel area PA4, a distance between the first pixel area PA1 and the second pixel area PA2, and a distance between the third pixel area PA3 and the fourth pixel area PA4, may be increased.

Meanwhile, a stress, when the substrate 100 is elongated, may be concentrated on a portion of the first connection area CA1 connected to an indented portion IP of the first pixel area PA1. Further, the stress, when the substrate 100 is elongated, may be concentrated on a portion of the second connection area CA2 connected to the indented portion IP of the first pixel area PA1, a portion of the first connection area CA1 connected to an indented portion IP of the second pixel area PA2, a portion of the third connection area CA3 connected to an indented portion IP of the second pixel area PA2, a portion of the second connection area CA2 connected to an indented portion IP of the third pixel area PA3, a portion of the fourth connection area CA4 connected to an indented portion IP of the third pixel area PA3, a portion of the third connection area CA3 connected to an indented portion IP of the fourth pixel area PA4, or a portion of the fourth connection area CA4 connected to an indented portion IP of the fourth pixel area PA4.

A first closed curve CL1 defining a first separation area V1, and a second closed curve CL2 defining a second separation area V2, may include a curve to reduced or prevent the likelihood of tearing of the first connection area CA1 or the like due to the concentration of the stress.

As shown in FIG. 3, when an external force, such as a compressive force, is applied to the substrate 100, the substrate 100 may be modified in a third direction (e.g., a +z direction or a −z direction). For example, when an external force, such as a compressive force, is applied to the substrate 100, the first connection area CA1 and the fourth connection area CA4 may be bent. Thus, at least a portion of the first connection area CA1 and at least a portion of the fourth connection area CA4 may be moved in the third direction (e.g., a +z direction or a −z direction). For example, the central portion of the first connection area CA1 may be moved farthest from the first pixel area PA1 and the second pixel area PA2 in the third direction (e.g., a +z direction or a −z direction). Movement in the third direction (e.g., a +z direction or a −z direction) may be reduced from the center of the first connection area CA1 toward the first pixel area PA1 or the second pixel area PA2. In this case, the distance between the adjacent first pixel area PA1 and the second pixel area PA2 may be reduced.

The above-described contents regarding changes in the first connection area CA1 when an external force, such as a compressive force, is applied to the substrate 100, may also be applied to the second connection area CA2, the third connection area CA3, and the fourth connection area CA4. Further, the above-described contents regarding changes in a distance between the first pixel area PA1 and the second pixel area PA2 when an external force, such as a compressive force, is applied to the substrate 100, may also be applied to a distance between the first pixel area PA1 and the third pixel area PA3, a distance between the second pixel area PA2 and the fourth pixel area PA4, and a distance between the third pixel area PA3 and the fourth pixel area PA4. Thus, redundant descriptions thereof will be omitted.

That is, when an external force is applied to the substrate 100, the positions and/or shapes of components provided in the substrate 100 may be two-dimensionally or three-dimensionally changed. In detail, the area and shape of the separation area V may be changed, and the positions and shapes of the first connection area CA1, the second connection area CA2, the third connection area CA3, and the fourth connection area CA4 may be changed. Thus, the positions of the first pixel area PA1, the second pixel area PA2, the third pixel area PA3, and the fourth pixel area PA4 may be changed. The first connection area CA1, the second connection area CA2, the third connection area CA3, and the fourth connection area CA4 may be formed to have smaller widths than those of the first pixel area PA1, the second pixel area PA2, the third pixel area PA3, and the fourth pixel area PA4. Thus, changes in the shape when an external force is applied to the substrate 100 occur in the first connection area CA1, the second connection area CA2, the third connection area CA3, and the fourth connection area CA4, and the shapes of the first pixel area PA1, the second pixel area PA2, the third pixel area PA3, and the fourth pixel area PA4 may be relatively unchanged. Thus, a plurality of pixels arranged in each of the first pixel area PA1, the second pixel area PA2, the third pixel area PA3, and the fourth pixel area PA4 may be stably maintained even when an external force is applied to the substrate 100.

Figure 4:
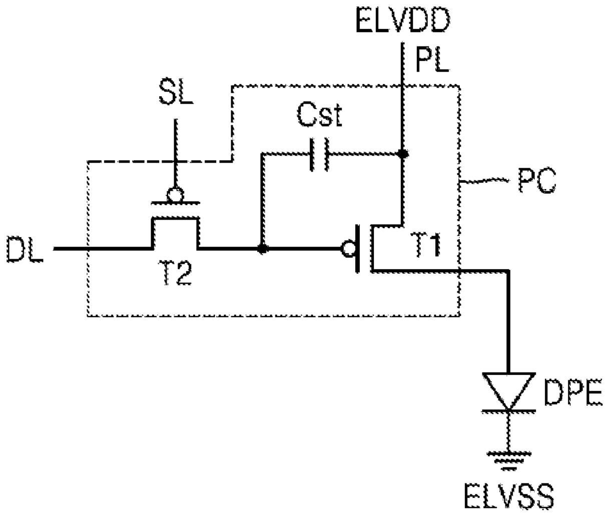
FIG. 4 is an equivalent circuit diagram schematically illustrating a pixel circuit that may be applied to a display apparatus according to one or more embodiments.

FIG. 4 is an equivalent circuit diagram schematically illustrating a pixel circuit PC that may be applied to the display apparatus 1 according to one or more embodiments.

Referring to FIG. 4, the pixel circuit PC may be connected to a display element DPE, for example, an organic light-emitting diode. The pixel circuit PC may include a driving thin film transistor T1, a switching thin film transistor T2, and a storage capacitor Cst. The organic light-emitting diode may emit green light, red light, or blue light, or may emit green light, red light, blue light, or white light.

The switching thin film transistor T2 may be connected to a scan line SL and a data line DL, and may be configured to transmit a data signal or data voltage input from the data line DL to the driving thin film transistor T1 based on a scan signal or switching voltage input from the scan line SL. The storage capacitor Cst may be connected to a driving voltage line PL and the switching thin film transistor T2, and may be configured to store a voltage corresponding to a difference between a voltage transmitted from the switching thin film transistor T2 and a first power supply voltage ELVDD supplied to the driving voltage line PL.

The driving thin film transistor T1 may be connected to the driving voltage line PL and the storage capacitor Cst and may be configured to control a driving current flowing through the display element DPE from the driving voltage line PL in response to a voltage value stored in the storage capacitor Cst. The display element DPE may emit light having certain brightness by the driving current. An opposite electrode of the display element DPE may receive a second power supply voltage ELVSS.

FIG. 4 illustrates that the pixel circuit PC includes two thin film transistors and one storage capacitor, but the pixel circuit PC may include three, four, five, or more thin film transistors.

Figure 5:
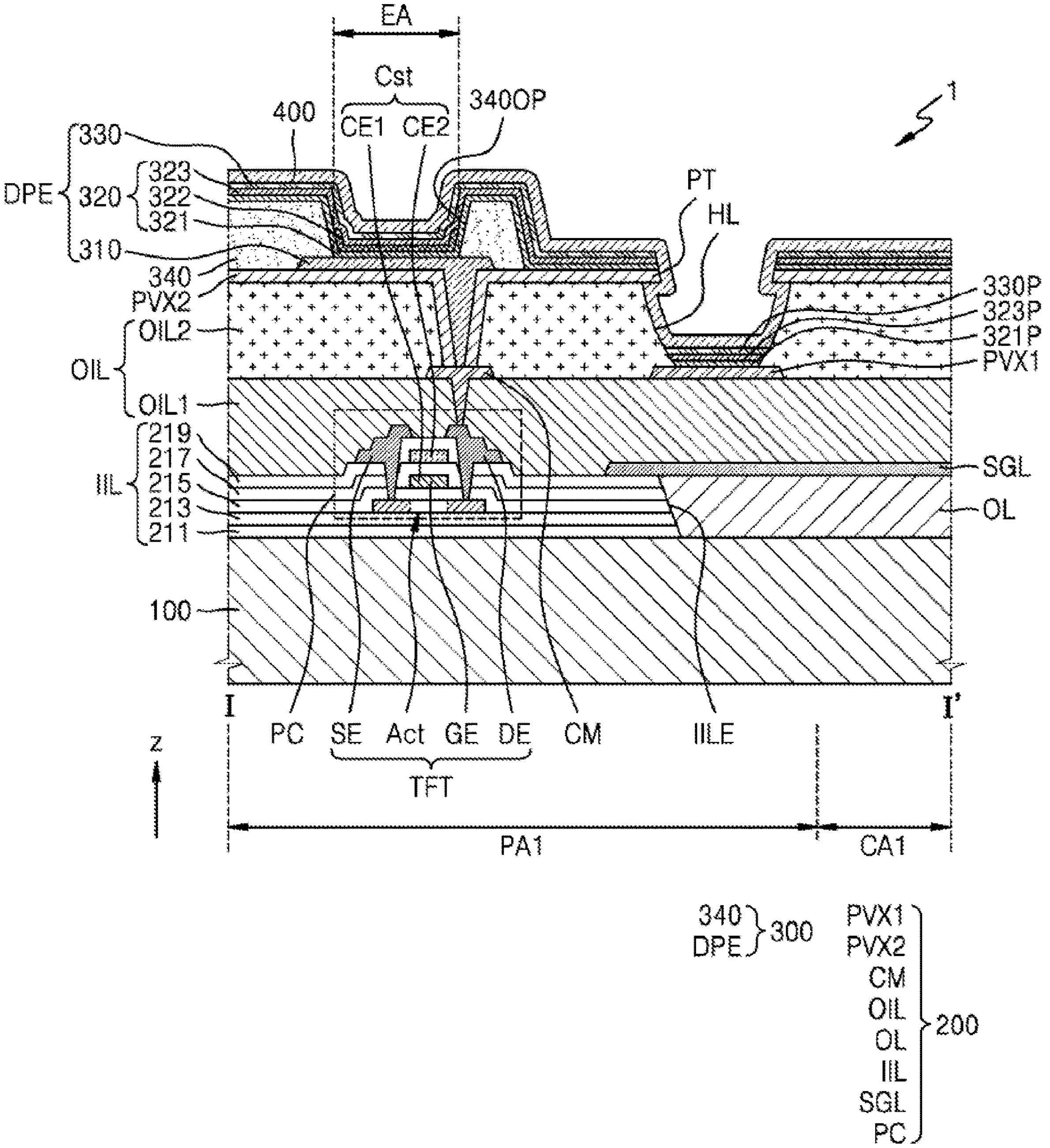
FIG. 5 is a cross-sectional view schematically illustrating the display apparatus taken along the line I-I' of FIG. 1A.

FIG. 5 is a cross-sectional view schematically illustrating the display apparatus 1 taken along the line I-I' of FIG. 1A. Referring to FIG. 5, the display apparatus 1 may include a substrate 100, a pixel circuit layer 200, a display element layer 300, and an encapsulation layer 400. As described above, the substrate 100 may include a pixel area PA and a connection area CA. For example, the substrate 100 may include a first pixel area PA1 and a first connection area CA1.

The substrate 100 may include a polymer resin, such as polyethersulfone, polyarylate, polyetherimide, polyethylene naphthalate, polyethylene terephthalate, polyphenylene sulfide, polyimide, polycarbonate, cellulose triacetate, cellulose acetate propionate, or the like. For example, the substrate 100 may include two layers including the polymer resin, and a barrier layer between the two layers. In this case, the barrier layer may include an inorganic material, such as silicon nitride (SiNx), silicon oxide (SiOx) and/or silicon oxynitride (SiOxNy), or the like. The substrate 100 including the polymer resin may have flexible, rollable, or bendable characteristics. Unlike this, the substrate 100 may also include glass or metal.

The pixel circuit layer 200 may be arranged on the substrate 100. The pixel circuit layer 200 may include a pixel circuit PC, a signal line SGL, an inorganic insulating layer IIL, an organic material layer OL, an organic insulating layer OIL, a contact electrode CM, a first inorganic layer PVX1, and a second inorganic layer PVX2. The pixel circuit PC may include a thin film transistor TFT and a storage capacitor Cst. The thin film transistor TFT may include a semiconductor layer Act, a gate electrode GE, a source electrode SE, and a drain electrode DE. The storage capacitor Cst may include a first capacitor electrode CE1 and a second capacitor electrode CE2.

The inorganic insulating layer IIL may be arranged on the substrate 100. The inorganic insulating layer IIL may include a barrier layer 211, a buffer layer 213, a first gate insulating layer 215, a second gate insulating layer 217, and an interlayer insulating layer 219.

The barrier layer 211 may be arranged on the substrate 100. The barrier layer 211 may be a layer for preventing or reducing penetration of external foreign substances. The barrier layer 211 may have a single layer or multi-layered structure including an inorganic material, such as silicon nitride (SiNx), silicon oxide (SiOx) and/or silicon oxynitride (SiOxNy), or the like.

The buffer layer 213 may be arranged on the barrier layer 211. The buffer layer 213 may include an inorganic insulating material, such as silicon nitride (SiNx), silicon oxide (SiOx) and/or silicon oxynitride (SiOxNy), or the like, and may have a single layer or multi-layered structure including the inorganic insulating material.

The semiconductor layer Act may be arranged on the buffer layer 213. The semiconductor layer Act may include polysilicon. Alternatively, the semiconductor layer Act may include amorphous silicon, an oxide semiconductor, an organic semiconductor, or the like. The semiconductor layer Act may include a channel region, and a source region and a drain region, which are at both sides of the channel region.

The first gate insulating layer 215 may be arranged on the semiconductor layer Act and the buffer layer 213. The first gate insulating layer 215 may include an inorganic insulating material, such as silicon oxide ($SiO_x$), silicon nitride ($SiN_x$), silicon oxynitride ($SiO_xN_y$), aluminum oxide ($Al_2O_3$), titanium oxide ($TiO_2$), tantalum oxide ($Ta_2O_5$), hafnium oxide ($HfO_2$) and/or zinc oxide ($ZnO_x$). The zinc oxide (ZnOx) may include zinc oxide (ZnO) and/or zinc peroxide ($ZnO_2$).

The gate electrode GE may be located on the first gate insulating layer 215. The gate electrode GE may overlap a channel region of the semiconductor layer Act. The gate electrode GE may include a low resistance metal material. For example, the gate electrode GE may include a conductive material including molybdenum (Mo), aluminum (Al), copper (Cu), titanium (Ti), and/or the like, and may have a single layer or multi-layered structure including the conductive material.

The second gate insulating layer 217 may be arranged on the gate electrode GE and the first gate insulating layer 215. The second gate insulating layer 217 may include an inorganic insulating material, such as silicon oxide ($SiO_x$), silicon nitride ($SiN_X$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide (ZnOx).

The second capacitor electrode CE2 may be located on the second gate insulating layer 217. The second capacitor electrode CE2 may overlap the gate electrode GE. In this case, the gate electrode GE may function as the first capacitor electrode CE1. FIG. 5 illustrates that the storage capacitor Cst and the thin film transistor TFT overlap each other. However, embodiments are not limited thereto. For example, the storage capacitor Cst and the thin film transistor TFT may not overlap each other. In this case, the first capacitor electrode CE1 and the gate electrode GE may be separate electrodes. The second capacitor electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu).

The interlayer insulating layer 219 may be arranged on the second capacitor electrode CE2 and the second gate insulating layer 217. The interlayer insulating layer 219 may include an inorganic insulating material, such as silicon oxide ($SiO_x$), silicon nitride ($SiN_X$), silicon oxynitride ($SiO_xN_y$), aluminum oxide ($Al_2O_3$), titanium oxide ($TiO_2$), tantalum oxide ($Ta_2O_5$), hafnium oxide ($HfO_2$), and/or zinc oxide ($ZnO_x$).

Each of the source electrode SE and the drain electrode DE may be arranged on the interlayer insulating layer 219. Each of the source electrode SE and the drain electrode DE may be connected to the semiconductor layer Act via a contact hole provided in the first gate insulating layer 215, the second gate insulating layer 217, and the interlayer insulating layer 219. At least one of the source electrode SE and the drain electrode DE may include a conductive material including Mo, Al, Cu, and/or Ti, and may have a single layer or multi-layered structure including the conductive material. For example, at least one of the source electrode SE and the drain electrode DE may have a multi-layered structure of Ti/Al/Ti.

The inorganic insulating layer IIL may overlap the first pixel area PA1, and may not overlap the first connection area CA1. The inorganic insulating layer IIL may have an end IILE of the inorganic insulating layer IIL facing the first connection area CA1. Thus, the display apparatus 1 may be flexible in the first connection area CA1. FIG. 5 illustrates that the end IILE of the inorganic insulating layer IIL does not have a step height, but embodiments are not limited thereto. For example, the end IILE of the inorganic insulating layer IIL may have a step height. The inorganic insulating layer IIL may also overlap the first pixel area PA1 and the first connection area CA1.

The organic material layer OL may overlap the first connection area CA1. The organic material layer OL may cover the end IILE of the inorganic insulating layer IIL. The organic material layer OL may be configured to reduce or minimize a height difference when the signal line SGL extends to the first connection area CA1 from the first pixel area PA1, and may absorb a stress that may be applied to the signal line SGL. The organic material layer OL may include an organic material. The organic material layer OL may include an organic insulating material, such as a general-purpose polymer, such as polymethylmethacrylate (PMMA) or polystyrene (PS), a polymer derivative having a phenol-based group, an acryl-based polymer, an imide-based polymer, an arylate ether-based polymer, an amide-based polymer, a fluorine-based polymer, a p-xylene-based polymer, a vinyl alcohol-based polymer, and a blend thereof.

The signal line SGL may be arranged on the inorganic insulating layer IIL and the organic material layer OL. The signal line SGL may extend from the first pixel area PA1 to the first connection area CA1. In one or more embodiments, the signal line SGL may be electrically connected to the pixel circuit PC. The signal line SGL may include a conductive material including Mo, Al, Cu, Ti, and/or the like, and may have a single layer or multi-layered structure including the conductive material. For example, the signal line SGL may have a multi-layered structure of Ti/Al/Ti.

The organic insulating layer OIL may include a first organic insulating layer OIL1 and a second organic insulating layer OIL2. The first organic insulating layer OIL1 may be arranged on the inorganic insulating layer IIL, the source electrode SE, the drain electrode DE, and the signal line SGL. The second organic insulating layer OIL2 may be arranged on the first organic insulating layer OIL1 and the contact electrode CM.

The first organic insulating layer OIL1 may include an organic material. The first organic insulating layer OIL1 may include an organic insulating material, such as a general-purpose polymer, such as PMMA or PS, a polymer derivative having a phenol-based group, an acryl-based polymer, an imide-based polymer, an arylate ether-based polymer, an amide-based polymer, a fluorine-based polymer, a p-xylene-based polymer, a vinyl alcohol-based polymer, and/or a blend thereof.

The signal line SGL may be arranged between the organic material layer OL and the first organic insulating layer OIL1 in the first connection area CA1. When the shape of the display apparatus 1 is deformed, the first connection area CA1 may be bent. In this case, a stress neutral plane may be present in the display apparatus 1. Because the signal line SGL is arranged between the organic material layer OL and the first organic insulating layer OIL1, the signal line SGL may be positioned on the stress neutral plane. Thus, stress applied to the signal line SGL may be reduced or minimized.

The contact electrode CM may overlap the first pixel area PA1, and may be arranged on the first organic insulating layer OIL1. The contact electrode CM may be electrically connected to the pixel circuit PC via a contact hole of the first organic insulating layer OIL1. The contact electrode CM may include a conductive material including Mo, Al, Cu, Ti, or the like, and may have a single layer or multi-layered structure including the conductive material. The contact electrode CM may have a multi-layered structure of Ti/Al/Ti.

The second organic insulating layer OIL2 may include an organic material. The second organic insulating layer OIL2 may include an organic insulating material, such as a general-purpose polymer, such as PMMA or PS, a polymer derivative having a phenol-based group, an acryl-based polymer, an imide-based polymer, an arylate ether-based polymer, an amide-based polymer, a fluorine-based polymer, a p-xylene-based polymer, a vinyl alcohol-based polymer, and/or a blend thereof.

The first inorganic layer PVX1 may be arranged between the first organic insulating layer OIL1 and the second organic insulating layer OIL2. The first inorganic layer PVX1 may include an inorganic material.

The second organic insulating layer OIL2 may include (e.g., define) a hole HL. The hole HL may expose the first inorganic layer PVX1. The hole HL may be formed by etching the second organic insulating layer OIL2. The first inorganic layer PVX1 may be configured to prevent or reduce overetching of components located below the first inorganic layer PVX1.

The second inorganic layer PVX2 may be arranged on the second organic insulating layer OIL2. The second inorganic layer PVX2 may have a protrusion tip PT protruding toward the center of the hole HL. A lower surface of the protrusion tip PT of the second inorganic layer PVX2 may be exposed through the hole HL.

The display element layer 300 may be arranged on the pixel circuit layer 200. The display element layer 300 may include a display element DPE and a pixel-defining layer 340. The display element DPE may be an organic light-emitting diode. The display element DPE may include a pixel electrode 310, an intermediate layer 320, and an opposite electrode 330.

The pixel electrode 310 may be electrically connected to the contact electrode CM via a contact hole of the second organic insulating layer OIL2. Thus, the display element DPE may be electrically connected to the pixel circuit PC. The pixel electrode 310 may include conductive oxide, such as indium tin oxide (ITO), indium zinc oxide (IZO), zinc oxide (ZnO), indium oxide ($In_2O_3$), indium gallium oxide (IGO), and/or aluminum zinc oxide (AZO). In one or more other embodiments, the pixel electrode 310 may include a reflective layer including silver (Ag), magnesium (Mg), aluminum (Al), platinum (Pt), palladium (Pd), gold (Au), nickel (Ni), neodymium (Nd), iridium (Ir), chromium (Cr), and/or a compound thereof. In one or more other embodiments, the pixel electrode 310 may further include a layer formed of ITO, IZO, ZnO, and/or $In_2O_3$ on/under the above-described reflective layer.

The pixel-defining layer 340 may cover edges of the pixel electrode 310. The pixel-defining layer 340 may include an opening 3400P, and the opening 3400P may overlap the pixel electrode 310. The opening 3400P may define an emission area EA of light emitted by the display element DPE. The pixel-defining layer 340 may include an organic insulating material and/or an inorganic insulating material. In some embodiments, the pixel-defining layer 340 may include a light-blocking material.

The intermediate layer 320 may be arranged on the pixel electrode 310, the pixel-defining layer 340, and/or the second inorganic layer PVX2. The intermediate layer 320 may include a light-emitting layer 322. The light-emitting layer 322 may overlap the pixel electrode 310. The light-emitting layer 322 may include a polymer or low molecular weight organic material that emits light of corresponding color.

The intermediate layer 320 may further include at least one of the first functional layer 321 and the second functional layer 323. The first functional layer 321 may be arranged between the pixel electrode 310 and the light-emitting layer 322. The first functional layer 321 may include a hole transport layer (HTL) and/or a hole injection layer (HIL). The second functional layer 323 may be arranged between the light-emitting layer 322 and the opposite electrode 330. The second functional layer 323 may include an electron transport layer (ETL) and/or an electron injection layer (EIL). In one or more embodiments, the first functional layer 321 and the second functional layer 323 may entirely overlap the first pixel area PA1 and the first connection area CA1.

The opposite electrode 330 may be arranged on the pixel electrode 310, the intermediate layer 320, and the pixel-defining layer 340. The opposite electrode 330 may include a conductive material having a low work function. For example, the opposite electrode 330 may include a (semi-)transparent layer including Ag, Mg, Al, Pt, Pd, Au, Ni, Nd, Ir, Cr, lithium (Li), calcium (Ca), or an alloy thereof. Alternatively, the opposite electrode 330 may further include a layer, such as ITO, IZO, ZnO or $In_2O_3$ on the (semi-)transparent layer including the above-described materials.

The protrusion tip PT may be a component for enhancing the reliability of the display apparatus 1. At least one of the first functional layer 321 and the second functional layer 323 may include an organic material, and external oxygen or moisture may be introduced into the display element DPE through at least one of the first functional layer 321 and the second functional layer 323. Oxygen or moisture may damage the display element DPE. The second inorganic layer PVX2 has the protrusion tip PT protruding toward the center of the hole HL, and thus, the first functional layer 321 and the second functional layer 323 may each be disconnected due to the hole HL. Thus, introduction of moisture or oxygen into the display element DPE from the outside may be prevented or reduced. Thus, the reliability of the display apparatus 1 may be enhanced.

In one or more embodiments, at least one of a first functional layer pattern 321P including the same material as a material of the first functional layer 321, and a second functional layer pattern 323P including the same material as a material of the second functional layer 323, may be located in the hole HL. In one or more embodiments, an opposite electrode pattern 330P including the same material as a material of the opposite electrode 330 may be arranged on the first functional layer pattern 321P and/or the second functional layer pattern 323P.

The encapsulation layer 400 may be arranged on the display element layer 300. The encapsulation layer 400 may continuously and entirely overlap the first pixel area PA1 and the first connection area CA1. The encapsulation layer 400 may be in direct contact with the lower surface of the protrusion tip PT of the second inorganic layer PVX2. Thus, introduction of moisture or oxygen into the display element DPE from the outside may be prevented or reduced.

In some embodiments, an organic encapsulation layer may be located on the encapsulation layer 400 to overlap the display element DPE. In addition, an additional inorganic encapsulation layer may be arranged on the organic encapsulation layer.

As described above, a plurality of pixels may be arranged in the first pixel area PA1 of the display apparatus 1, and each of the plurality of pixels may include a plurality of sub-pixels that may emit green light, red light, or blue light. The plurality of sub-pixels may be defined by various components arranged on the substrate 100. That is, as shown in FIG. 5, the pixel electrode 310 may be located on the pixel circuit layer 200, and the pixel-defining layer 340 may be located on the pixel electrode 310. The pixel-defining layer 340 may have (e.g., define) an opening 3400P for exposing the central part of the pixel electrode 310 to cover edges of the pixel electrode 310. Each of the sub-pixels may correspond to the opening 3400P of the pixel-defining layer 340. In other words, a stacked structure of the pixel electrode 310, the intermediate layer 320, and the opposite electrode 330 that are sequentially stacked may constitute the display element DPE. The display element DPE may emit green light, red light, or blue light. The emission area EA of one display element DPE may correspond to one sub-pixel. Because the opening 3400P of the pixel-defining layer 340 defines the size and the width of the emission area EA, the area and the length of each of the sub-pixels may depend on the opening 3400P of the pixel-defining layer 340. Whether or not the sub-pixels emit light may be controlled by the pixel circuit PC electrically connected to the display element DPE corresponding to each of the sub-pixels.

Each of the plurality of sub-pixels of each pixel may emit light having different respective colors. For example, one pixel may include a sub-pixel that emits first color light, a sub-pixel that emits second color light, and a sub-pixel that emits third color light. For example, the first color light may be green light, the second color light may be red light, and the third color light may be blue light. As described above, the display element DPE may include a light-emitting layer 322 that may emit green light, red light, or blue light. Thus, the light emitted by the sub-pixels according to the light emitted by the light-emitting layer 322 included in the display element DPE corresponding to the sub-pixel may be changed. That is, the display element DPE corresponding to one sub-pixel of the plurality of sub-pixels included in each pixel may include the light-emitting layer 322 that may emit first color light. The display element DPE corresponding to another sub-pixel of the plurality of sub-pixels included in each pixel may include the light-emitting layer 322 that may emit second color light. The display element DPE corresponding to another sub-pixel of the plurality of sub-pixels included in each pixel may include the light-emitting layer 322 that may emit third color light.

The above description of the first pixel area PA1 with reference to FIG. 5 may be applied to the second pixel area PA2, the third pixel area PA3, and the fourth pixel area PA4, and the content described above with respect to the first connection area CA1 with reference to FIG. 5 may be applied to the second connection area CA2, the third connection area CA3, and the fourth connection area CA4, and thus, redundant contents thereof are omitted. The above description of the sub-pixel arranged in the first pixel area PA1 with reference to FIG. 5 may be applied to the sub-pixel arranged in the second pixel area PA2, the sub-pixel arranged in the third pixel area PA3, and the sub-pixel arranged in the fourth pixel area PA4 and thus, redundant contents thereof are omitted.

Figure 6:
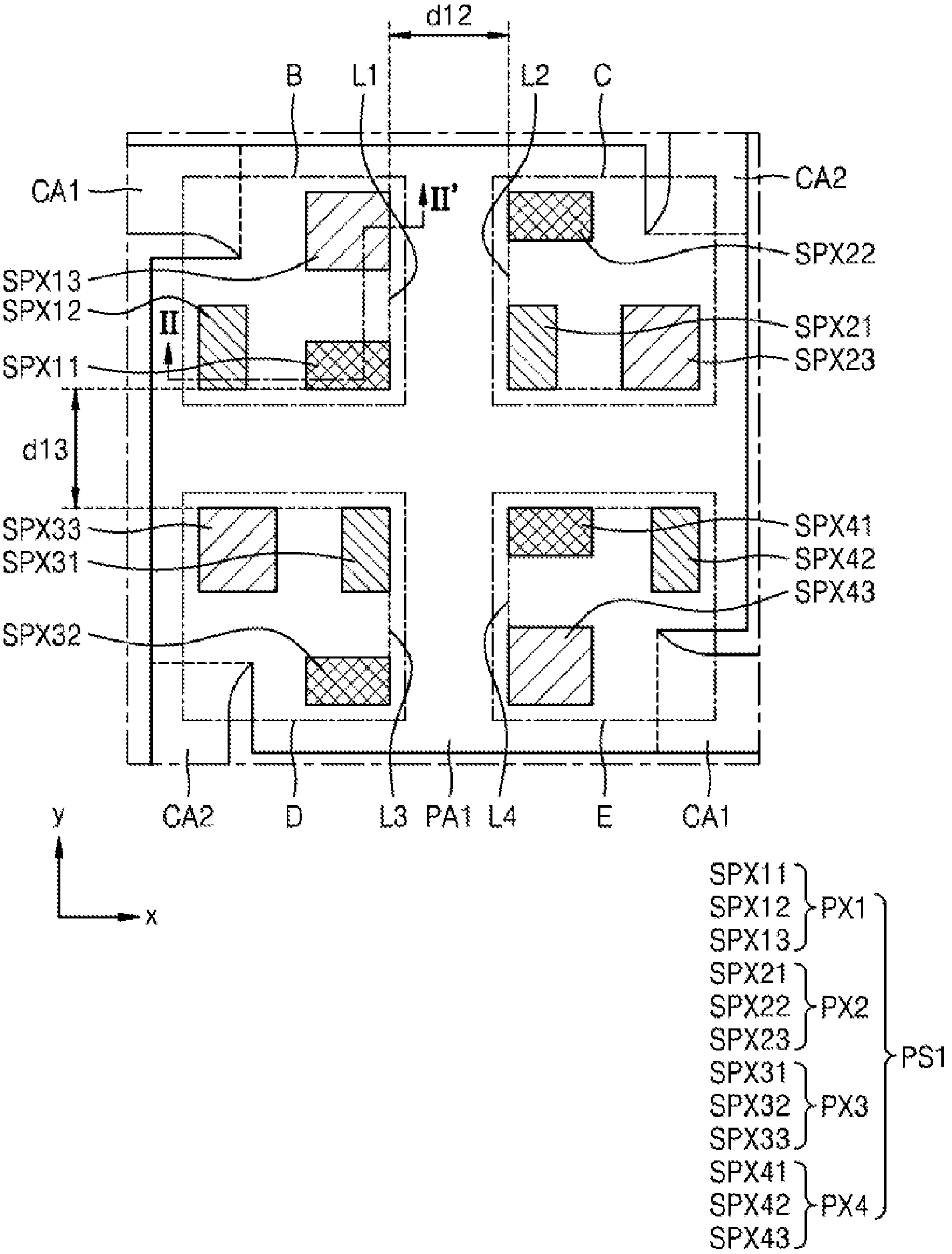
FIG. 6 is a conceptual view schematically illustrating the arrangement of pixels of a display apparatus according to one or more embodiments.
Figure 7:
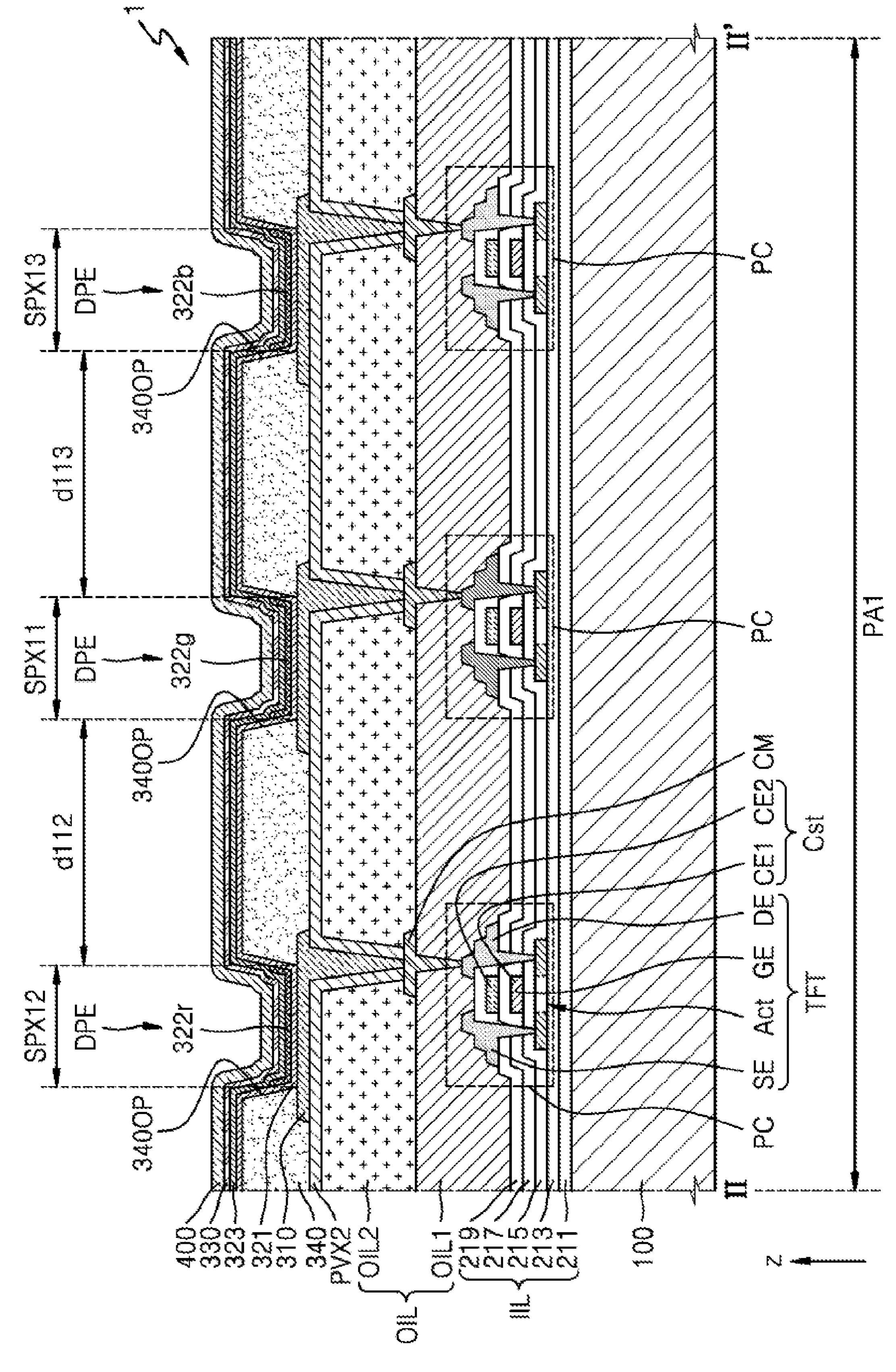
FIG. 7 is a cross-sectional view schematically illustrating the display apparatus taken along the line II-II' of FIG. 6.
Figure 8:
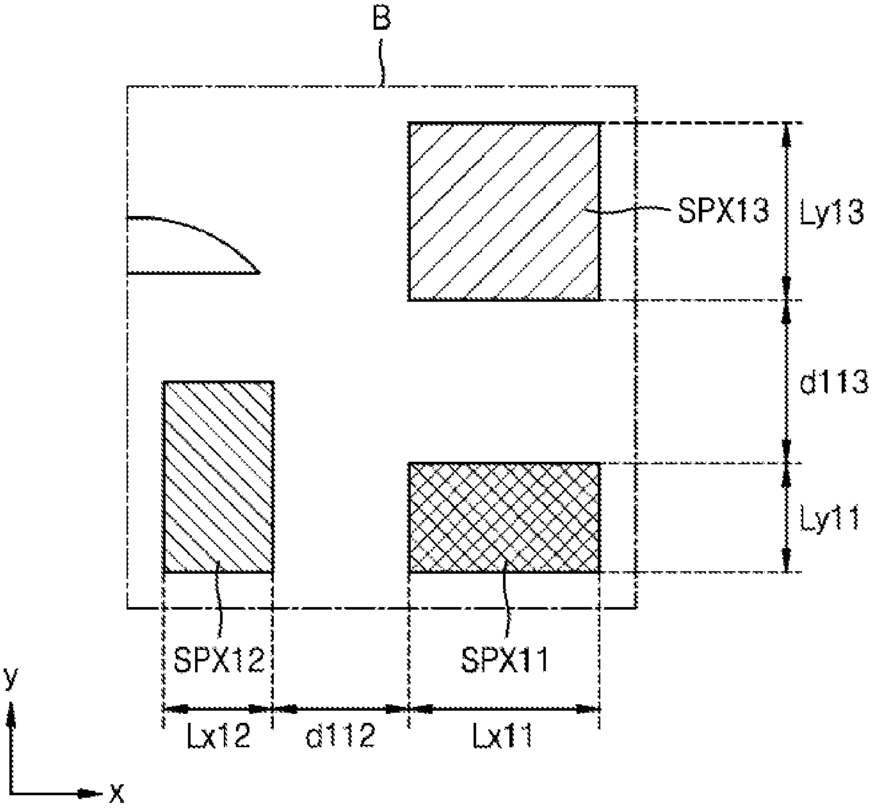
FIG. 8 is an enlarged view schematically illustrating a portion B of the display apparatus shown in FIG. 6.
Figure 9:
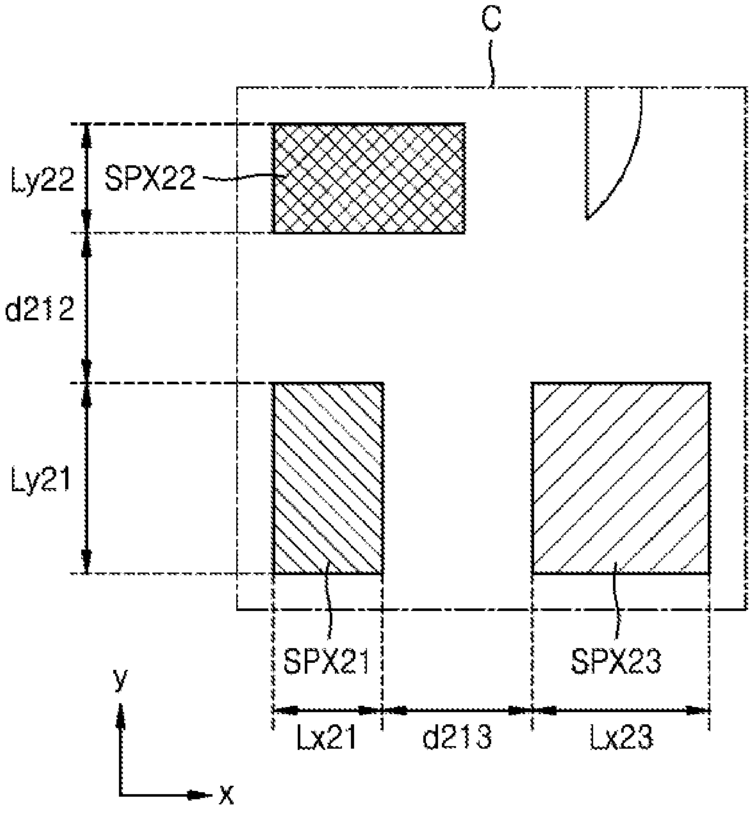
FIG. 9 is an enlarged view schematically illustrating a portion C of the display apparatus shown in FIG. 6.
Figure 10:
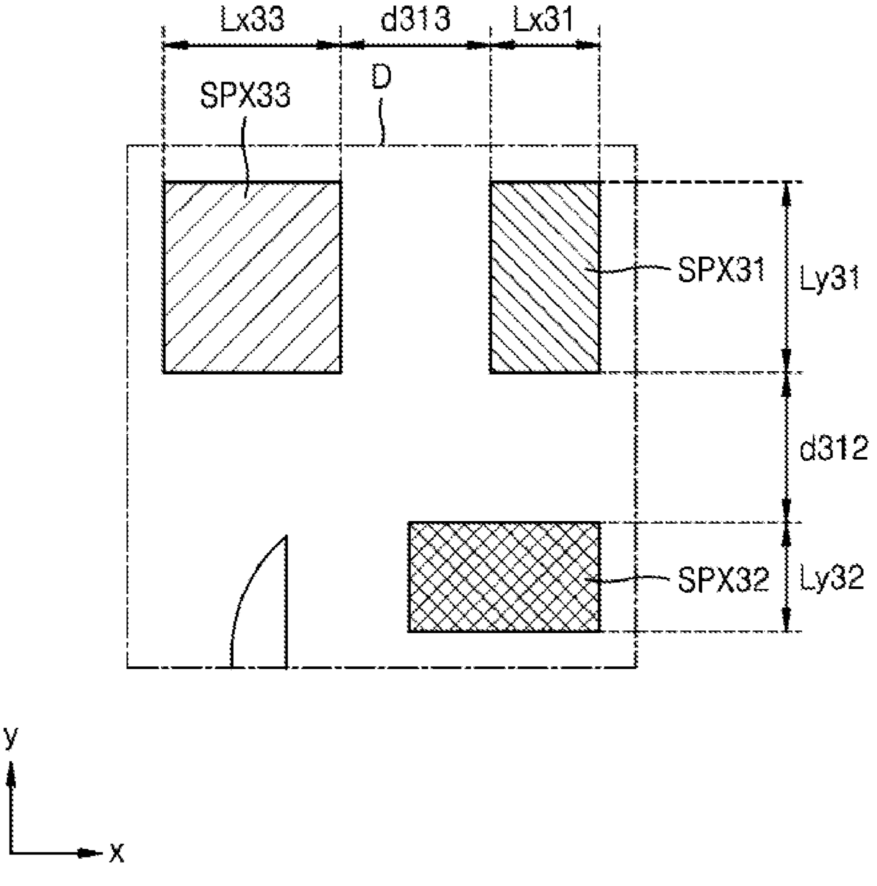
FIG. 10 is an enlarged view schematically illustrating a portion D of the display apparatus shown in FIG. 6.
Figure 11:
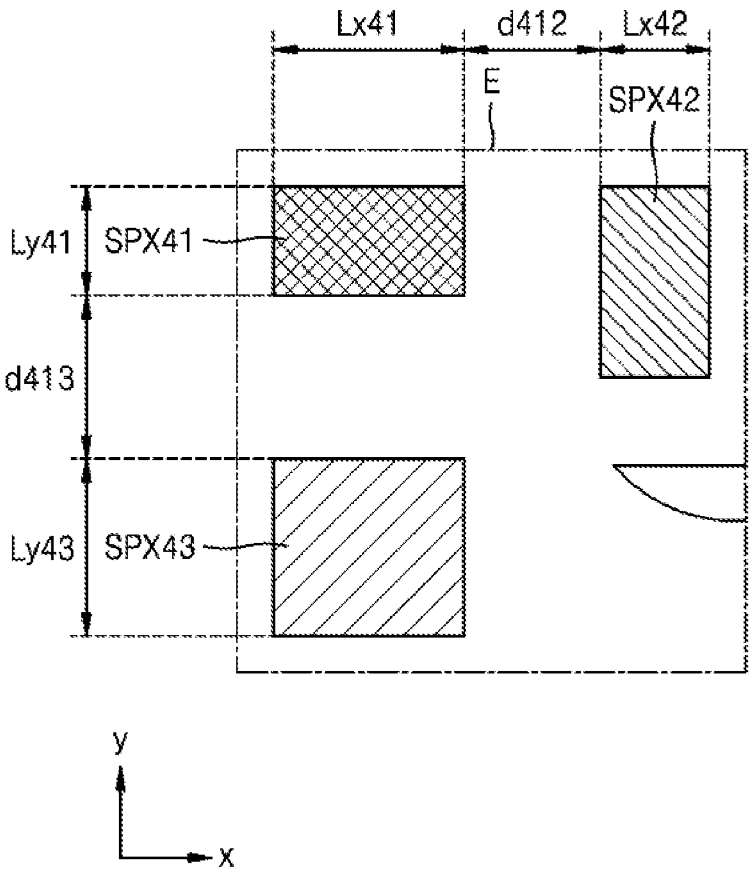
FIG. 11 is an enlarged view schematically illustrating a portion E of the display apparatus shown in FIG. 6.

FIG. 6 is a conceptual view schematically illustrating the arrangement of pixels of the display apparatus 1 according to one or more embodiments. For example, FIG. 6 schematically illustrates the arrangement of pixels arranged in the first pixel areas PA1 of the display apparatus 1 of FIG. 1A. FIG. 7 is a cross-sectional view schematically illustrating the display apparatus 1 taken along the line II-II' of FIG. 6. FIG. 8 is an enlarged view schematically illustrating a portion B of the display apparatus 1 shown in FIG. 6. FIG. 9 is an enlarged view schematically illustrating a portion C of the display apparatus 1 shown in FIG. 6. FIG. 10 is an enlarged view schematically illustrating a portion D of the display apparatus 1 shown in FIG. 6. FIG. 11 is an enlarged view schematically illustrating a portion E of the display apparatus 1 shown in FIG. 6.

Referring to FIG. 6, a plurality of pixels may be arranged in the first pixel area PA1. For example, a first pixel set PS1 including a plurality of pixels may be arranged in the first pixel area PA1. Because a plurality of pixels, as opposed to a single pixel, are arranged in the first pixel area PA1, more pixels may be arranged in a unit area. That is, the space utilization of the display apparatus 1 may be increased. FIG. 6 illustrates that one first pixel set PS1 includes four pixels, but embodiments are not limited thereto. The number of pixels corresponding to the square of the natural number may be provided in the first pixel set PS1. Hereinafter, for convenience, the case where four pixels are provided in the first pixel set PS1, will be described.

The first pixel set PS1 may include a first pixel PX1, a second pixel PX2, a third pixel PX3, and a fourth pixel PX4. The first pixel PX1 and the second pixel PX2 may be spaced apart from each other in a first direction (e.g., an +x direction or an −x direction). The third pixel PX3 may be spaced apart from the first pixel PX1 in a second direction (e.g., a +y direction or a −y direction), and the fourth pixel PX4 may be spaced apart from the second pixel PX2 in the second direction (e.g., a +y direction or a −y direction). That is, the third pixel PX3 and the fourth pixel PX4 may be spaced apart from each other in the first direction (e.g., an +x direction or an −x direction).

Each of the plurality of pixels may include a plurality of sub-pixels that emit light having different respective colors. For example, the first pixel PX1 may include a (1-1)-th sub-pixel SPX11, a (1-2)-th sub-pixel SPX12, and a (1-3)-th sub-pixel SPX13. Each of the (1-1)-th sub-pixel SPX11, the (1-2)-th sub-pixel SPX12, and the (1-3)-th sub-pixel SPX13 may emit light having different respective colors. The second pixel PX2 may include a (2-1)-th sub-pixel SPX21, a (2-2)-th sub-pixel SPX22, and a (2-3)-th sub-pixel SPX23. Each of the (2-1)-th sub-pixel SPX21, the (2-2)-th sub-pixel SPX22, and the (2-3)-th sub-pixel SPX23 may emit light having different respective colors. The third pixel PX3 may include a (3-1)-th sub-pixel SPX31, a (3-2)-th sub-pixel SPX32, and a (3-3)-th sub-pixel SPX33. Each of the (3-1)-th sub-pixel SPX31, the (3-2)-th sub-pixel SPX32, and the (3-3)-th sub-pixel SPX33 may emit light having different respective colors. The fourth pixel PX4 may include a (4-1)-th sub-pixel SPX41, a (4-2)-th sub-pixel SPX42, and a (4-3)-th sub-pixel SPX43. Each of the (4-1)-th sub-pixel SPX41, the (4-2)-th sub-pixel SPX42, and the (4-3)-th sub-pixel SPX43 may emit light having different respective colors.

As described above, a length Lx1 of the first pixel area PA1 in the first direction (e.g., an +x direction or an −x direction) and a length Ly1 of the first pixel area PA1 in the second direction (e.g., a +y direction or a −y direction) may be substantially the same. The first pixel area PA1 may include indented portions IP, and the first pixel area PA1 may have a rectangular shape in which rectangular corners are indented toward the center of the rectangle. Four pixels each including a plurality of sub-pixels may be arranged in the first pixel area PA1. Thus, a virtual line(s) for connecting one side of one sub-pixel included in one pixel, one side of another sub-pixel included in the pixel, and one side of yet another sub-pixel included in the pixel may have an L-shape. Alternatively, a virtual line(s) for connecting one side of one sub-pixel included in one pixel, one side of another sub-pixel included in the pixel, and one side of yet another sub-pixel included in the pixel may have an L-shape rotated clockwise or counterclockwise.

In the present specification, an “L-shape” may refer to a shape in which an extending portion in the first direction (e.g., an +x direction or an −x direction) and an extending portion in the second direction (e.g., a +y direction or a −y direction) have approximately the same length, and one end of the extending portion in the first direction (e.g., an +x direction or an −x direction) and one end of the extending portion in the second direction (e.g., a +y direction or a −y direction) are folded with respect to each other. Thus, the L-shape may have one corner and two ends. The one corner may be formed when one end of the extending portion in the first direction (e.g., an +x direction or an −x direction) and one end of the extending portion in the second direction (e.g., a +y direction or a −y direction) meet, or are folded with respect to each other. Both ends may refer to the other end of the extending portion in the first direction (e.g., an +x direction or an −x direction) and the other end of the extending portion in the second direction (e.g., a +y direction or a −y direction), with the exception of the ends forming a corner. In the present specification, a “rotated L-shape” may refer to an L-shape rotated clockwise or counterclockwise. In the present specification, a “shape similar to the L-shape” may refer to an L-shape, a rotated L-shape, a mirrored L-shape, or a flipped L-shape.

For example, the (1-1)-th sub-pixel SPX11 and the (1-2)-th sub-pixel SPX12 may be spaced apart from each other in the first direction (e.g., an +x direction or an −x direction). That is, the (1-2)-th sub-pixel SPX12 may be spaced apart from the (1-1)-th sub-pixel SPX11 in the first direction (e.g., an +x direction or an −x direction). The (1-1)-th sub-pixel SPX11 and the (1-3)-th sub-pixel SPX13 may be spaced apart from each other in the second direction (e.g., an +y direction or an −y direction). That is, the (1-3)-th sub-pixel SPX13 may be spaced apart from the (1-1)-th sub-pixel SPX11 in the second direction (e.g., a +y direction or a −y direction). Thus, as shown in FIG. 6, a virtual first line L1 for connecting one side of the (1-2)-th sub-pixel SPX12, one side of the (1-1)-th sub-pixel SPX11, and one side of the (1-3)-th sub-pixel SPX13 may be an L-shape rotated at 90 degrees counterclockwise.

Likewise, the (2-1)-th sub-pixel SPX21 and the (2-2)-th sub-pixel SPX22 may be spaced apart from each other in the second direction (e.g., an +y direction or an −y direction). That is, the (2-2)-th sub-pixel SPX22 may be spaced apart from the (2-1)-th sub-pixel SPX21 in the second direction (e.g., an +y direction or an −y direction). The (2-1)-th sub-pixel SPX21 and the (2-3)-th sub-pixel SPX23 may be spaced apart from each other in the first direction (e.g., an +x direction or an −x direction). That is, the (2-3)-th sub-pixel SPX23 may be spaced apart from the (2-1)-th sub-pixel SPX21 in the first direction (e.g., a +x direction or a −x direction). Thus, as shown in FIG. 6, a virtual second line L2 for connecting one side of the (2-2)-th sub-pixel SPX22, one side of the (2-1)-th sub-pixel SPX21, and one side of the (2-3)-th sub-pixel SPX23 may be an L-shape.

Likewise, the (3-1)-th sub-pixel SPX31 and the (3-2)-th sub-pixel SPX32 may be spaced apart from each other in the first direction (e.g., an +x direction or an −x direction). That is, the (3-2)-th sub-pixel SPX32 may be spaced apart from the (3-1)-th sub-pixel SPX31 in the first direction (e.g., an +x direction or an −x direction). The (3-1)-th sub-pixel SPX31 and the (3-3)-th sub-pixel SPX33 may be spaced apart from each other in the second direction (e.g., an +y direction or an −y direction). That is, the (3-3)-th sub-pixel SPX33 may be spaced apart from the (3-1)-th sub-pixel SPX31 in the second direction (e.g., a +y direction or a −y direction). Thus, as shown in FIG. 6, a virtual third line L3 for connecting one side of the (3-2)-th sub-pixel SPX32, one side of the (3-1)-th sub-pixel SPX31, and one side of the (3-3)-th sub-pixel SPX33 may be an L-shape rotated 180 degrees.

Likewise, the (4-1)-th sub-pixel SPX41 and the (4-2)-th sub-pixel SPX42 may be spaced apart from each other in the first direction (e.g., an +x direction or an −x direction). That is, the (4-2)-th sub-pixel SPX42 may be spaced apart from the (4-1)-th sub-pixel SPX41 in the first direction (e.g., an +x direction or an −x direction). The (4-1)-th sub-pixel SPX41 and the (4-3)-th sub-pixel SPX43 may be spaced apart from each other in the second direction (e.g., an +y direction or an −y direction). That is, the (4-3)-th sub-pixel SPX43 may be spaced apart from the (4-1)-th sub-pixel SPX41 in the second direction (e.g., a +y direction or a −y direction). Thus, as shown in FIG. 6, a virtual fourth line L4 for connecting one side of the (4-2)-th sub-pixel SPX42, one side of the (4-1)-th sub-pixel SPX41, and one side of the (4-3)-th sub-pixel SPX43 may be an L-shape rotated at 90 degrees clockwise. In this case, the space utilization of the first pixel area PA1 may be efficient. That is, an area required to arrange the same number of pixels may be reduced.

In one or more embodiments, the sum of lengths in the first direction (e.g., an +x direction or an −x direction) of sub-pixels arranged to be spaced apart from each other in the first direction (e.g., an +x direction or an −x direction) among a plurality of sub-pixels included in one pixel, and the sum of lengths in the second direction (e.g., a +y direction or a −y direction) of sub-pixels arranged to be spaced apart from each other in the second direction (e.g., a +y direction or a −y direction) among the plurality of sub-pixels may be substantially the same.

In general, the sub-pixels may be arranged to be spaced apart from each other in consideration of the process error in the manufacturing process of the display apparatus 1 or the reliability of the display apparatus 1, so that minimum separation distances between the sub-pixels may be substantially the same. As described above, a virtual line for connecting one side of one sub-pixel included in one pixel, one side of another sub-pixel included in the pixel, and one side of another sub-pixel included in the pixel may have a similar shape to the L-shape, and lengths of the extending portion in the first direction (e.g., an +x direction or an −x direction) having a similar shape to the L-shape and the extending portion in the second direction (e.g., a +y direction or a −y direction) having a similar shape to the L-shape may be substantially the same. Thus, the sum of lengths in the first direction (e.g., an +x direction or an −x direction) of sub-pixels arranged to be spaced apart from each other in the first direction (e.g., an +x direction or an −x direction) among a plurality of sub-pixels included in one pixel and the sum of lengths in the second direction (e.g., a +y direction or a −y direction) of sub-pixels arranged to be spaced apart from each other in the second direction (e.g., a +y direction or a −y direction) among the plurality of sub-pixels may be substantially the same.

For example, as shown in FIG. 8, the (1-1)-th sub-pixel SPX11 and the (1-2)-th sub-pixel SPX12 may be arranged to be spaced apart from each other in the first direction (e.g., an +x direction or an −x direction), and the (1-1)-th sub-pixel SPX11 and the (1-3)-th sub-pixel SPX13 may be arranged to be spaced apart from each other in the second direction (e.g., a +y direction or a −y direction). A distance d112 between the (1-1)-th sub-pixel SPX11 and the (1-2)-th sub-pixel SPX12 in the first direction (e.g., an +x direction or an −x direction), and a distance d113 between the (1-1)-th sub-pixel SPX11 and the (1-3)-th sub-pixel SPX13 in the second direction (e.g., a +y direction or a −y direction), may be substantially the same. Thus, the sum of a length Lx11 of the (1-1)-th sub-pixel SPX11 in the first direction (e.g., an +x direction or an −x direction) and a length Lx12 of the (1-2)-th sub-pixel SPX12 in the first direction (e.g., an +x direction or an −x direction) may be substantially the same as the sum of a length Ly11 of the (1-1)-th sub-pixel SPX11 in the second direction (e.g., a +y direction or a −y direction) and a length Ly13 of the (1-3)-th sub-pixel SPX13 in the second direction (e.g., a +y direction or a −y direction).

Likewise, as shown in FIG. 9, the (2-1)-th sub-pixel SPX21 and the (2-2)-th sub-pixel SPX22 may be arranged to be spaced apart from each other in the second direction (e.g., a +y direction or a −y direction), and the (2-1)-th sub-pixel SPX21 and the (2-3)-th sub-pixel SPX23 may be arranged to be spaced apart from each other in the first direction (e.g., an +x direction or an −x direction). A distance d212 between the (2-1)-th sub-pixel SPX21 and the (2-2)-th sub-pixel SPX22 in the second direction (e.g., a +y direction or a −y direction), and a distance d213 between the (2-1)-th sub-pixel SPX21 and the (2-3)-th sub-pixel SPX23 in the first direction (e.g., an +x direction or an −x direction), may be substantially the same. Thus, the sum of a length Ly21 of the (2-1)-th sub-pixel SPX21 in the second direction (e.g., a +y direction or a −y direction) and a length Ly22 of the (2-2)-th sub-pixel SPX22 in the second direction (e.g., a +y direction or a −y direction) may be substantially the same as the sum of a length Lx21 of the (2-1)-th sub-pixel SPX21 in the first direction (e.g., an +x direction or an −x direction) and a length Lx23 of the (2-3)-th sub-pixel SPX23 in the first direction (e.g., an +x direction or an −x direction).

Likewise, as shown in FIG. 10, the (3-1)-th sub-pixel SPX31 and the (3-2)-th sub-pixel SPX32 may be arranged to be spaced apart from each other in the second direction (e.g., a +y direction or a −y direction), and the (3-1)-th sub-pixel SPX31 and the (3-3)-th sub-pixel SPX33 may be arranged to be spaced apart from each other in the first direction (e.g., an +x direction or an −x direction). A distance d312 between the (3-1)-th sub-pixel SPX31 and the (3-2)-th sub-pixel SPX32 in the second direction (e.g., a +y direction or a −y direction), and a distance d313 between the (3-1)-th sub-pixel SPX31 and the (3-3)-th sub-pixel SPX33 in the first direction (e.g., an +x direction or an −x direction), may be substantially the same. Thus, the sum of a length Ly31 of the (3-1)-th sub-pixel SPX31 in the second direction (e.g., a +y direction or a −y direction) and a length Ly32 of the (3-2)-th sub-pixel SPX32 in the second direction (e.g., a +y direction or a −y direction) may be substantially the same as the sum of a length Lx31 of the (3-1)-th sub-pixel SPX31 in the first direction (e.g., an +x direction or an −x direction) and a length Lx33 of the (3-3)-th sub-pixel SPX33 in the first direction (e.g., an +x direction or an −x direction).

Likewise, as shown in FIG. 11, the (4-1)-th sub-pixel SPX41 and the (4-2)-th sub-pixel SPX42 may be arranged to be spaced apart from each other in the first direction (e.g., an +x direction or an −x direction), and the (4-1)-th sub-pixel SPX41 and the (4-3)-th sub-pixel SPX43 may be arranged to be spaced apart from each other in the second direction (e.g., a +y direction or a −y direction). A distance d412 between the (4-1)-th sub-pixel SPX41 and the (4-2)-th sub-pixel SPX42 in the first direction (e.g., an +x direction or an −x direction), and a distance d413 between the (4-1)-th sub-pixel SPX41 and the (4-3)-th sub-pixel SPX43 in the second direction (e.g., a +y direction or a −y direction), may be substantially the same. Thus, the sum of a length Lx41 of the (4-1)-th sub-pixel SPX41 in the first direction (e.g., an +x direction or an −x direction) and a length Lx42 of the (4-2)-th sub-pixel SPX42 in the first direction (e.g., an +x direction or an −x direction) may be substantially the same as the sum of a length Ly41 of the (4-1)-th sub-pixel SPX41 in the second direction (e.g., a +y direction or a −y direction) and a length Ly43 of the (4-3)-th sub-pixel SPX43 in the second direction (e.g., a +y direction or a −y direction). In this case, the space utilization of the first pixel area PA1 may be efficient. That is, an area required to arrange the same number of pixels may be reduced.

Meanwhile, the width of the connection area CA and the shape of the indented portion IP connected to the connection area CA may be changed according to the elongation required for the display apparatus 1. A length in the second direction (e.g., a +y direction or a −y direction) of the (1-2)-th sub-pixel SPX12, a length in the first direction (e.g., an +x direction or an −x direction) of the (1-3)-th sub-pixel SPX13, a length in the first direction (e.g., an +x direction or an −x direction) of the (2-2)-th sub-pixel SPX22, a length in the second direction (e.g., a +y direction or a −y direction) of the (2-3)-th sub-pixel SPX23, a length in the first direction (e.g., an +x direction or an −x direction) of the (3-2)-th sub-pixel SPX32, a length in the second direction (e.g., a +y direction or a −y direction) of the (3-3)-th sub-pixel SPX33, a length in the second direction (e.g., a +y direction or a −y direction) of the (4-2)-th sub-pixel SPX42, and a length in the first direction (e.g., an +x direction or an −x direction) of the (4-3)-th sub-pixel SPX43 may vary according to the shape of the indented portions IP. For example, as the indented portions IP are more indented toward the center of the first pixel area PA1 from the edge of the first pixel area PA1, these lengths may be reduced.

A distance between pixels arranged adjacent to each other in the first pixel area PA1 may be substantially the same. The term "adjacently arranged" may refer to being arranged close to each other, and the term "being arranged adjacent to each other" may refer to being a closest arrangement (e.g., a closest feasible or suitable arrangement). Thus, a distance between adjacent pixels may represent the shortest distance.

For example, a distance between the first pixel PX1 and the second pixel PX2 may be substantially the same as a distance between the first pixel PX1 and the third pixel PX3. That is, a distance between the sub-pixel closest to the second pixel PX2 among the sub-pixels of the first pixel PX1 and the sub-pixel closest to the first pixel PX1 among the sub-pixels of the second pixel PX2 may be substantially the same as a distance between the sub-pixel closest to the third pixel PX3 among the sub-pixels of the first pixel PX1 and the sub-pixel closest to the first pixel PX1 among the sub-pixels of the third pixel PX3.

For example, as shown in FIG. 6, the sub-pixel closest to the second pixel PX2 among the sub-pixels of the first pixel PX1 may be the (1-1)-th sub-pixel SPX11, and the sub-pixel closest to the first pixel PX1 among the sub-pixels of the second pixel PX2 may be the (2-1)-th sub-pixel SPX21. The sub-pixel closest to the third pixel PX3 among the sub-pixels of the first pixel PX1 may be the (1-1)-th sub-pixel SPX11, and the sub-pixel closest to the first pixel PX1 among the sub-pixels of the third pixel PX3 may be the (3-1)-th sub-pixel SPX31. A first distance d12 between the (1-1)-th sub-pixel SPX11 and the (2-1)-th sub-pixel SPX21 may be substantially the same as a second distance d13 between the (1-1)-th sub-pixel SPX11 and the (3-1)-th sub-pixel SPX31.

Further, a distance between the second pixel PX2 and the fourth pixel PX4 and a distance between the third pixel PX3 and the fourth pixel PX4 may be substantially the same as a distance between the first pixel PX1 and the third pixel PX3. That is, a distance between the (2-1)-th sub-pixel SPX21 and the (4-1)-th sub-pixel SPX41 may be substantially the same as the first distance d12, and a distance between the (3-1)-th sub-pixel SPX31 and the (4-1)-th sub-pixel SPX41 may be substantially the same as the first distance d12. In this case, a plurality of pixels in the first pixel area PA1 may be uniformly arranged in the first pixel area PA1.

The (1-1)-th sub-pixel SPX11 may emit first color light, the (1-2)-th sub-pixel SPX12 may emit second color light, and the (1-3)-th sub-pixel SPX13 may emit third color light. To this end, as shown in FIG. 7, the display element DPE corresponding to the (1-1)-th sub-pixel SPX11 that may emit first color light may include a green light-emitting layer 322*g*, which may emit green light, as the light-emitting layer 322. Likewise, the display element DPE corresponding to the (1-2)-th sub-pixel SPX12 that may emit second color light may include a red light-emitting layer 322*r*, which may emit red light, as the light-emitting layer 322. The display element DPE corresponding to the (1-3)-th sub-pixel SPX13 that may emit third color light may include a blue light-emitting layer 322*b*, which may emit blue light, as the light-emitting layer 322.

That is, the light-emitting layer 322 described above with reference to FIG. 5 may be the green light-emitting layer 322*g*, the red light-emitting layer 322*r*, or the blue light-emitting layer 322*b*, and whether the light-emitting layer 322 included in the display element DPE is one of the green light-emitting layer 322*g*, the red light-emitting layer 322*r*, or the blue light-emitting layer 322*b*, may vary according to light that may be emitted by the sub-pixel corresponding to the display element DPE. For example, when the display element DPE corresponds to the sub-pixel that may emit first color light, the display element DPE may include the green light-emitting layer 322*g* as the light-emitting layer 322. Likewise, when the display element DPE corresponds to the sub-pixel that may emit second color light, the display element DPE may include the red light-emitting layer 322*r* as the light-emitting layer 322. When the display element DPE corresponds to the sub-pixel that may emit third color light, the display element DPE may include the blue light-emitting layer 322*b* as the light-emitting layer 322.

Thus, in the present specification, the sub-pixel "that may emit first color light" may refer to the sub-pixel corresponding to the display element DPE including the green light-emitting layer 322*g* as the light-emitting layer 322, and the sub-pixel "that may emit second color light" may refer to the sub-pixel corresponding to the display element DPE including the red light-emitting layer 322*r* as the light-emitting layer 322, and the sub-pixel "that may emit third color light" may refer to the sub-pixel corresponding to the display element DPE including the blue light-emitting layer 322*b* as the light-emitting layer 322.

The (2-1)-th sub-pixel SPX21 may emit second color light, and the (2-2)-th sub-pixel SPX22 may emit first color light, and the (2-3)-th sub-pixel SPX23 may emit third color light. To this end, in one or more embodiments, the display element DPE corresponding to the (2-2)-th sub-pixel SPX22 that may emit first color light may include the green light-emitting layer 322*g* as the light-emitting layer 322. The display element DPE corresponding to the (2-1)-th sub-pixel SPX21 that may emit second color light may include the red light-emitting layer 322*r* as the light-emitting layer 322, and the display element DPE corresponding to the (2-3)-th sub-pixel SPX23 that may emit third color light may include the blue light-emitting layer 322*b* as the light-emitting layer 322.

The (3-1)-th sub-pixel SPX31 may emit second color light, and the (3-2)-th sub-pixel SPX32 may emit first color light, and the (3-3)-th sub-pixel SPX33 may emit third color light. The display element DPE corresponding to the (3-2)-th sub-pixel SPX32 that may emit first color light may include the green light-emitting layer 322*g* as the light-emitting layer 322. The display element DPE corresponding to the (3-1)-th sub-pixel SPX31 that may emit second color light may include the red light-emitting layer 322*r* as the light-emitting layer 322, and the display element DPE corresponding to the (3-3)-th sub-pixel SPX33 that may emit third color light may include the blue light-emitting layer 322*b* as the light-emitting layer 322.

The (4-1)-th sub-pixel SPX41 may emit first color light, and the (4-2)-th sub-pixel SPX42 may emit second color light, and the (4-3)-th sub-pixel SPX43 may emit third color light. The display element DPE corresponding to the (4-1)-th sub-pixel SPX41 that may emit first color light may include the green light-emitting layer 322*g* as the light-emitting layer 322. The display element DPE corresponding to the (4-2)-th sub-pixel SPX42 that may emit second color light may include the red light-emitting layer 322*r* as the light-emitting layer 322, and the display element DPE corresponding to the (4-3)-th sub-pixel SPX43 that may emit third color light may include the blue light-emitting layer 322*b* as the light-emitting layer 322.

In one or more embodiments, two sub-pixels among three sub-pixels included in one pixel may have the same area and may have areas that are different from the area of the other one sub-pixel. For example, the area of the sub-pixel that may emit first color light, and the area of the sub-pixel that may emit second color light, may be substantially the same, and the area of the sub-pixel that may emit third color light may be greater than the area of the sub-pixel that may emit first color light. This is because, when the areas of the sub-pixels are substantially the same, the light-emitting efficiency of the blue light-emitting layer 322*b* that may emit third color light is lower than the light-emitting efficiency of the green light-emitting layer 322*g* that may emit first color light and lower than the light-emitting efficiency of the red light-emitting layer 322*r* that may emit second color light.

For example, the area of the (1-1)-th sub-pixel SPX11 may be substantially the same as the area of the (1-2)-th sub-pixel SPX12, and may be different from the area of the (1-3)-th sub-pixel SPX13. For example, the area of the (1-3)-th sub-pixel SPX13 may be greater than the area of the (1-1)-th sub-pixel SPX11. Likewise, the area of the (2-1)-th sub-pixel SPX21 may be substantially the same as the area of the (2-2)-th sub-pixel SPX22, and may be different from the area of the (2-3)-th sub-pixel SPX23. For example, the area of the (2-3)-th sub-pixel SPX23 may be greater than the area of the (2-1)-th sub-pixel SPX21.

Likewise, the area of the (3-1)-th sub-pixel SPX31 may be substantially the same as the area of the (3-2)-th sub-pixel SPX32, and may be different from the area of the (3-3)-th sub-pixel SPX33. For example, the area of the (3-3)-th sub-pixel SPX33 may be greater than the area of the (3-1)-th sub-pixel SPX31. Likewise, the area of the (4-1)-th sub-pixel SPX41 may be substantially the same as the area of the (4-2)-th sub-pixel SPX42, and may be different from the area of the (4-3)-th sub-pixel SPX43. For example, the area of the (4-3)-th sub-pixel SPX43 may be greater than the area of the (4-1)-th sub-pixel SPX41.

In one or more embodiments, two sub-pixels having the same area among three sub-pixels included in one pixel may be spaced apart from each other in the first direction (e.g., an +x direction or an −x direction) or in the second direction (e.g., a +y direction or a −y direction). The areas of two sub-pixels (among the three sub-pixels included in one pixel) may be the same, and the area of the other one sub-pixel may be different from the respective areas of the two sub-pixels. In this case, the other one sub-pixel having a different area may be arranged to be spaced apart from one of the two sub-pixels having the same area in a direction perpendicular to a direction in which two sub-pixels having the same area are spaced apart from each other.

As described above, a virtual line for connecting one side of one sub-pixel included in one pixel, one side of another sub-pixel included in the pixel, and one side of another sub-pixel included in the pixel, may have an L-shape or a rotated L-shape. Thus, sub-pixels arranged at both ends of the L-shape or the rotated L-shape may have different areas. In other words, a sub-pixel having a different area from the areas of other sub-pixels among three sub-pixels included in one pixel may not be arranged at the L-shaped corner or at the rotated L-shaped corner. In other words, one sub-pixel among two sub-pixels having the same area may be arranged at the L-shaped corner or at the rotated L-shaped corner.

For example, when the area of the (1-1)-th sub-pixel SPX11 and the area of the (1-2)-th sub-pixel SPX12 are substantially the same, and the area of the (1-3)-th sub-pixel SPX13 is greater than the area of the (1-1)-th sub-pixel SPX11, the (1-1)-th sub-pixel SPX11 and the (1-2)-th sub-pixel SPX12 may be spaced apart from each other in the first direction (e.g., an +x direction or an −x direction). The (1-3)-th sub-pixel SPX13 may be spaced apart from the (1-1)-th sub-pixel SPX11 in the second direction (e.g., a +y direction or a −y direction) that is perpendicular to the direction in which the (1-1)-th sub-pixel SPX11 and the (1-2)-th sub-pixel SPX12 are spaced apart from each other. Thus, the (1-1)-th sub-pixel SPX11 may be arranged at the L-shaped corner or at the rotated L-shaped corner, and the (1-3)-th sub-pixel SPX13 may not be arranged at the L-shaped corner or at the rotated L-shaped corner.

For example, when the area of the (2-1)-th sub-pixel SPX21 and the area of the (2-2)-th sub-pixel SPX22 are substantially the same, and the area of the (2-3)-th sub-pixel SPX23 is greater than the area of the (2-1)-th sub-pixel SPX21, the (2-1)-th sub-pixel SPX21 and the (2-2)-th sub-pixel SPX22 may be spaced apart from each other in the second direction (e.g., a +y direction or a −y direction). The (2-3)-th sub-pixel SPX23 may be spaced apart from the (2-1)-th sub-pixel SPX21 in the first direction (e.g., an +x direction or an −x direction) that is perpendicular to the direction in which the (2-1)-th sub-pixel SPX21 and the (2-2)-th sub-pixel SPX22 are spaced apart from each other. Thus, the (2-1)-th sub-pixel SPX21 may be arranged at the L-shaped corner or at the rotated L-shaped corner, and the (2-3)-th sub-pixel SPX23 may not be arranged at the L-shaped corner or at the rotated L-shaped corner.

For example, when the area of the (3-1)-th sub-pixel SPX31 and the area of the (3-2)-th sub-pixel SPX32 are substantially the same, and the area of the (3-3)-th sub-pixel SPX33 is greater than the area of the (3-1)-th sub-pixel SPX31, the (3-1)-th sub-pixel SPX31 and the (3-2)-th sub-pixel SPX32 may be spaced apart from each other in the second direction (e.g., a +y direction or a −y direction). The (3-3)-th sub-pixel SPX33 may be spaced apart from the (3-1)-th sub-pixel SPX31 in the first direction (e.g., an +x direction or an −x direction) that is perpendicular to the direction in which the (3-1)-th sub-pixel SPX31 and the (3-2)-th sub-pixel SPX32 are spaced apart from each other. Thus, the (3-1)-th sub-pixel SPX31 may be arranged at the L-shaped corner or at the rotated L-shaped corner, and the (3-3)-th sub-pixel SPX33 may not be arranged at the L-shaped corner or at the rotated L-shaped corner.

For example, when the area of the (4-1)-th sub-pixel SPX41 and the area of the (4-2)-th sub-pixel SPX42 are substantially the same, and the area of the (4-3)-th sub-pixel SPX43 is greater than the area of the (4-1)-th sub-pixel SPX41, the (4-1)-th sub-pixel SPX41 and the (4-2)-th sub-pixel SPX42 may be spaced apart from each other in the first direction (e.g., an +x direction or an −x direction). The (4-3)-th sub-pixel SPX43 may be spaced apart from the (4-1)-th sub-pixel SPX41 in the second direction (e.g., a +y direction or a −y direction) that is perpendicular to the direction in which the (4-1)-th sub-pixel SPX41 and the (4-2)-th sub-pixel SPX42 are spaced apart from each other. Thus, the (4-1)-th sub-pixel SPX41 may be arranged at the L-shaped corner or at the rotated L-shaped corner, and the (4-3)-th sub-pixel SPX43 may not be arranged at the L-shaped corner or at the rotated L-shaped corner. In this case, the areas of the sub-pixels that emit light of the same color may be substantially the same. That is, the aperture ratios of the sub-pixels that emit light of the same color may be substantially the same.

Hereinafter, embodiments will be described in more detail. However, the following embodiments are provided to describe the present disclosure more specifically, and the scope of the present disclosure is not limited by the following embodiments. The following embodiments may be modified and modified as appropriate by one of ordinary skill in the art within the scope of the present disclosure.

Tables 1 and 2 show the aperture ratios of sub-pixels of two pixels adjacent to each other included in the display apparatus 1 according to embodiments. For example, Table 1 shows the aperture ratios of sub-pixels adjacent to each other according to Embodiment 1, and Table 2 shows the aperture ratios of sub-pixels adjacent to each other according to Embodiment 2.

Two pixels of Table 1 that are adjacent to each other may correspond to the first pixel PX1 and the second pixel PX2 included in the display apparatus 1. R represents sub-pixels that may emit red light, B represents sub-pixels that may emit blue light, and G represents sub-pixels that may emit green light. A length in the first direction represents a length in the first direction (e.g., an +x direction or an −x direction) of each of the sub-pixels, and a unit of the length in the first direction is μm. A length in the second direction represents a length in the second direction (e.g., a +y direction or a −y direction) of each of the sub-pixels, and a unit of the length in the second direction is μm.

The area represents the area of each of the sub-pixels, and the unit of the area is $\mu m^2$. That is, the area of each of the sub-pixels is a value obtained by multiplying the length in the first direction by the length in the second direction of each of the sub-pixels. When a difference between the areas of the sub-pixels is too small, such a difference is not visible, or is not observable/noticeable, to a user. Thus, the area of each sub-pixel was calculated up to a first point of the decimal point. The aperture ratio refers to a ratio of an area occupied by an opening corresponding to each of the sub-pixels within an area of a certain size. That is, the aperture ratio may be a relative area between the sub-pixels. When a difference between the aperture ratios of the sub-pixels is too small, such a difference is not visible/noticeable to the user. Thus, the aperture ratio of each sub-pixel was calculated up to a first point of the decimal point. The contents of Table 1, for example, the length in the first direction, the length in the second direction, the area and the aperture ratio, etc. are also applied to Table 2, and thus redundant descriptions are omitted.

TABLE 1

| | Pixel | | | | | |
|---|---|---|---|---|---|---|
| | First pixel | | | Second pixel | | |
| Sub-pixels | (1-2)-th sub-pixel (R) | (1-1)-th sub-pixel (G) | (1-3)-th sub-pixel (B) | (2-1)-th sub-pixel (R) | (2-2)-th sub-pixel (G) | (2-3)-th sub-pixel (B) |
| Length in first direction (μm) | 11.663 | 21.337 | 24.100 | 13.173 | 24.100 | 19.827 |
| Length in second direction (μm) | 24.100 | 13.173 | 19.827 | 21.337 | 11.663 | 24.100 |
| Area ($\mu m^2$) | 281.1 | 281.1 | 477.8 | 281.1 | 281.1 | 477.8 |
| Aperture ratio (%) | 11.8 | 11.8 | 20.1 | 11.8 | 11.8 | 20.1 |

Referring to Table 1, the sum of lengths in the first direction (e.g., an +x direction or an −x direction) of sub-pixels arranged to be spaced apart from each other in the first direction (e.g., an +x direction or an −x direction) among a plurality of sub-pixels included in one pixel according to Embodiment 1, and the sum of lengths in the second direction (e.g., a +y direction or a −y direction) of sub-pixels arranged to be spaced apart from each other in the second direction (e.g., a +y direction or a −y direction) among the plurality of sub-pixels may be substantially the same.

The length in the first direction of the (1-1)-th sub-pixel SPX11 may be 21.337 μm, and the length in the first direction of the (1-2)-th sub-pixel SPX12 may be 11.663 μm, and the sum of these lengths may be 33 μm. The length in the second direction of the (1-1)-th sub-pixel SPX11 may be 13.173 μm, and the length in the second direction of the (1-3)-th sub-pixel SPX13 may be 19.827 μm, and the sum of these lengths may be 33 μm. The length in the second direction of the (2-1)-th sub-pixel SPX21 may be 21.337 μm, and the length in the second direction of the (2-2)-th sub-pixel SPX22 may be 11.663 μm, and the sum of these lengths may be 33 μm. The length in the first direction of the (2-1)-th sub-pixel SPX21 may be 13.173 μm, and the length in the first direction of the (2-3)-th sub-pixel SPX23 may be 19.827 μm, and the sum of these lengths may be 33 μm.

Two sub-pixels among three sub-pixels included in one pixel according to Embodiment 1 may have the same area, and may have areas that are different from the area of the other one sub-pixel. For example, the area of the (1-1)-th sub-pixel SPX11 may be substantially the same as the area of the (1-2)-th sub-pixel SPX12, and may be different from the area of the (1-3)-th sub-pixel SPX13. The area of the (2-1)-th sub-pixel SPX21 may be substantially the same as the area of the (2-2)-th sub-pixel SPX22, and the area of the (2-3)-th sub-pixel SPX23 may be greater than the area of the (2-1)-th sub-pixel SPX21.

Two sub-pixels having the same area among three sub-pixels included in one pixel according to Embodiment 1 may be spaced apart from each other in the first direction (e.g., an +x direction or an −x direction) or in the second direction (e.g., a +y direction or a −y direction). The other one sub-pixel having a different area may be arranged to be spaced apart from one of the two sub-pixels having the same area in a direction perpendicular to a direction in which two sub-pixels having the same area are arranged to be spaced apart from each other. The (1-1)-th sub-pixel SPX11 and the (1-2)-th sub-pixel SPX12 may be spaced apart from each other in the first direction (e.g., an +x direction or an −x direction), and the (1-3)-th sub-pixel SPX13 may be spaced apart from the (1-1)-th sub-pixel SPX11 in the second direction (e.g., a +y direction or a −y direction). The (2-1)-th sub-pixel SPX21 and the (2-2)-th sub-pixel SPX22 may be spaced apart from each other in the second direction (e.g., a +y direction or a −y direction), and the (2-3)-th sub-pixel SPX23 may be spaced apart from the (2-1)-th sub-pixel SPX21 in the first direction (e.g., an +x direction or an −x direction).

In this case, the areas of the sub-pixels that emit light of the same color, and that are included in different pixels, may be substantially the same. For example, the area of the (1-1)-th sub-pixel SPX11 may be 281.1 $\mu m^2$, and the area of the (2-2)-th sub-pixel SPX22 may be 281.1 $\mu m^2$. The area of the (1-2)-th sub-pixel SPX12 may be 281.1 $\mu m^2$, and the area of the (2-1)-th sub-pixel SPX21 may be 281.1 $\mu m^2$. The area of the (1-3)-th sub-pixel SPX13 may be 477.8 $\mu m^2$, and the area of the (2-3)-th sub-pixel SPX23 may be 477.8 $\mu m^2$.

In other words, the aperture ratios of the sub-pixels that emit light of the same color, and that are included in different pixels, may be substantially the same. For example, the aperture ratio of the (1-1)-th sub-pixel SPX11 may be 11.8%, and the aperture ratio of the (2-2)-th sub-pixel SPX22 may be 11.8%. The aperture ratio of the (1-2)-th sub-pixel SPX12 may be 11.8%, and the aperture ratio of the (2-1)-th sub-pixel SPX21 may be 11.8%. The aperture ratio of the (1-3)-th sub-pixel SPX13 may be 20.1%, and the aperture ratio of the (2-3)-th sub-pixel SPX23 may be 20.1%. That is, the aperture ratios of the sub-pixels that emit light of the same color may be substantially the same.

As described above, the length in the second direction (e.g., a +y direction or a −y direction) of the (1-2)-th sub-pixel SPX12, the length in the first direction (e.g., an +x direction or an −x direction) of the (1-3)-th sub-pixel SPX13, the length in the first direction (e.g., an +x direction or an −x direction) of the (2-2)-th sub-pixel SPX22, and the length in the second direction (e.g., a +y direction or a −y direction) of the (2-3)-th sub-pixel SPX23 may vary according to the shape of the indented portions IP. In the case of Embodiment 1, the length in the second direction of the (1-2)-th sub-pixel SPX12 and the length in the first direction of the (1-3)-th sub-pixel SPX13 may be substantially the same at 24.100 μm, and the length in the first direction of the (2-2)-th sub-pixel SPX22 and the length in the second direction of the (2-3)-th sub-pixel SPX23 may be substantially the same at 24.100 μm. However, embodiments are not limited thereto. For example, the length in the second direction of the (1-2)-th sub-pixel SPX12 and the length in the first direction of the (1-3)-th sub-pixel may be different from each other, and the length in the first direction of the (2-2)-th sub-pixel SPX22 and the length in the second direction of the (2-3)-th sub-pixel SPX23 may be different from each other.

TABLE 2

| | Pixel | | | | | |
|---|---|---|---|---|---|---|
| | First pixel | | | Second pixel | | |
| Sub-pixels | (1-2)-th sub-pixel (R) | (1-1)-th sub-pixel (G) | (1-3)-th sub-pixel (B) | (2-1)-th sub-pixel (R) | (2-2)-th sub-pixel (G) | (2-3)-th sub-pixel (B) |
| Length in first direction (μm) | 12.776 | 20.224 | 25.015 | 13.898 | 22.000 | 19.102 |
| Length in second direction (μm) | 22.000 | 13.898 | 19.102 | 20.224 | 12.776 | 25.015 |
| Area ($\mu m^2$) | 281.1 | 281.1 | 477.8 | 281.1 | 281.1 | 477.8 |
| Aperture ratio (%) | 11.8 | 11.8 | 20.1 | 11.8 | 11.8 | 20.1 |

Because Embodiment 2 is similar to Embodiment 1, a difference between Embodiment 2 and Embodiment 1 will be described below. For example, two sub-pixels among three sub-pixels included in one pixel according to Embodiment 2 may have the same area, and may have areas that are different from the area of the other one sub-pixel. Two sub-pixels having the same area among three sub-pixels included in one pixel according to Embodiment 2 may be spaced apart from each other in the first direction (e.g., an +x direction or an −x direction) or in the second direction (e.g., a +y direction or a −y direction).

Referring to Table 2, the sum of lengths in the first direction (e.g., an +x direction or an −x direction) of sub-pixels arranged to be spaced apart from each other in the first direction (e.g., an +x direction or an −x direction) among a plurality of sub-pixels included in one pixel according to Embodiment 2 and the sum of lengths in the second direction (e.g., a +y direction or a −y direction) of sub-pixels arranged to be spaced apart from each other in the second direction (e.g., a +y direction or a −y direction) among the plurality of sub-pixels may be substantially the same. However, the length in the second direction of the (1-2)-th sub-pixel SPX12 and the length in the first direction of the (1-3)-th sub-pixel SPX13 may be different from each other, and the length in the first direction of the (2-2)-th sub-pixel SPX22 and the length in the second direction of the (2-3)-th sub-pixel SPX23 may be different from each other.

The length in the first direction of the (1-1)-th sub-pixel SPX11 may be 20.224 μm, and the length in the first direction of the (1-2)-th sub-pixel SPX12 may be 12.776 μm, and the sum of these lengths may be 33 μm. The length in the second direction of the (1-1)-th sub-pixel SPX11 may be 13.898 μm, and the length in the second direction of the (1-3)-th sub-pixel SPX13 may be 19.102 μm, and the sum of these lengths may be 33 μm. The length in the second direction of the (2-1)-th sub-pixel SPX21 may be 20.224 μm, and the length in the second direction of the (2-2)-th sub-pixel SPX22 may be 12.776 μm, and the sum of these lengths may be 33 μm. The length in the first direction of the (2-1)-th sub-pixel SPX21 may be 13.898 μm, and the length in the first direction of the (2-3)-th sub-pixel SPX23 may be 19.102 μm, and the sum of these lengths may be 33 μm. The length in the second direction of the (1-2)-th sub-pixel SPX12 may be 22.000 μm, and the length in the first direction of the (1-3)-th sub-pixel SPX13 may be 25.015 μm. The length in the first direction of the (2-2)-th sub-pixel SPX22 may be 22.000 μm, and the length in the second direction of the (2-3)-th sub-pixel SPX23 may be 25.015 μm.

Even in this case, the areas of the sub-pixels that emit light of the same color, and that are included in different pixels, may be substantially the same. For example, the area of the (1-1)-th sub-pixel SPX11 may be 281.1 $\mu m^2$, and the area of the (2-2)-th sub-pixel SPX22 may be 281.1 $\mu m^2$. The area of the (1-2)-th sub-pixel SPX12 may be 281.1 $\mu m^2$, and the area of the (2-1)-th sub-pixel SPX21 may be 281.1 $\mu m^2$. The area of the (1-3)-th sub-pixel SPX13 may be 477.8 $\mu m^2$, and the area of the (2-3)-th sub-pixel SPX23 may be 477.8 $\mu m^2$.

In other words, the aperture ratios of the sub-pixels that emit light of the same color, and that are included in different pixels, may be substantially the same. For example, the aperture ratio of the (1-1)-th sub-pixel SPX11 may be 11.8%, and the aperture ratio of the (2-2)-th sub-pixel SPX22 may be 11.8%. The aperture ratio of the (1-2)-th sub-pixel SPX12 may be 11.8%, and the aperture ratio of the (2-1)-th sub-pixel SPX21 may be 11.8%. The aperture ratio of the (1-3)-th sub-pixel SPX13 may be 20.1%, and the aperture ratio of the (2-3)-th sub-pixel SPX23 may be 20.1%. That is, aperture ratios of the sub-pixels that emit light of the same color may be substantially the same.

Tables 3 and 4 show aperture ratios of sub-pixels of two pixels adjacent to each other included in display apparatuses according to comparative examples. For example, Table 3 shows the aperture ratios of sub-pixels adjacent to each other according to Comparative Example 1, and Table 4 shows the aperture ratios of sub-pixels adjacent to each other according to Comparative Example 2. Because display apparatuses according to Comparative Example 1 and Comparative Example 2 are similar to the display apparatus 1 according to one or more embodiments described above with reference to FIGS. 6 through 11, Comparative Examples 1 and 2 will be described based on a difference between the display apparatuses according to Comparative Examples 1 and 2 and the display apparatus 1 according to one or more embodiments.

The contents of Table 1, for example, the length in the first direction, the length in the second direction, the area and the aperture ratio, etc. are also applied to Tables 3 and 4, and thus redundant descriptions are omitted.

TABLE 3

| | Pixel | | | | | |
|---|---|---|---|---|---|---|
| | First pixel | | | Second pixel | | |
| Sub-pixels | (1-2)-th sub-pixel (R) | (1-1)-th sub-pixel (G) | (1-3)-th sub-pixel (B) | (2-1)-th sub-pixel (R) | (2-2)-th sub-pixel (G) | (2-3)-th sub-pixel (B) |
| Length in first direction (μm) | 11.663 | 21.337 | 24.100 | 15.554 | 24.100 | 17.446 |
| Length in second direction (μm) | 24.100 | 16.862 | 16.138 | 18.071 | 14.929 | 24.100 |
| Area ($\mu m^2$) | 281.1 | 359.8 | 388.9 | 281.1 | 359.8 | 420.5 |
| Aperture ratio (%) | 11.8 | 15.1 | 16.3 | 11.8 | 15.1 | 17.7 |

A sub-pixel that may emit green light among three sub-pixels included in one pixel of Comparative Example 1, and a sub-pixel that may emit red light among the three sub-pixels, may be spaced apart from each other in the first direction (e.g., an +x direction or an −x direction) or in the second direction (e.g., a +y direction or a −y direction). The sub-pixel that may emit blue light may be spaced apart from one of the sub-pixel that may emit green light and the sub-pixel that may emit red light in a direction that is perpendicular to a direction in which the sub-pixel that may emit green light and the sub-pixel that may emit red light are spaced apart from each other. That is, the (1-1)-th sub-pixel and the (1-2)-th sub-pixel may be spaced apart from each other in the first direction (e.g., an +x direction or an −x direction), and the (1-3)-th sub-pixel may be spaced apart from the (1-1)-th sub-pixel in the second direction (e.g., a +y direction or a −y direction). The (2-1)-th sub-pixel and the (2-2)-th sub-pixel may be spaced apart from each other in the second direction (e.g., a +y direction or a −y direction), and the (2-3)-th sub-pixel may be spaced apart from the (2-1)-th sub-pixel in the first direction (e.g., an +x direction or an −x direction).

Referring to Table 3, the sum of lengths in the first direction (e.g., an +x direction or an −x direction) of sub-pixels arranged to be spaced apart from each other in the first direction (e.g., an +x direction or an −x direction) among a plurality of sub-pixels included in one pixel according to Comparative Example 1, and the sum of lengths in the second direction (e.g., a +y direction or a −y direction) of sub-pixels arranged to be spaced apart from each other in the second direction (e.g., a +y direction or a −y direction) among the plurality of sub-pixels, may be substantially the same.

The length in the first direction of the (1-1)-th sub-pixel may be 21.337 μm, and the length in the first direction of the (1-2)-th sub-pixel may be 11.663 μm, and the sum of these lengths may be 33 μm. The length in the second direction of the (1-1)-th sub-pixel may be 16.862 μm, and the length in the second direction of the (1-3)-th sub-pixel may be 16.138 μm, and the sum of these lengths may be 33 μm. The length in the second direction of the (2-1)-th sub-pixel may be 18.071 μm, and the length in the second direction of the (2-2)-th sub-pixel may be 14.929 μm, and the sum of these lengths may be 33 μm. The length in the first direction of the (2-1)-th sub-pixel may be 15.554 μm, and the length in the first direction of the (2-3)-th sub-pixel may be 17.446 μm, and the sum of these lengths may be 33 μm.

However, the areas of the sub-pixels included in one pixel of Comparative Example 1 may be different from each other. For example, the area of the (1-1)-th sub-pixel, the area of the (1-2)-th sub-pixel, and the area of the (1-3)-th sub-pixel may be different from each other. The area of the (2-1)-th sub-pixel, the area of the (2-2)-th sub-pixel, and the area of the (2-3)-th sub-pixel may be different from each other.

In this case, the areas of the sub-pixels that emit light of the same color, and that are included in different pixels, may be different from each other. For example, the area of the (1-1)-th sub-pixel and the area of the (2-2)-th sub-pixel may be substantially the same at 359.8 $\mu m^2$, and the area of the (1-2)-th sub-pixel and the area of the (2-1)-th sub-pixel may be substantially the same at 281.1 $\mu m^2$. However, the area of the (1-3)-th sub-pixel may be 388.9 $\mu m^2$, and the area of the (2-3)-th sub-pixel may be 420.5 $\mu m^2$. That is, the areas of the sub-pixels that may emit green light may be substantially the same, and the areas of the sub-pixels that may emit red light may be substantially the same, but the areas of the sub-pixels that may emit blue light may be different from each other.

In other words, the aperture ratios of the sub-pixels that emit light of the same color, and that are included in different pixels, may be different from each other. For example, the aperture ratio of the (1-1)-th sub-pixel and the aperture ratio of the (2-2)-th sub-pixel may be substantially the same at 15.1%, and the aperture ratio of the (1-2)-th sub-pixel and the aperture ratio of the (2-1)-th sub-pixel may be substantially the same at 11.8%. However, the aperture ratio of the (1-3)-th sub-pixel may be 16.3%, and the aperture ratio of the (2-3)-th sub-pixel may be 17.7%, and thus may be different from each other. That is, the aspect ratios of the sub-pixels that may emit green light may be substantially the same, and the aperture ratios of the sub-pixels that may emit red light may be substantially the same, but the aperture ratios of the sub-pixels that may emit blue light may be different from each other.

TABLE 4

| | Pixel | | | | | |
|---|---|---|---|---|---|---|
| | First pixel | | | Second pixel | | |
| Sub-pixels | (1-2)-th sub-pixel (R) | (1-1)-th sub-pixel (G) | (1-3)-th sub-pixel (B) | (2-1)-th sub-pixel (R) | (2-2)-th sub-pixel (G) | (2-3)-th sub-pixel (B |
| Length in first direction (μm) | 24.100 | 11.663 | 21.337 | 13.173 | 24.100 | 19.827 |
| Length in second direction (μm) | 11.663 | 24.100 | 21.337 | 21.337 | 11.663 | 24.100 |
| Area ($\mu m^2$) | 281.1 | 281.1 | 455.3 | 281.1 | 281.1 | 477.8 |
| Aperture ratio (%) | 11.8 | 11.8 | 19.1 | 11.8 | 11.8 | 20.1 |

Two sub-pixels among three sub-pixels included in one pixel according to Comparative Example 2 may have the same area and may have areas that are different from the area of the other one sub-pixel. For example, the area of the (1-1)-th sub-pixel and the area of the (1-2)-th sub-pixel may be substantially the same, and the area of the (1-3)-th sub-pixel may be greater than the area of the (1-1)-th sub-pixel. The area of the (2-1)-th sub-pixel may be substantially the same as the area of the (2-2)-th sub-pixel, and the area of the (2-3)-th sub-pixel may be greater than the area of the (2-1)-th sub-pixel.

However, a sub-pixel, which has a different area from the areas of other sub-pixels among three sub-pixels included in one pixel according to Comparative Example 2, may not be arranged at the L-shaped corner or at the rotated L-shaped corner. When all of the sub-pixel that may emit blue light of a first pixel and the sub-pixel that may emit blue light of a second pixel are arranged at the L-shaped corner or at the rotated L-shaped corner, sub-pixels that may emit blue light may be locally concentrated. Thus, each of the (2-1)-th sub-pixel, the (2-2)-th sub-pixel, and the (2-3)-th sub-pixel according to Comparative Example 2 may be arranged at positions corresponding to the positions of the (2-1)-th sub-pixel SPX21, the (2-2)-th sub-pixel SPX22, and the (2-3)-th sub-pixel SPX23 according to Embodiment 1, and the (1-3)-th sub-pixel may be arranged at the rotated L-shaped corner. The (1-2)-th sub-pixel that emits red light may be arranged adjacent to the (2-2)-th sub-pixel that emits green light. That is, each of the (1-3)-th sub-pixel, the (1-1)-th sub-pixel, and the (1-2)-th sub-pixel according to Comparative Example 2 may be arranged at the positions corresponding to the positions of the (1-1)-th sub-pixel SPX11, the (1-2)-th sub-pixel SPX12, and the (1-3)-th sub-pixel SPX13 according to Embodiment 1. In other words, the (1-3)-th sub-pixel and the (1-1)-th sub-pixel may be spaced apart from each other in the first direction (e.g., an +x direction or an −x direction), and the (1-2)-th sub-pixel may be spaced apart from the (1-3)-th sub-pixel in the second direction (e.g., a +y direction or a −y direction). The (2-1)-th sub-pixel and the (2-2)-th sub-pixel may be spaced apart from each other in the second direction (e.g., a +y direction or a −y direction), and the (2-3)-th sub-pixel may be spaced apart from the (2-1)-th sub-pixel in the first direction (e.g., an +x direction or an −x direction).

Referring to Table 4, the sum of lengths in the first direction (e.g., an +x direction or an −x direction) of sub-pixels arranged to be spaced apart from each other in the first direction (e.g., an +x direction or an −x direction) among a plurality of sub-pixels included in one pixel according to Comparative Example 2 and the sum of lengths in the second direction (e.g., a +y direction or a −y direction) of sub-pixels arranged to be spaced apart from each other in the second direction (e.g., a +y direction or a −y direction) among the plurality of sub-pixels may be substantially the same.

The length in the first direction of the (1-3)-th sub-pixel may be 21.337 μm, and the length in the first direction of the (1-1)-th sub-pixel may be 11.663 μm, and the sum of these lengths may be 33 μm. The length in the second direction of the (1-3)-th sub-pixel may be 21.337 μm, and the length in the second direction of the (1-2)-th sub-pixel may be 11.663 μm, and the sum of these lengths may be 33 μm. The length in the second direction of the (2-1)-th sub-pixel may be 21.337 μm, and the length in the second direction of the (2-2)-th sub-pixel may be 11.663 μm, and the sum of these lengths may be 33 μm. The length in the first direction of the (2-1)-th sub-pixel may be 13.173 μm, and the length in the first direction of the (2-3)-th sub-pixel may be 19.827 μm, and the sum of these lengths may be 33 μm.

In this case, the areas of the sub-pixels that emit light of the same color, and that are included in different pixels, may be different from each other. For example, the area of the (1-1)-th sub-pixel and the area of the (2-2)-th sub-pixel may be substantially the same at 281.1 $\mu m^2$, and the area of the (1-2)-th sub-pixel and the area of the (2-1)-th sub-pixel may be substantially the same at 281.1 $\mu m^2$. However, the area of the (1-3)-th sub-pixel may be 455.3 $\mu m^2$, and the area of the (2-3)-th sub-pixel may be 477.8 $\mu m^2$. That is, the areas of the sub-pixels that may emit green light may be substantially the same, and the areas of the sub-pixels that may emit red light may be substantially the same, but the areas of the sub-pixels that may emit blue light may be different from each other.

In other words, the aperture ratios of the sub-pixels that emit light of the same color, and that are included in different pixels, may be different from each other. For example, the aperture ratio of the (1-1)-th sub-pixel and the aperture ratio of the (2-2)-th sub-pixel may be substantially the same at 11.8%, and the aperture ratio of the (1-2)-th sub-pixel and the aperture ratio of the (2-1)-th sub-pixel may be substantially the same at 11.8%. However, the aperture ratio of the (1-3)-th sub-pixel may be 19.1%, and the aperture ratio of the (2-3)-th sub-pixel may be 20.1%, and thus may be different from each other. That is, the aspect ratios of the sub-pixels that may emit green light may be substantially the same, and the aperture ratios of the sub-pixels that may emit red light may be substantially the same, but the aperture ratios of the sub-pixels that may emit blue light may be different from each other.

Figure 12:
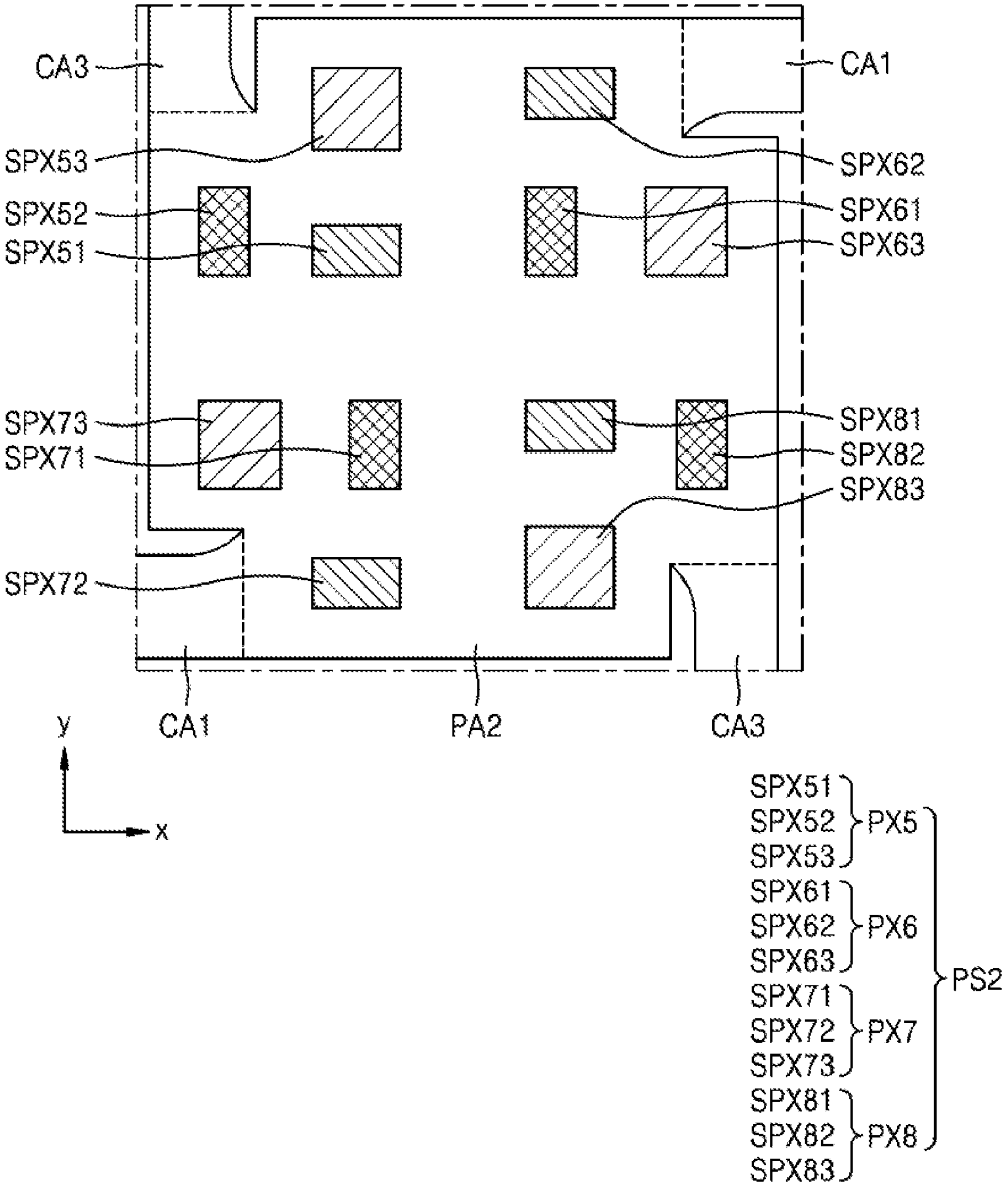
FIG. 12 is a conceptual view schematically illustrating the arrangement of pixels of a display apparatus according to one or more embodiments.

FIG. 12 is a conceptual view schematically illustrating the arrangement of pixels of the display apparatus 1 according to one or more embodiments. For example, FIG. 12 schematically illustrates the arrangement of pixels arranged in the second pixel area PA2 of the display apparatus 1 of FIG. 1A.

Because the arrangement of the pixels arranged in the second pixel area PA2 is similar to the arrangement of the pixels arranged in the first pixel area PA1 described above with reference to FIGS. 6 through 11, a difference between the arrangement of the pixels arranged in the second pixel area PA2 and the arrangement of the pixels arranged in the first pixel area PA1 described above with reference to FIGS. 6 through 11 will be described. That is, a second pixel set PS2 including a plurality of pixels may be arranged in the second pixel area PA2, and the second pixel set PS2 is similar to the first pixel set PS1 described above with reference to FIGS. 6 through 11, and thus a difference between the second pixel set PS2 and the first pixel set PS1 described above with reference to FIGS. 6 through 11 will be described.

As shown in FIG. 12, the second pixel set PS2 may include a fifth pixel PX5, a sixth pixel PX6, a seventh pixel PX7, and an eighth pixel PX8. The fifth pixel PX5 of the second pixel set PS2 may correspond to the first pixel PX1 of the first pixel set PS1, the sixth pixel PX6 of the second pixel set PS2 may correspond to the second pixel PX2 of the first pixel set PS1, the seventh pixel PX7 of the second pixel set PS2 may correspond to the third pixel PX3 of the first pixel set PS1, and the eighth pixel PX8 of the second pixel set PS2 may correspond to the fourth pixel PX4 of the first pixel set PS1. Because the contents described above with respect to the shapes and positions of the first pixel PX1, the second pixel PX2, the third pixel PX3, and the fourth pixel PX4 may be applied to the shapes and positions of the fifth pixel PX5, the sixth pixel PX6, the seventh pixel PX7, and the eighth pixel PX8, redundant contents thereof are omitted.

For example, the fifth pixel PX5 and the sixth pixel PX6 may be spaced apart from each other in the first direction (e.g., an +x direction or an −x direction). The seventh pixel PX7 may be spaced apart from the fifth pixel PX5 in the second direction (e.g., a +y direction or a −y direction), and the eighth pixel PX8 may be spaced apart from the sixth pixel PX6 in the second direction (e.g., a +y direction or a −y direction). That is, the seventh pixel PX7 and the eighth pixel PX8 may be spaced apart from each other in the first direction (e.g., an +x direction or an −x direction).

The fifth pixel PX5 my include a (5-1)-th sub-pixel SPX51, a (5-2)-th sub-pixel SPX52, and a (5-3)-th sub-pixel SPX53, and each of the (5-1)-th sub-pixel SPX51, the (5-2)-th sub-pixel SPX52, and the (5-3)-th sub-pixel SPX53 may correspond to the (1-1)-th sub-pixel SPX11, the (1-2)-th sub-pixel SPX12, and the (1-3)-th sub-pixel SPX13, respectively. Because the contents described above with respect to the shapes and positions of the (1-1)-th sub-pixel SPX11, the (1-2)-th sub-pixel SPX12, and the (1-3)-th sub-pixel SPX13 may be applied to the shapes and positions of the (5-1)-th sub-pixel SPX51, the (5-2)-th sub-pixel SPX52, and the (5-3)-th sub-pixel SPX53, redundant contents thereof are omitted.

However, light that may be emitted by the (5-1)-th sub-pixel SPX51 and the (5-2)-th sub-pixel SPX52 may be different from light that may be emitted by the (1-1)-th sub-pixel SPX11 and the (1-2)-th sub-pixel SPX12. For example, the (1-1)-th sub-pixel SPX11 may emit first color light, and the (1-2)-th sub-pixel SPX12 may emit second color light, whereas the (5-1)-th sub-pixel SPX51 may emit second color light, and the (5-2)-th sub-pixel SPX52 may emit first color light. The (1-3)-th sub-pixel SPX13 and the (5-3)-th sub-pixel SPX53 may emit third color light.

Likewise, the sixth pixel PX6 may include a (6-1)-th sub-pixel SPX61, a (6-2)-th sub-pixel SPX62, and a (6-3)-th sub-pixel SPX63, and each of the (6-1)-th sub-pixel SPX61, the (6-2)-th sub-pixel SPX62, and the (6-3)-th sub-pixel SPX63 may correspond to the (2-1)-th sub-pixel SPX21, the (2-2)-th sub-pixel SPX22, and the (2-3)-th sub-pixel SPX23, respectively. Because the contents described above with respect to the shapes and positions of the (2-1)-th sub-pixel SPX21, the (2-2)-th sub-pixel SPX22, and the (2-3)-th sub-pixel SPX23 may be applied to the shapes and positions of the (6-1)-th sub-pixel SPX61, the (6-2)-th sub-pixel SPX62, and the (6-3)-th sub-pixel SPX63, redundant contents thereof are omitted.

However, light that may be emitted by the (6-1)-th sub-pixel SPX61 and the (6-2)-th sub-pixel SPX62 may be different from light that may be emitted by the (2-1)-th sub-pixel SPX21 and the (2-2)-th sub-pixel SPX22. For example, the (2-1)-th sub-pixel SPX21 may emit second color light, and the (2-2)-th sub-pixel SPX22 may emit first color light, whereas the (6-1)-th sub-pixel SPX61 may emit first color light, and the (6-2)-th sub-pixel SPX62 may emit second color light. The (2-3)-th sub-pixel SPX23 and the (6-3)-th sub-pixel SPX63 may emit third color light.

Likewise, the seventh pixel PX7 may include a (7-1)-th sub-pixel SPX71, a (7-2)-th sub-pixel SPX72, and a (7-3)-th sub-pixel SPX73, and each of the (7-1)-th sub-pixel SPX71, the (7-2)-th sub-pixel SPX72, and the (7-3)-th sub-pixel SPX73 may correspond to the (3-1)-th sub-pixel SPX31, the (3-2)-th sub-pixel SPX32, and the (3-3)-th sub-pixel SPX33, respectively. Because the contents described above with respect to the shapes and positions of the (3-1)-th sub-pixel SPX31, the (3-2)-th sub-pixel SPX32, and the (3-3)-th sub-pixel SPX33 may be applied to the shapes and positions of the (7-1)-th sub-pixel SPX71, the (7-2)-th sub-pixel SPX72, and the (7-3)-th sub-pixel SPX73, redundant contents thereof are omitted.

However, light that may be emitted by the (7-1)-th sub-pixel SPX71 and the (7-2)-th sub-pixel SPX72 may be different from light that may be emitted by the (3-1)-th sub-pixel SPX31 and the (3-2)-th sub-pixel SPX32. For example, the (3-1)-th sub-pixel SPX31 may emit second color light, and the (3-2)-th sub-pixel SPX32 may emit first color light, whereas the (7-1)-th sub-pixel SPX71 may emit first color light, and the (7-2)-th sub-pixel SPX72 may emit second color light. The (3-3)-th sub-pixel SPX33 and the (7-3)-th sub-pixel SPX73 may emit third color light.

Likewise, the eighth pixel PX8 may include a (8-1)-th sub-pixel SPX81, a (8-2)-th sub-pixel SPX82, and a (8-3)-th sub-pixel SPX83, and each of the (8-1)-th sub-pixel SPX81, the (8-2)-th sub-pixel SPX82, and the (8-3)-th sub-pixel SPX83 may correspond to the (4-1)-th sub-pixel SPX41, the (4-2)-th sub-pixel SPX42, and the (4-3)-th sub-pixel SPX43, respectively. Because the contents described above with respect to the shapes and positions of the (4-1)-th sub-pixel SPX41, the (4-2)-th sub-pixel SPX42, and the (4-3)-th sub-pixel SPX43 may be applied to the shapes and positions of the (8-1)-th sub-pixel SPX81, the (8-2)-th sub-pixel SPX82, and the (8-3)-th sub-pixel SPX83, redundant contents thereof are omitted.

However, light that may be emitted by the (8-1)-th sub-pixel SPX81 and the (8-2)-th sub-pixel SPX82 may be different from light that may be emitted by the (4-1)-th sub-pixel SPX41 and the (4-2)-th sub-pixel SPX42. For example, the (4-1)-th sub-pixel SPX41 may emit first color light, and the (4-2)-th sub-pixel SPX42 may emit second color light, whereas the (8-1)-th sub-pixel SPX81 may emit second color light, and the (8-2)-th sub-pixel SPX82 may emit first color light. The (4-3)-th sub-pixel SPX43 and the (8-3)-th sub-pixel SPX83 may emit third color light.

However, even in this case, the areas of two sub-pixels among three sub-pixels included in one pixel of the second pixel set PS2 may be substantially the same, and may be different from the area of the other one sub-pixel. For example, the area of the sub-pixel that may emit first color light and the area of the sub-pixel that may emit second color light may be substantially the same, and the area of the sub-pixel that may emit third color light may be greater than the area of the sub-pixel that may emit first color light.

For example, the area of the (5-1)-th sub-pixel SPX51 may be substantially the same as the area of the (5-2)-th sub-pixel SPX52, and may be different from the area of the (5-3)-th sub-pixel SPX53. For example, the area of the (5-3)-th sub-pixel SPX53 may be greater than the area of the (5-1)-th sub-pixel SPX51. The area of the (6-1)-th sub-pixel SPX61 may be substantially the same as the area of the (6-2)-th sub-pixel SPX62, and may be different from the area of the (6-3)-th sub-pixel SPX63. For example, the area of the (6-3)-th sub-pixel SPX63 may be greater than the area of the (6-1)-th sub-pixel SPX61. The area of the (7-1)-th sub-pixel SPX71 may be substantially the same as the area of the (7-2)-th sub-pixel SPX72, and may be different from the area of the (7-3)-th sub-pixel SPX73. For example, the area of the (7-3)-th sub-pixel SPX73 may be greater than the area of the (7-1)-th sub-pixel SPX71. The area of the (8-1)-th sub-pixel SPX81 may be substantially the same as the area of the (8-2)-th sub-pixel SPX82, and may be different from the area of the (8-3)-th sub-pixel SPX83. For example, the area of the (8-3)-th sub-pixel SPX83 may be greater than the area of the (8-1)-th sub-pixel SPX81.

Two sub-pixels having the same area among three sub-pixels included in one pixel of the second pixel set PS2 may be spaced apart from each other in the first direction (e.g., an +x direction or an −x direction) or in the second direction (e.g., a +y direction or a −y direction). In this case, the other one sub-pixel having a different area may be arranged to be spaced apart from one of the two sub-pixels having the same area in a direction perpendicular to a direction in which two sub-pixels having the same area are arranged to be spaced apart from each other. Thus, sub-pixels arranged at both ends of the L-shape or the rotated L-shape may have different areas. In other words, a sub-pixel having a different area from the areas of other sub-pixels among three sub-pixels included in one pixel of the second pixel set PS2 may not be arranged at the L-shaped corner or at the rotated L-shaped corner. In other words, one sub-pixel among two sub-pixels having the same area may be arranged at the L-shaped corner or at the rotated L-shaped corner.

For example, the (5-1)-th sub-pixel SPX51, the (6-1)-th sub-pixel SPX61, the (7-1)-th sub-pixel SPX71, and the (8-1)-th sub-pixel SPX81 may be arranged at the respective L-shaped/rotated L-shaped corner. The (5-3)-th sub-pixel SPX53, the (6-3)-th sub-pixel SPX63, the (7-3)-th sub-pixel SPX73, and the (8-3)-th sub-pixel SPX83 may not be arranged at the L-shaped corner or at the rotated L-shaped corner. Thus, the aperture ratios of the sub-pixels that are included in the pixels included in the second pixel set PS2 and emit light of the same color may be substantially the same.

The sum of lengths in the first direction (e.g., an +x direction or an −x direction) of sub-pixels arranged to be spaced apart from each other in the first direction (e.g., an +x direction or an −x direction) among a plurality of sub-pixels included in one pixel of the second pixel set PS2 and the sum of lengths in the second direction (e.g., a +y direction or a −y direction) of sub-pixels arranged to be spaced apart from each other in the second direction (e.g., a +y direction or a −y direction) among the plurality of sub-pixels may be substantially the same.

As described above, the sub-pixels may be spaced apart from each other by a certain distance, and minimum separation distances between the sub-pixels may be substantially the same. For example, a distance between the (5-1)-th sub-pixel SPX51 and the (5-2)-th sub-pixel SPX52 may be substantially the same as a distance between the (5-1)-th sub-pixel SPX51 and the (5-3)-th sub-pixel SPX53, and a distance between the (6-1)-th sub-pixel SPX61 and the (6-2)-th sub-pixel SPX62 may be substantially the same as a distance between the (6-1)-th sub-pixel SPX61 and the (6-3)-th sub-pixel SPX63. Further, a distance between the (7-1)-th sub-pixel SPX71 and the (7-2)-th sub-pixel SPX72 may be substantially the same as a distance between the (7-1)-th sub-pixel SPX71 and the (7-3)-th sub-pixel SPX73, and a distance between the (8-1)-th sub-pixel SPX81 and the (8-2)-th sub-pixel SPX82 may be substantially the same as a distance between the (8-1)-th sub-pixel SPX81 and the (8-3)-th sub-pixel SPX83.

Thus, the sum of the length in the first direction (e.g., an +x direction or an −x direction) of the (5-1)-th sub-pixel SPX51 and the length in the first direction (e.g., an +x direction or an −x direction) of the (5-2)-th sub-pixel SPX52 may be substantially the same as the sum of the length in the second direction (e.g., a +y direction or a −y direction) of the (5-1)-th sub-pixel SPX51 and the length in the second direction (e.g., a +y direction or a −y direction) of the (5-3)-th sub-pixel SPX53. The sum of the length in the second direction (e.g., a +y direction or a −y direction) of the (6-1)-th sub-pixel SPX61 and the length in the second direction (e.g., a +y direction or a −y direction) of the (6-2)-th sub-pixel SPX62 may be substantially the same as the sum of the length in the first direction (e.g., an +x direction or an −x direction) of the (6-1)-th sub-pixel SPX61 and the length in the first direction (e.g., an +x direction or an −x direction) of the (6-3)-th sub-pixel SPX63. Further, the sum of the length in the second direction (e.g., a +y direction or a −y direction) of the (7-1)-th sub-pixel SPX71 and the length in the second direction (e.g., a +y direction or a −y direction) of the (7-2)-th sub-pixel SPX72 may be substantially the same as the sum of the length in the first direction (e.g., an +x direction or an −x direction) of the (7-1)-th sub-pixel SPX71 and the length in the first direction (e.g., an +x direction or an −x direction) of the (7-3)-th sub-pixel SPX73. The sum of the length in the first direction (e.g., an +x direction or an −x direction) of the (8-1)-th sub-pixel SPX81 and the length in the first direction (e.g., an +x direction or an −x direction) of the (8-2)-th sub-pixel SPX82 may be substantially the same as the sum of the length in the second direction (e.g., a +y direction or a −y direction) of the (8-1)-th sub-pixel SPX81 and the length in the second direction (e.g., a +y direction or a −y direction) of the (8-3)-th sub-pixel SPX83.

Figure 13:
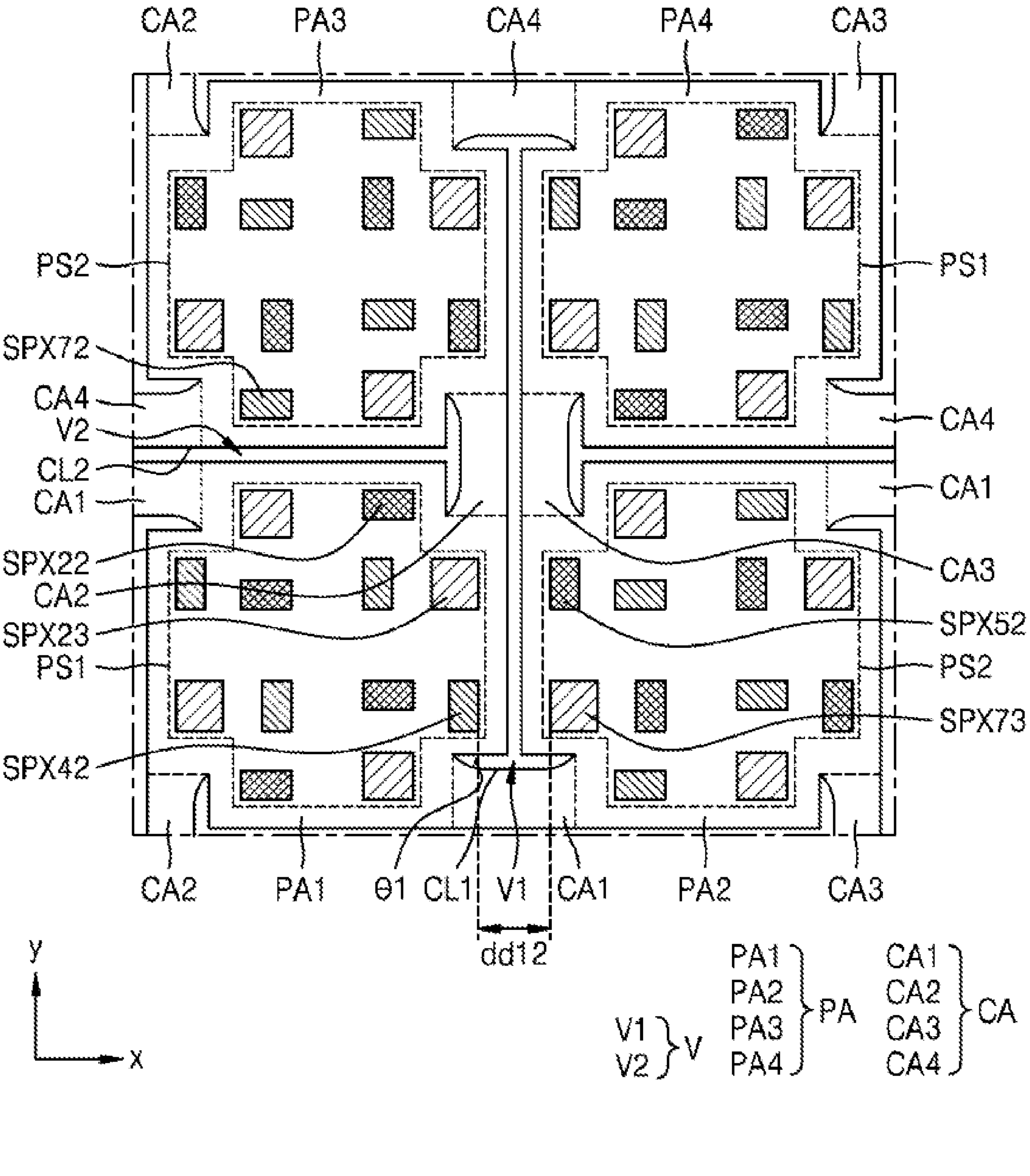
FIG. 13 is a conceptual view schematically illustrating the arrangement of pixels of a display apparatus according to one or more other embodiments.

As shown in FIG. 13, which is a conceptual view schematically illustrating the arrangement of pixels of the display apparatus 1 according to one or more embodiments, the first pixel set PS1 and the second pixel set PS2 may be arranged adjacent to each other. For example, a plurality of first pixel sets PS1 may be provided, and a plurality of second pixel sets PS2 may be provided. The first pixel sets PS1 and the second pixel sets PS2 may be alternately arranged in the first direction (e.g., an +x direction or an −x direction) and may be alternately arranged in the second direction (e.g., a +y direction or a −y direction).

For example, as shown in FIG. 13, when one first pixel set PS1 is arranged in the first pixel area PA1, one second pixel set PS2 may be arranged in the second pixel area PA2, and another second pixel set PS2 may be arranged in the third pixel area PA3. Another first pixel set PS1 may be arranged in the fourth pixel area PA4. As described above, because the first pixel area PA1, the second pixel area PA2, the third pixel area PA3, and the fourth pixel area PA4 may be repeatedly arranged in the first direction (e.g., an +x direction or an −x direction) and in the second direction (e.g., a +y direction or a −y direction), the first pixel sets PS1 and the second pixel sets PS2 arranged in the first pixel area PA1, the second pixel area PA2, the third pixel area PA3, and the fourth pixel area PA4 may be repeatedly arranged in the first direction (e.g., an +x direction or an −x direction) and in the second direction (e.g., a +y direction or a −y direction). Thus, the first pixel sets PS1 and the second pixel sets PS2 may be alternately arranged in the first direction (e.g., an +x direction or an −x direction), and may be alternately arranged in the second direction (e.g., a +y direction or a −y direction).

When only the first pixel sets PS1 are repeatedly arranged in the pixel area PA, or when only the second pixel sets PS2 are repeatedly arranged in the pixel area PA, sub-pixels included in different pixels and arranged in portions where the pixel sets are adjacent to each other, so that sub-pixels having short distances therebetween may emit light of the same color.

Figure 14:
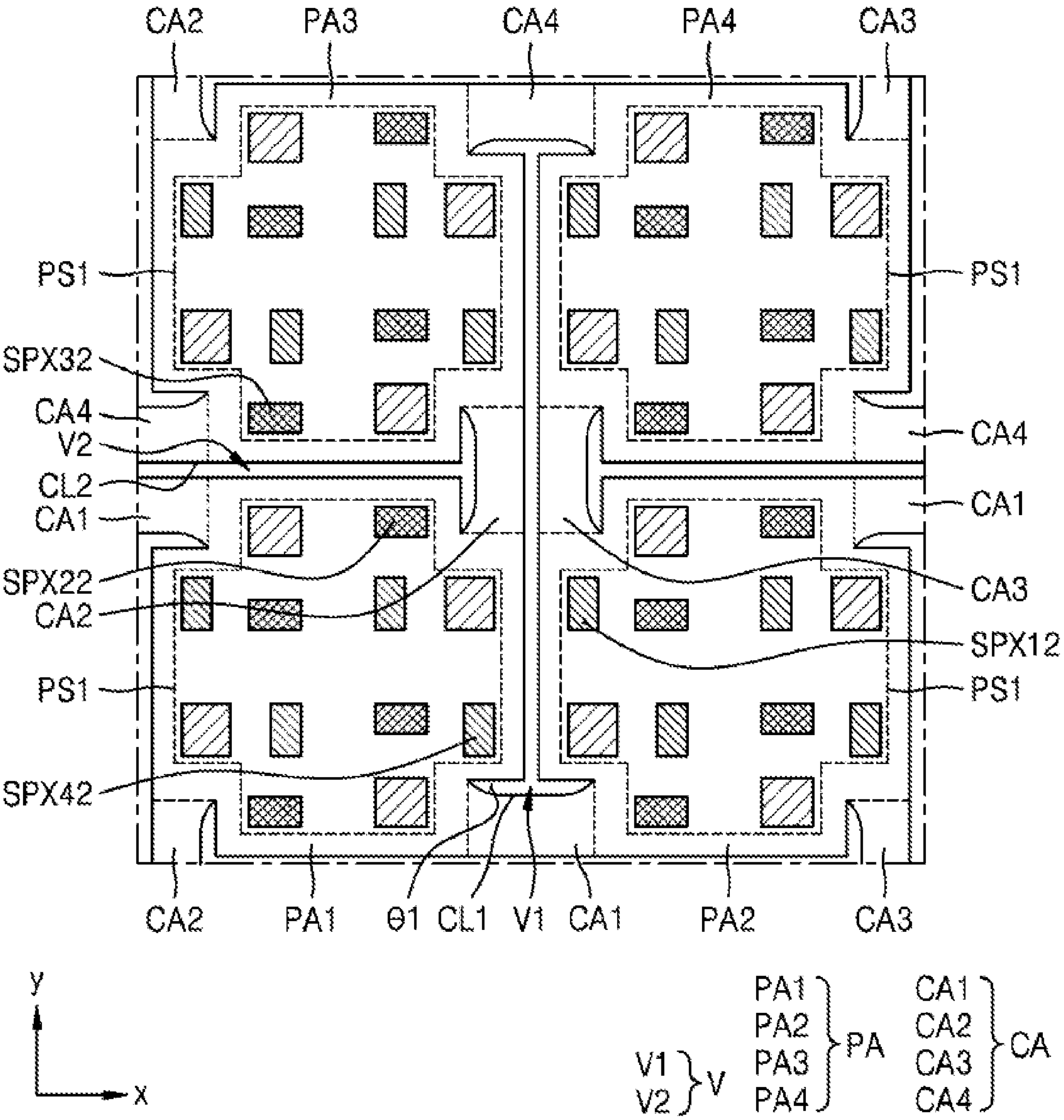
FIG. 14 is a conceptual view schematically illustrating the arrangement of pixels of a display apparatus according to a comparative example.

FIG. 14 is a conceptual view schematically illustrating the arrangement of pixels of a display apparatus 1 according to Comparative Example. As shown in FIG. 14, when only the first pixel sets PS1 are repeatedly arranged in the pixel area PA, a (4-2)-th sub-pixel SPX42 in the first pixel area PA1 and a (1-2)-th sub-pixel SPX12 in the second pixel area PA2 may emit second color light at a portion where the first pixel sets PS1 of the first pixel area PA1 and the first pixel sets PS1 of the second pixel area PA2 are adjacent to each other. Also, the (2-2)-th sub-pixel SPX22 in the first pixel area PA1 and the (3-2)-th sub-pixel SPX32 in the third pixel area PA3 may emit first color light at a portion where the first pixel sets PS1 in the first pixel area PA1 and the first pixel sets PS1 in the third pixel area PA3 are adjacent to each other.

Figure 15:
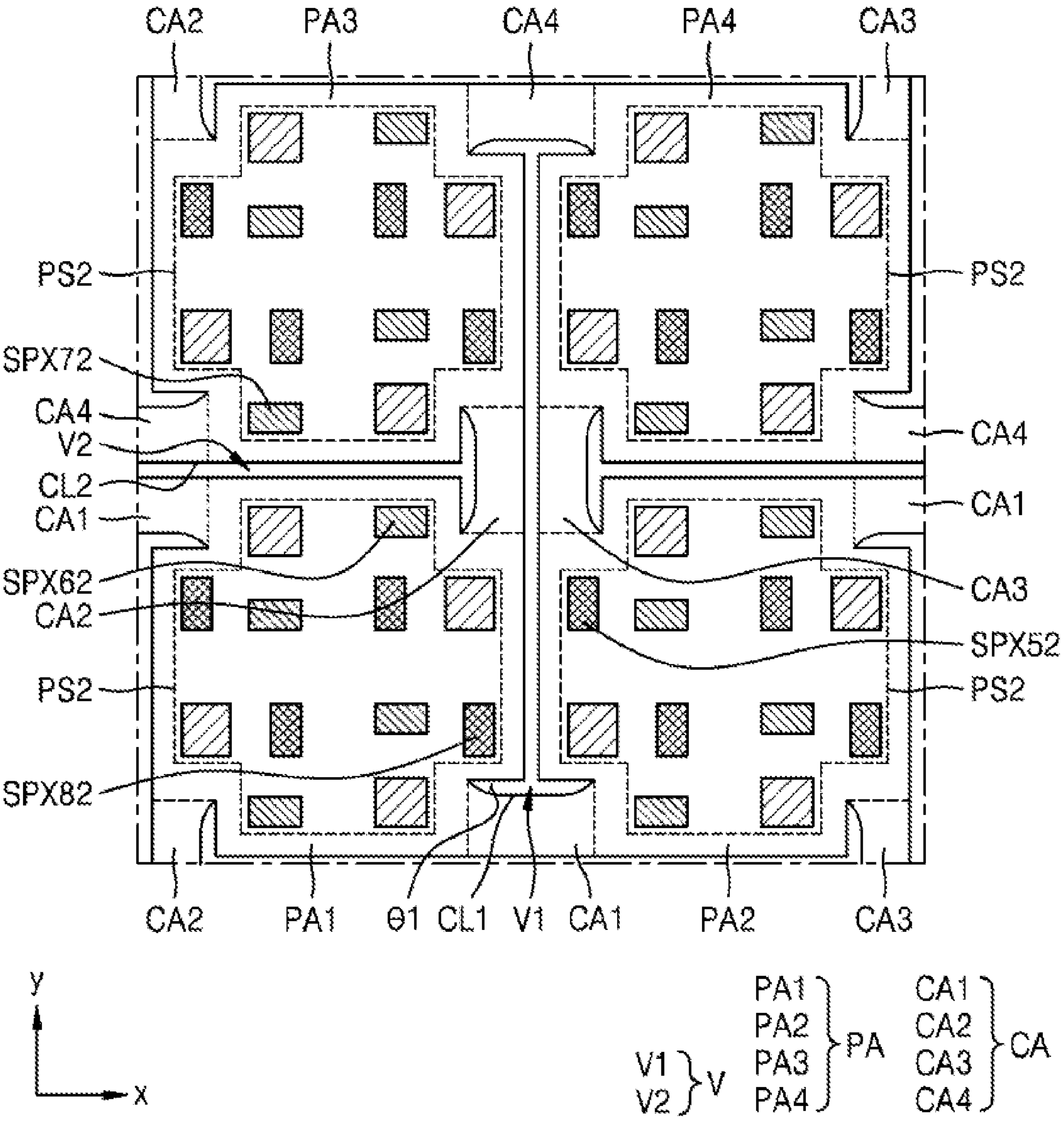
FIG. 15 is a conceptual view schematically illustrating the arrangement of pixels of a display apparatus according to another comparative example.

FIG. 15 is a conceptual view schematically illustrating the arrangement of pixels of the display apparatus 1 according to Comparative Example. As shown in FIG. 15, when only the second pixel sets PS2 are repeatedly arranged in the pixel area PA, a (8-2)-th sub-pixel SPX82 in the first pixel area PA1 and a (5-2)-th sub-pixel SPX52 in the second pixel area PA2 may emit first color light at a portion where the second pixel sets PS2 of the first pixel area PA1 and the second pixel sets PS2 of the second pixel area PA2 are adjacent to each other. The (6-2)-th sub-pixel SPX62 in the first pixel area PA1 and the (7-2)-th sub-pixel SPX72 in the third pixel area PA3 may emit second color light at a portion where the second pixel sets PS2 in the first pixel area PA1 and the second pixel sets PS2 in the third pixel area PA3 are adjacent to each other.

However, in the display apparatus 1, the first pixel sets PS1 and the second pixel sets PS2 may be alternately arranged in the pixel area PA in the first direction (e.g., an +x direction or an −x direction), and may be alternately arranged in the pixel area PA in the second direction (e.g., a +y direction or a −y direction). Thus, sub-pixels that are included in different pixels and arranged at a portion where the pixel sets are adjacent to each other, the sub-pixels having a short distance therebetween may emit light having different colors. For example, as shown in FIG. 13, the (4-2)-th sub-pixel SPX42 in the first pixel area PA1 may emit second color light, and the (5-2)-th sub-pixel SPX52 in the second pixel area PA2 may emit first color light at a portion where the first pixel sets PS1 of the first pixel area PA1 and the second pixel sets PS2 of the second pixel area PA2 are adjacent to each other. The (2-2)-th sub-pixel SPX22 in the first pixel area PA1 may emit first color light, and the (7-2)-th sub-pixel SPX72 in the third pixel area PA3 may emit second color light at a portion where the first pixel sets PS1 of the first pixel area PA1 and the second pixel sets PS2 of the third pixel area PA3 are adjacent to each other.

As shown in FIG. 13, a third distance dd12 between the first pixel set PS1 and the second pixel set PS2 may be substantially the same as the first distance d12. In the present specification, a distance between the first pixel set PS1 and the second pixel set PS2 may be a distance between sub-pixels closest to the second pixel set PS2 among the sub-pixels included in the first pixel set PS1 and sub-pixels closest to the first pixel set PS1 among the sub-pixels included in the second pixel set PS2.

The sub-pixels closest to the second pixel set PS2 of the second pixel area PA2 among the sub-pixels included in the first pixel set PS1 in the first pixel area PA1 may be a (2-3)-th sub-pixel SPX23 and a (4-2)-th sub-pixel SPX42. The sub-pixels closest to the first pixel set PS1 in the first pixel area PA1 among the sub-pixels included in the second pixel set PS2 in the second pixel area PA2 may be a (5-2)-th sub-pixel SPX52 and a (7-3)-th sub-pixel SPX73. Thus, the third distance dd12 between the first pixel set PS1 and the second pixel set PS2 may be a distance between the (2-3)-th sub-pixel SPX23 and the (5-2)-th sub-pixel SPX52 or a distance between the (4-2)-th sub-pixel SPX42 and the (7-3)-th sub-pixel SPX73. In the display apparatus 1, the third distance dd12 between the first pixel set PS1 and the second pixel set PS2 may be substantially the same as the first distance d12. Thus, a distance between pixels included in different pixel sets and adjacent to each other may be substantially the same as a distance between pixels included in the same pixel set and adjacent to each other. Thus, the pixels included in the display apparatus 1 may be uniformly arranged.

According to one or more embodiments having the above-described configuration, a display apparatus in which space utilization is relatively high, and in which aperture ratios of sub-pixels that may emit light of the same color are substantially the same, may be implemented. The scope of the present disclosure is not limited by these aspects.

It should be understood that embodiments described herein should be considered in a descriptive sense only and not for purposes of limitation. Descriptions of aspects within each embodiment should typically be considered as available for other similar aspects in other embodiments. While one or more embodiments have been described with reference to the figures, it will be understood by those of ordinary skill in the art that various changes in form and details may be made therein without departing from the spirit and scope as defined by the following claims, with functional equivalents thereof to be included therein.

What is claimed is:

1. A display apparatus comprising:

a substrate comprising pixel areas spaced apart from each other, connection areas connecting the pixel areas, and a separation area between the pixel areas; and a first pixel set arranged in the pixel areas and comprising a first pixel, a second pixel, a third pixel, and a fourth pixel, wherein a length of one of the pixel areas in a first direction is same as a length of the one of the pixel areas in a second direction crossing the first direction, wherein the first pixel and the second pixel are spaced apart from each other in the first direction, wherein the first pixel comprises a (1-1)-th sub-pixel configured to emit first color light, a (1-2)-th sub-pixel spaced apart from the (1-1)-th sub-pixel in the first direction and configured to emit second color light, and a (1-3)-th sub-pixel spaced apart from the (1-1)-th sub-pixel in the second direction and configured to emit third color light, wherein the second pixel comprises a (2-1)-th sub-pixel configured to emit the second color light, a (2-2)-th sub-pixel spaced apart from the (2-1)-th sub-pixel in the second direction and configured to emit the first color light, and a (2-3)-th sub-pixel spaced apart from the (2-1)-th sub-pixel in the first direction and configured to emit the third color light, wherein an area of the (1-1)-th sub-pixel is same as an area of the (1-2)-th sub-pixel, and is different from an area of the (1-3)-th sub-pixel, wherein an area of the (2-1)-th sub-pixel is same as an area of the (2-2)-th sub-pixel, and is different from an area of the (2-3)-th sub-pixel, and wherein a distance between the (1-1)-th sub-pixel and the (2-1)-th sub-pixel is less than a distance between the (1-3)-th sub-pixel and the (2-1)-th sub-pixel.

2. The display apparatus of claim 1, wherein a sum of a length in the first direction of the (1-1)-th sub-pixel and a length in the first direction of the (1-2)-th sub-pixel is substantially equal to a sum of a length in the second direction of the (1-1)-th sub-pixel and a length in the second direction of the (1-3)-th sub-pixel.

3. The display apparatus of claim 1, wherein a distance between the (1-1)-th sub-pixel and the (1-2)-th sub-pixel is substantially equal to a distance between the (1-1)-th sub-pixel and the (1-3)-th sub-pixel.

4. The display apparatus of claim 1, wherein a sum of a length in the second direction of the (2-1)-th sub-pixel and a length in the second direction of the (2-2)-th sub-pixel is substantially equal to a sum of a length in the first direction of the (2-1)-th sub-pixel and a length in the first direction of the (2-3)-th sub-pixel.

5. The display apparatus of claim 1, wherein a distance between the (2-1)-th sub-pixel and the (2-2)-th sub-pixel is substantially equal to a distance between the (2-1)-th sub-pixel and the (2-3)-th sub-pixel.

6. The display apparatus of claim 1, wherein an area of the (1-3)-th sub-pixel is greater than an area of the (1-1)-th sub-pixel, and wherein an area of the (2-3)-th sub-pixel is greater than an area of the (2-1)-th sub-pixel.

7. The display apparatus of claim 1, wherein the third pixel is spaced apart from the first pixel in the second direction, wherein the fourth pixel is spaced apart from the second pixel in the second direction, wherein the third pixel comprises a (3-1)-th sub-pixel configured to emit the second color light, a (3-2)-th sub-pixel spaced apart from the (3-1)-th sub-pixel in the second direction and configured to emit the first color light, and a (3-3)-th sub-pixel spaced apart from the (3-1)-th sub-pixel in the first direction and configured to emit the third color light, wherein the fourth pixel comprises a (4-1)-th sub-pixel configured to emit the first color light, a (4-2)-th sub-pixel spaced apart from the (4-1)-th sub-pixel in the first direction and configured to emit the second color light, and a (4-3)-th sub-pixel spaced apart from the (4-1)-th sub-pixel in the second direction and configured to emit the third color light, wherein an area of the (3-1)-th sub-pixel is substantially equal to an area of the (3-2)-th sub-pixel, and is different from an area of the (3-3)-th sub-pixel, and wherein an area of the (4-1)-th sub-pixel is substantially equal to an area of the (4-2)-th sub-pixel, and is different from an area of the (4-3)-th sub-pixel.

8. The display apparatus of claim 7, wherein a sum of a length in the second direction of the (3-1)-th sub-pixel and a length in the second direction of the (3-2)-th sub-pixel is substantially equal to a sum of a length in the first direction of the (3-1)-th sub-pixel and a length in the first direction of the (3-3)-th sub-pixel.

9. The display apparatus of claim 7, wherein a distance between the (3-1)-th sub-pixel and the (3-2)-th sub-pixel is substantially equal to a distance between the (3-1)-th sub-pixel and the (3-3)-th sub-pixel.

10. The display apparatus of claim 7, wherein a sum of a length in the first direction of the (4-1)-th sub-pixel and a length in the first direction of the (4-2)-th sub-pixel is substantially equal to a sum of a length in the second direction of the (4-1)-th sub-pixel and a length in the second direction of the (4-3)-th sub-pixel.

11. The display apparatus of claim 7, wherein a distance between the (4-1)-th sub-pixel and the (4-2)-th sub-pixel is substantially equal to a distance between the (4-1)-th sub-pixel and the (4-3)-th sub-pixel.

12. The display apparatus of claim 1, wherein virtual lines connecting one side of the (1-2)-th sub-pixel and one side of the (1-1)-th sub-pixel, and connecting another side of the (1-1)-th sub-pixel and one side of the (1-3)-th sub-pixel, have an L-shape rotated at 90 degrees counterclockwise, and wherein virtual lines connecting one side of the (2-2)-th sub-pixel and one side of the (2-1)-th sub-pixel, and connecting another side of the (2-1)-th sub-pixel and one side of the (2-3)-th sub-pixel, have an L-shape.

13. The display apparatus of claim 1, further comprising a second pixel set arranged in the pixel areas, and comprising a fifth pixel, a sixth pixel, a seventh pixel, and an eighth pixel, wherein the fifth pixel and the sixth pixel are spaced apart from each other in the first direction, wherein the seventh pixel is spaced apart from the fifth pixel in the second direction, and wherein the eighth pixel is spaced apart from the sixth pixel in the second direction.

14. The display apparatus of claim 1, wherein the first color light is green light, the second color light is red light, and the third color light is blue light.

15. A display apparatus comprising:

a substrate comprising pixel areas spaced apart from each other, connection areas connecting the pixel areas, and a separation area between the pixel areas;

a first pixel set arranged in the pixel areas and comprising a first pixel, a second pixel, a third pixel, and a fourth pixel; and a second pixel set arranged in the pixel areas, and comprising a fifth pixel, a sixth pixel, a seventh pixel, and an eighth pixel, wherein a length of one of the pixel areas in a first direction is same as a length of the one of the pixel areas in a second direction crossing the first direction, wherein the first pixel and the second pixel are spaced apart from each other in the first direction, wherein the first pixel comprises a (1-1)-th sub-pixel configured to emit first color light, a (1-2)-th sub-pixel spaced apart from the (1-1)-th sub-pixel in the first direction and configured to emit second color light, and a (1-3)-th sub-pixel spaced apart from the (1-1)-th sub-pixel in the second direction and configured to emit third color light, wherein the second pixel comprises a (2-1)-th sub-pixel configured to emit the second color light, a (2-2)-th sub-pixel spaced apart from the (2-1)-th sub-pixel in the second direction and configured to emit the first color light, and a (2-3)-th sub-pixel spaced apart from the (2-1)-th sub-pixel in the first direction and configured to emit the third color light, wherein an area of the (1-1)-th sub-pixel is same as an area of the (1-2)-th sub-pixel, and is different from an area of the (1-3)-th sub-pixel, wherein an area of the (2-1)-th sub-pixel is same as an area of the (2-2)-th sub-pixel, and is different from an area of the (2-3)-th sub-pixel, wherein the fifth pixel and the sixth pixel are spaced apart from each other in the first direction, wherein the seventh pixel is spaced apart from the fifth pixel in the second direction, and the eighth pixel is spaced apart from the sixth pixel in the second direction, wherein the fifth pixel comprises a (5-1)-th sub-pixel configured to emit the second color light, a (5-2)-th sub-pixel spaced apart from the (5-1)-th sub-pixel in the first direction and configured to emit the first color light, and a (5-3)-th sub-pixel spaced apart from the (5-1)-th sub-pixel in the second direction and configured to emit the third color light, wherein the sixth pixel comprises a (6-1)-th sub-pixel configured to emit the first color light, a (6-2)-th sub-pixel spaced apart from the (6-1)-th sub-pixel in the second direction and configured to emit the second color light, and a (6-3)-th sub-pixel spaced apart from the (6-1)-th sub-pixel in the first direction and configured to emit the third color light, wherein the seventh pixel comprises a (7-1)-th sub-pixel configured to emit the first color light, a (7-2)-th sub-pixel spaced apart from the (7-1)-th sub-pixel in the second direction and configured to emit the second color light, and a (7-3)-th sub-pixel spaced apart from the (7-1)-th sub-pixel in the first direction and configured to emit the third color light, and wherein the eighth pixel comprises a (8-1)-th sub-pixel configured to emit the second color light, a (8-2)-th sub-pixel spaced apart from the (8-1)-th sub-pixel in the first direction and configured to emit the first color light, and a (8-3)-th sub-pixel spaced apart from the (8-1)-th sub-pixel in the second direction and configured to emit the third color light.

16. The display apparatus of claim 15, wherein an area of the (5-1)-th sub-pixel is substantially equal to an area of the (5-2)-th sub-pixel, and is different from an area of the (5-3)-th sub-pixel, wherein an area of the (6-1)-th sub-pixel is substantially equal to an area of the (6-2)-th sub-pixel, and is different from an area of the (6-3)-th sub-pixel, wherein an area of the (7-1)-th sub-pixel is substantially equal to an area of the (7-2)-th sub-pixel, and is different from an area of the (7-3)-th sub-pixel, and wherein an area of the (8-1)-th sub-pixel is substantially equal to an area of the (8-2)-th sub-pixel, and is different from an area of the (8-3)-th sub-pixel.

17. The display apparatus of claim 15, wherein a sum of a length in the first direction of the (5-1)-th sub-pixel and a length in the first direction of the (5-2)-th sub-pixel is substantially equal to a sum of a length in the second direction of the (5-1)-th sub-pixel and a length in the second direction of the (5-3)-th sub-pixel, wherein a sum of a length in the second direction of the (6-1)-th sub-pixel and a length in the second direction of the (6-2)-th sub-pixel is substantially equal to a sum of a length in the first direction of the (6-1)-th sub-pixel and a length in the first direction of the (6-3)-th sub-pixel, wherein a sum of a length in the second direction of the (7-1)-th sub-pixel and a length in the second direction of the (7-2)-th sub-pixel is substantially equal to a sum of a length in the first direction of the (7-1)-th sub-pixel and a length in the first direction of the (7-3)-th sub-pixel, and wherein a sum of a length in the first direction of the (8-1)-th sub-pixel and a length in the first direction of the (8-2)-th sub-pixel is substantially equal to a sum of a length in the second direction of the (8-1)-th sub-pixel and a length in the second direction of the (8-3)-th sub-pixel.

18. The display apparatus of claim 15, wherein a distance between the (5-1)-th sub-pixel and the (5-2)-th sub-pixel is substantially equal to a distance between the (5-1)-th sub-pixel and the (5-3)-th sub-pixel, wherein a distance between the (6-1)-th sub-pixel and the (6-2)-th sub-pixel is substantially equal to a distance between the (6-1)-th sub-pixel and the (6-3)-th sub-pixel, wherein a distance between the (7-1)-th sub-pixel and the (7-2)-th sub-pixel is substantially equal to a distance between the (7-1)-th sub-pixel and the (7-3)-th sub-pixel, and wherein a distance between the (8-1)-th sub-pixel and the (8-2)-th sub-pixel is substantially equal to a distance between the (8-1)-th sub-pixel and the (8-3)-th sub-pixel.

19. The display apparatus of claim 15, further comprising multiple first pixel sets and multiple second pixel sets alternately arranged in the first direction.

20. The display apparatus of claim 15, further comprising multiple first pixel sets and multiple second pixel sets alternately arranged in the second direction.

21. The display apparatus of claim 15, wherein a distance between the first pixel set and the second pixel set is substantially equal to a distance between the first pixel and the second pixel.

* * * * *